(12) United States Patent
Jung et al.

(10) Patent No.: US 12,713,588 B2
(45) Date of Patent: Aug. 18, 2026

(54) SEMICONDUCTOR DEVICE AND METHOD OF FABRICATING THE SAME

(71) Applicant: Samsung Electronics Co., Ltd., Suwon-si (KR)

(72) Inventors: Myunghun Jung, Suwon-si (KR); Donghwa Shin, Suwon-si (KR); Sung-Jin Yeo, Suwon-si (KR); Ho-In Ryu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 321 days.

(21) Appl. No.: 18/353,137

(22) Filed: Jul. 17, 2023

(65) Prior Publication Data

US 2024/0179892 A1 May 30, 2024

(30) Foreign Application Priority Data

Nov. 29, 2022 (KR) ........................ 10-2022-0163399

(51) Int. Cl.
*H10B 12/00* (2023.01)

(52) U.S. Cl.
CPC ........... *H10B 12/482* (2023.02); *H10B 12/02* (2023.02)

(58) Field of Classification Search
CPC ...... H10B 12/02; H10B 12/09; H10B 12/315; H10B 12/482; H10B 12/50
See application file for complete search history.

(56) References Cited

U.S. PATENT DOCUMENTS

| | | | | |
|---|---|---|---|---|
| 6,639,822 | B2 | 10/2003 | Fujisawa et al. | |
| 8,675,430 | B2 | 3/2014 | Kobayashi | |
| 9,396,776 | B2 | 7/2016 | Yang | |
| 9,666,254 | B1 | 5/2017 | Woo | |
| 9,946,827 | B2 | 4/2018 | Wang et al. | |
| 9,985,035 | B1 | 5/2018 | Feng et al. | |
| 2002/0000595 | A1 | 1/2002 | Ohyu et al. | |
| 2004/0188745 | A1 | 9/2004 | Kim et al. | |
| 2014/0291804 | A1 | 10/2014 | Kim et al. | |
| 2017/0345494 | A1* | 11/2017 | Lee | G11C 13/0026 |
| 2021/0327891 | A1* | 10/2021 | Koshizawa | H10D 64/037 |
| 2022/0059555 | A1* | 2/2022 | Kang | G11C 8/14 |
| 2023/0189510 | A1* | 6/2023 | Chang | H10B 12/482 257/296 |

FOREIGN PATENT DOCUMENTS

| | | | |
|---|---|---|---|
| KR | 10-1994-0007876 | A | 4/1994 |
| KR | 10-2014-0119525 | A | 10/2014 |
| KR | 10-2016-0069705 | A | 6/2016 |
| KR | 10-1799644 | B1 | 11/2017 |

* cited by examiner

*Primary Examiner* — Edward Chin
(74) *Attorney, Agent, or Firm* — Wolf, Greenfield & Sacks, P.C.

(57) ABSTRACT

A semiconductor device may include a substrate including a core region, a cell block region, and a peripheral region, which are sequentially arranged in a first direction, and a bit line structure on the cell block region. The bit line structure may include a first bit line and a second bit line, which extend in the first direction and are adjacent to each other in a second direction crossing the first direction, a bit line connector, which electrically connects the first bit line to the second bit line and is adjacent to the peripheral region, and a bit line pad, which is electrically connected to the first bit line and is adjacent to the core region.

20 Claims, 55 Drawing Sheets

CBS
R
R
W1
W2
COR
SWD
SA
CB(CBe)
CB(CBc)
CB(CBc)
CB(CBc)
CB(CBc)
CB(CBe)
D1
D2
D3
D4

FIG. 5D

SS IL 210
STR
D'
PER, SL
360 366 364 362
CBe
DSP 440 LP 410 BC FN RS2 GC GE GI WL ACT 120 100
D
D3 D2 D1

X2
P1
W3
W4
W7
W8
STR
BTR (BTRb)
BTR (BTRa)
360 (360b)
360 (360a)
SS
CN
BL(BL2)
BL(BL1)
PER, SL
CBe
D1
D2
D3
D4

P1
W3
W4
W7
W8
STR
BTR (BTRb)
BTR (BTRa)
360 (360b)
360 (360a)
SS
CN
BL(BL2)
BL(BL1)
PER, SL
CBe
D1
D2
D3
D4

STR
SS
CN
BL(BL2)
BL(BL1)
360 (360a)
360 (360b)
L3
L4
BTR (BTRa)
BTR (BTRb)
S1
S2
PER, SL
CBe
D1
D2
D3
D4

350p
SS
IL
210
STR
360
362
364
366
D'
PER, SL
CBe
D
DSP
440
LP
410
BC
FN
BC
WL
GC
GE
GI
ACT
120
100
D1
D3
D2

IL
STR
D'
PER,
SL
CBe
D
353L
352L
351L
BLL
320L
310Lb
210Lb
WL
GC
GE
GI
ACT
120
100
D1
D3
D2

IL
E'
PER, SL
CBe
E
DCL
DCL
353L
352L
351L
BLL
320L
210Lb
310Lb
GC
GE
GI
WL
ACT
120
100
D1
D2
D3

FIG. 20D

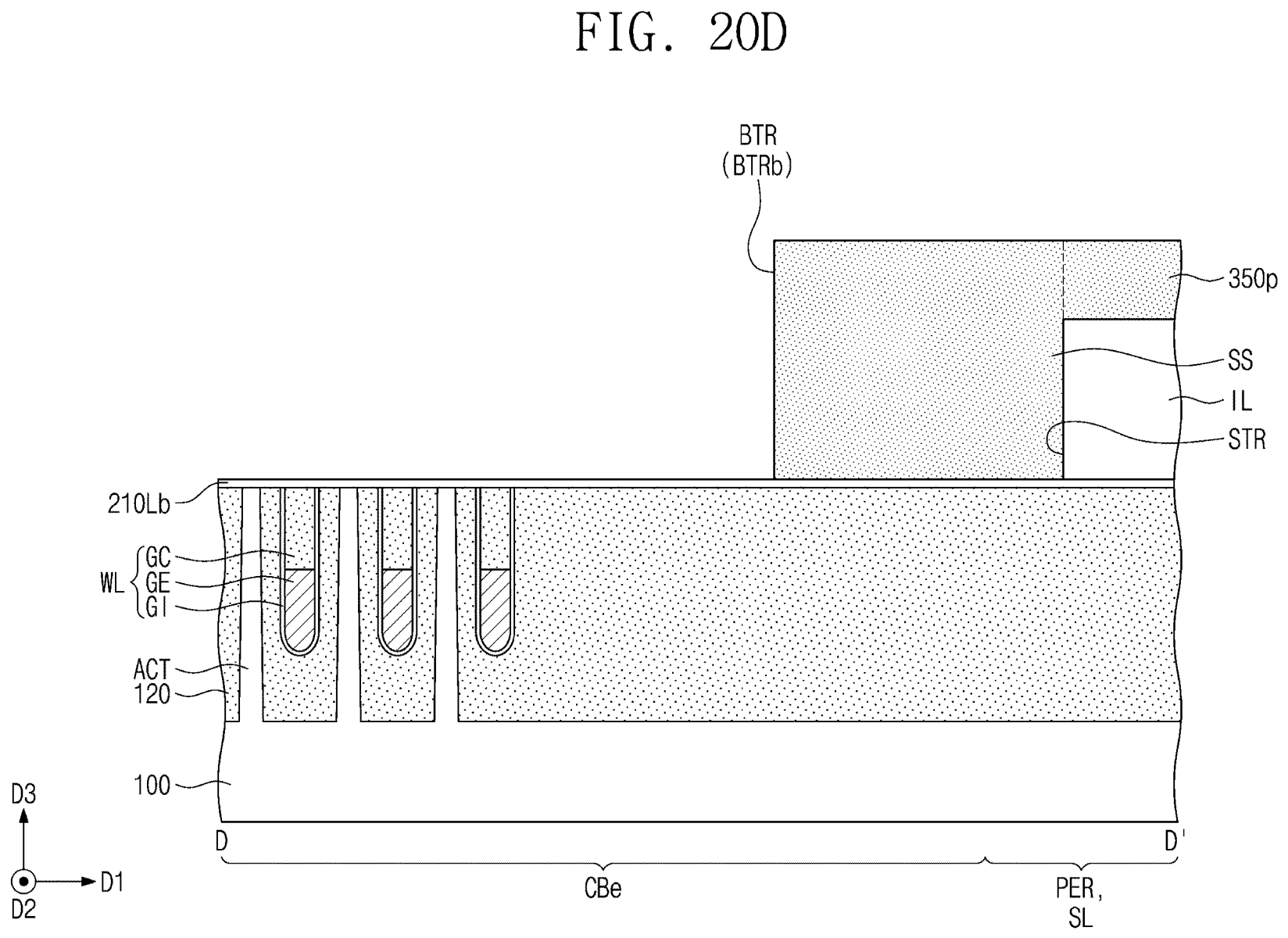

350p
SS
IL
STR
D'
PER, SL
BTR (BTRb)
CBe
D
210Lb
WL {GC GE GI}
ACT
120
100
D1
D3
D2

SEMICONDUCTOR DEVICE AND METHOD OF FABRICATING THE SAME

CROSS-REFERENCE TO RELATED APPLICATION(S)

This U.S. non-provisional patent application claims priority under 35 U.S.C. § 119 to Korean Patent Application No. 10-2022-0163399, filed on Nov. 29, 2022, in the Korean Intellectual Property Office, the disclosure of which is hereby incorporated by reference in its entirety.

BACKGROUND OF THE INVENTION

The present disclosure generally relates to the field of electronics, and in particular, a semiconductor device and a method of fabricating the same.

Due to their small size, multifunctionality, and/or low price, semiconductor devices are being esteemed as important elements in the electronics industry. The semiconductor devices may be classified into a memory device for storing data, a logic device for processing data, and a hybrid device including both of memory and logic elements.

Due to the recent increasing demand for electronic devices with a fast speed and/or low power consumption, semiconductor devices with a fast operating speed and/or a low operating voltage are desirable. Accordingly, the integration density of semiconductor devices is being increased, and various research has been conducted.

SUMMARY

Example embodiments of the inventive concept provide a semiconductor device with an increased integration density and a method of fabricating the same.

Example embodiment of the inventive concept provide a semiconductor device, which is configured to reduce a difficulty in a routing process, and a method of fabricating the same.

According to some embodiments of the inventive concept, a semiconductor device may include a substrate including a core region, a cell block region, and a peripheral region, which are sequentially arranged in a first direction, and a bit line structure on the cell block region. The bit line structure may include a first bit line and a second bit line, which extend in the first direction and are adjacent to each other in a second direction crossing the first direction, a bit line connector, which connects (e.g., electrically connects) the first bit line to the second bit line and is adjacent to the peripheral region, and a bit line pad, which is connected to (e.g., electrically connected to) the first bit line and is adjacent to the core region.

According to some embodiments of the inventive concept, a semiconductor device may include a substrate including a center cell block region and an edge cell block region, which are sequentially arranged in a first direction, a first bit line and a second bit line, which extend in the first direction on the edge cell block region and are adjacent to each other in a second direction crossing the first direction, and a bit line connector, which is on the edge cell block region to connect (e.g., electrically connect) the first bit line to the second bit line. A width of the edge cell block region in the first direction may be smaller than a width of the center cell block region in the first direction.

According to some embodiments of the inventive concept, a semiconductor device may include a substrate including a core region, a cell block region, and a peripheral region, which are sequentially arranged in a first direction, a bit line structure on the cell block region, the bit line structure including a first bit line and a second bit line, which extend in the first direction and are adjacent to each other in a second direction crossing the first direction, a bit line connector connecting (e.g., electrically connecting) the first and second bit lines to each other, and a bit line pad connected to (e.g., electrically connected to) the first bit line, a slit separation pattern adjacent to the bit line connector in the second direction, and a spacer structure extending respectively in the first direction and extending between the first and second bit lines. The spacer structure may be spaced apart from the slit separation pattern.

According to some embodiments of the inventive concept, a method of fabricating a semiconductor device may include forming a bit line layer on a substrate, forming pad trenches and slit trenches in the bit line layer, the pad trenches being spaced apart from each other in a second direction, the slit trenches being spaced apart from the pad trenches in a first direction crossing the second direction and being spaced apart from each other in the second direction, forming a spacer layer in the pad trenches and the slit trenches a spacer layer (e.g., filling the pad trenches and the slit trenches with the spacer layer), and patterning the bit line layer to form bit line structures. The bit line structures may be formed to have a first pitch in the second direction. The pad trenches (e.g., a center of the pad trenches) may be offset from the slit trenches (e.g., a center of the slit trenches) by a first length in the second direction. The first length may be smaller than half of the first pitch.

BRIEF DESCRIPTION OF THE DRAWINGS

FIGS. 5A to 5E are sectional views, which are respectively taken alone lines A-A', B-B', C-C', D-D', and E-E' of FIG. 4A to illustrate a semiconductor device according to some embodiments of the inventive concept.

FIGS. 7A to 7E are enlarged plan views, each of which illustrates a region 'X2' of FIG. 4A.

FIGS. 8A to 8C sectional views, which are respectively taken alone the lines B-B', C-C', and D-D' of FIG. 4A to illustrate a semiconductor device according to some embodiments of the inventive concept.

FIGS. 9, 10A, 10B, 10C, 10D, 11, 12A, 12B, 12C, 12D, 13, 14A, 14B, 14C, 15, 16A, 16B, 16C, 16D, 16E, 17, 18A, 18B, 18C, 18D, 18E, 19, 20A, 20B, 20C, 20D, and 20E are diagrams illustrating a method of fabricating a semiconductor device, according to some embodiments of the inventive concept.

DETAILED DESCRIPTION

Example embodiments of the inventive concept will now be described more fully with reference to the accompanying drawings, in which example embodiments are shown.

Figure 1:
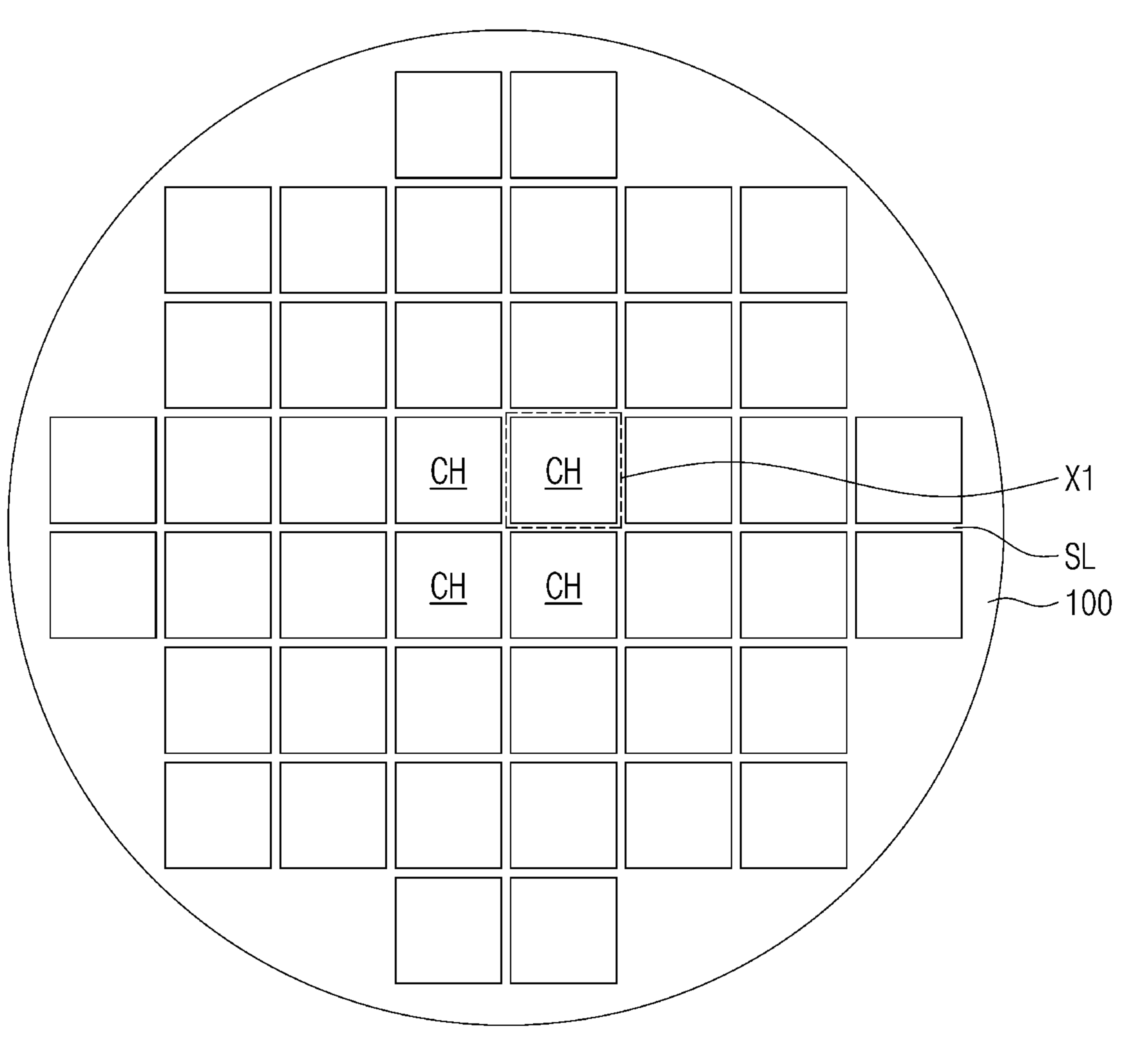
FIG. 1 is a diagram illustrating a substrate, on which semiconductor devices according to some embodiments of the inventive concept are integrated.
Figure 2A:
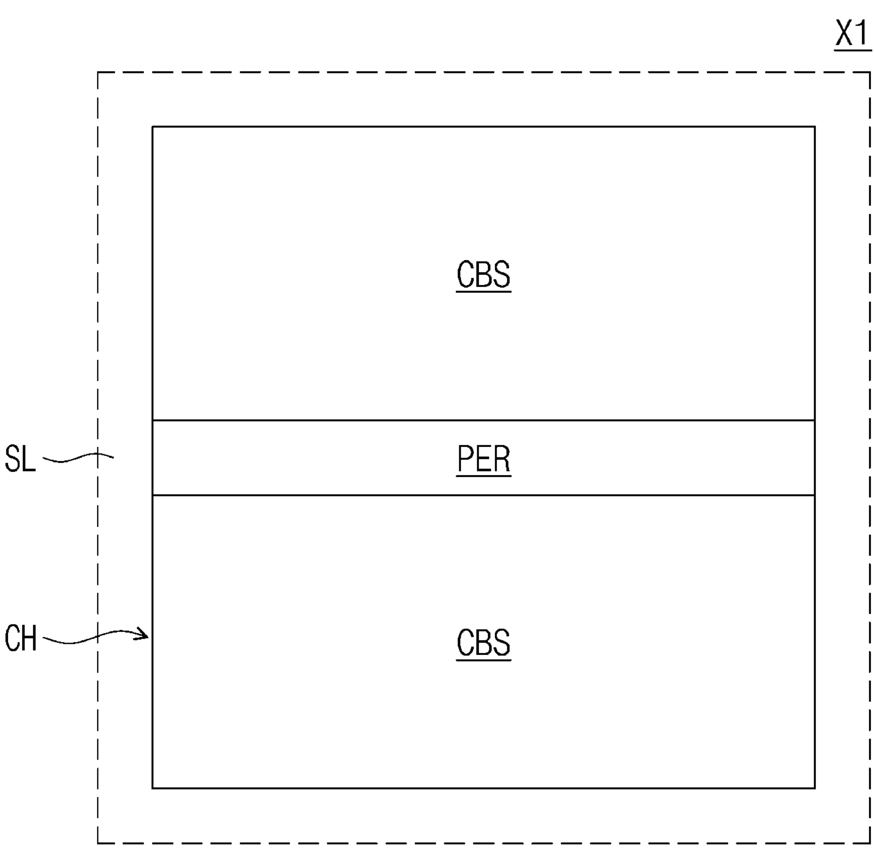
FIGS. 2A and 2B are enlarged plan views, each of which illustrates a region 'X1' of FIG. 1 according to some embodiments of the inventive concept.
Figure 2B:
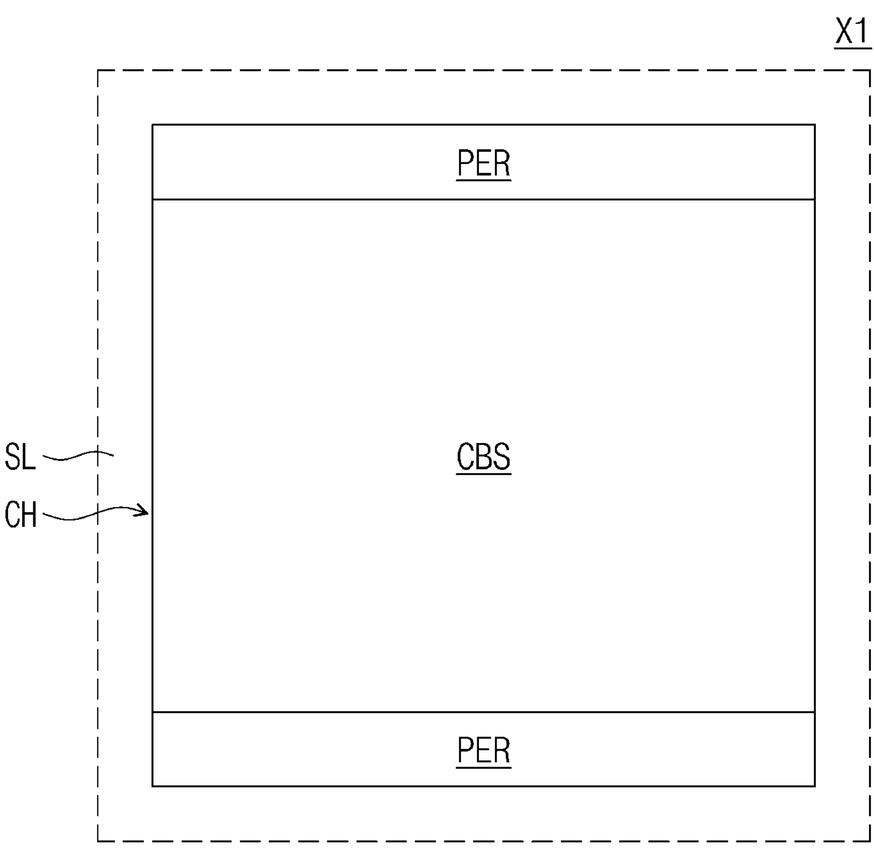
Figure 2B:
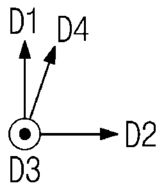
Figure 3:
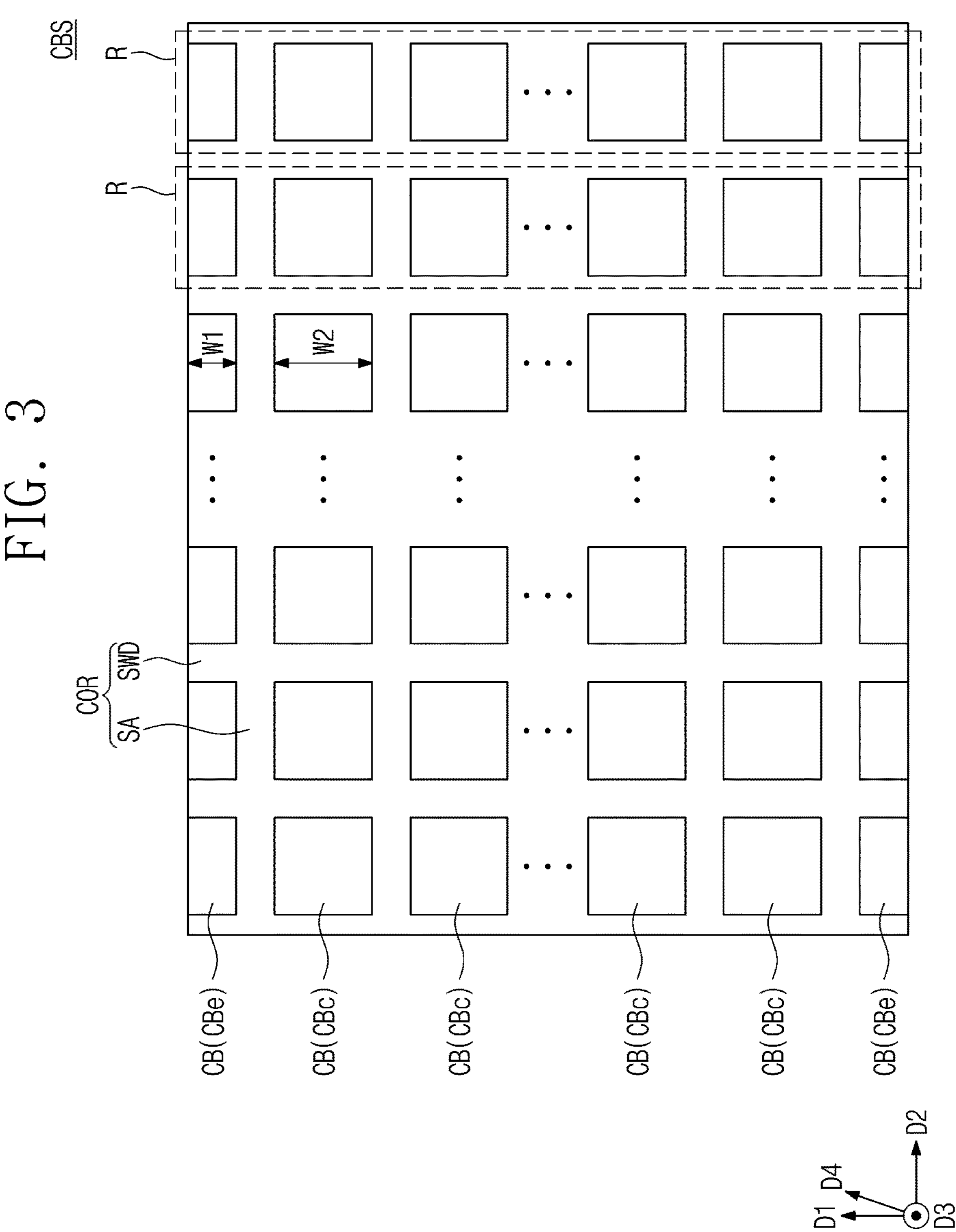
FIG. 3 is an enlarged plan view illustrating a cell block structure region of FIGS. 2A and 2B.

FIG. 1 is a diagram illustrating a substrate, on which semiconductor devices according to some embodiments of the inventive concept are integrated. FIGS. 2A and 2B are enlarged plan views, each of which illustrates a region 'X1' of FIG. 1 according to some embodiments of the inventive concept. FIG. 3 is an enlarged plan view illustrating a cell block structure region of FIGS. 2A and 2B.

Referring to FIGS. 1, 2A, 2B, and 3, a substrate 100 may include chip regions CH, in which semiconductor integrated circuits are placed, and a scribe lane region SL between the chip regions CH. The substrate 100 may be one of semiconductor substrates (e.g., a silicon wafer, a germanium wafer, or a silicon-germanium wafer). In the present specification, each of the expressions of "A or B", "at least one of A and B", "at least one of A or B", "A, B, or C", "at least one of A, B, and C", and "at least one of A, B, or C" may be used to represent one of the elements enumerated in the expression or any possible combination of the enumerated elements.

The chip regions CH may be two-dimensionally arranged in a first direction D1 and a second direction D2, which are non-parallel (e.g., orthogonal) to each other. Each of the first and second directions D1 and D2 may be parallel to a bottom surface of the substrate 100. Each of the chip regions CH may be surrounded by the scribe lane region SL.

The scribe lane region SL may include a plurality of first scribe lane regions which are extending in the first direction D1, and a plurality of second scribe lane regions which are extending in the second direction D2 to cross the first scribe lane regions. The scribe lane region SL may include a cutting lane region, which will be cut by a sawing or dicing machine, and edge lane regions, which are placed between the cutting lane region and the chip regions CH. The edge lane regions may be placed to enclose the chip regions CH, respectively. As an example, when viewed in a plan view, the cutting lane region may be interposed between adjacent ones of the chip regions CH, and the edge lane regions may be interposed between the chip regions CH and the cutting lane region. As used herein, "adjacent ones of elements A" or "elements Bs are adjacent to each other" (or similar language) may mean that those adjacent ones and the elements B are directly adjacent so that no other like element is located between those adjacent ones and between the elements B. Further, as used herein, "an element A extends in a direction X" (or similar language) may mean that the element A extends longitudinally in the direction X.

Semiconductor devices may be provided on the chip regions CH of the substrate 100. As an example, the semiconductor device provided on the chip region CH may be a dynamic random access memory (DRAM) device, a static random access memory (SRAM) device, a NAND FLASH memory device, a resistive random access memory (RRAM) device, or the like. As another example, a processor, such as a micro-electromechanical system (MEMS) device, an optoelectronic device, a central processing unit (CPU), or a digital signal processor (DSP), may be provided on the chip region CH. As other example, standard cells including semiconductor devices, such as an OR gate or an AND gate, may be provided on the chip regions CH of the substrate 100.

Each of the chip regions CH may include a peripheral circuit region PER and a cell block group region CBS. Peripheral circuits may be provided on the peripheral circuit region PER. The peripheral circuits may be configured to perform operations of generating commands, address information, and/or power signals, and/or of inputting or outputting data (DQ).

Each of the chip regions CH may include one or more peripheral circuit regions PER and one or more cell block group regions CBS. As an example, the chip region CH may include a pair of cell block group regions CBS, which are adjacent to each other in the first direction D1, and the peripheral circuit region PER therebetween, as shown in FIG. 2A. As another example, the chip region CH may include a pair of the peripheral circuit regions PER, which are adjacent to each other in the first direction D1, and the cell block group region CBS therebetween, as shown in FIG. 2B. However, the inventive concept is not limited to this example.

The cell block group region CBS may be adjacent to a peripheral region PER or SL in the first direction D1. The peripheral region PER or SL may include the peripheral circuit region PER and the scribe lane region SL. As an example, the cell block group region CBS may be interposed between the peripheral circuit region PER and the scribe lane region SL (in detail, the edge lane region), which are adjacent to each other in the first direction D1, as shown in FIG. 2A. As another example, the cell block group region CBS may be interposed between the peripheral regions PER, which are adjacent to each other in the first direction D1, as shown in FIG. 2B.

Referring to FIG. 3, the cell block group region CBS may include a plurality of cell block regions CB and core regions COR surrounding the cell block regions CB. Core circuits may be provided on the core region COR. The core circuits may be configured to sense and/or control bit lines BL and/or word lines WL on the cell block region CB. As an example, the core circuits may include sense amplifier circuits SA, which are configured to sense the bit lines BL, and sub-word-line driver circuits SWD, which are configured to control the word lines WL. The sense amplifier circuits SA may face each other in the first direction D1, with the cell block regions CB interposed therebetween. The sub-word-line driver circuits SWD may face each other in the second direction D2, with the cell block regions CB interposed therebetween. In some embodiments, the sense amplifier circuits SA may be spaced apart from each other in the first direction D1, and the cell block region CB may be between a pair of the sense amplifier circuits SA, as illustrated in FIG. 3. The sub-word-line driver circuits SWD may be spaced apart from each other in the second direction D2, and the cell block region CB may be between a pair of the sub-word-line driver circuits SWD, as illustrated in FIG. 3.

The cell block regions CB may be disposed spaced apart from each other in the first and second directions D1 and D2. For example, the cell block regions CB may include a plurality of cell block columns R, which are arranged along the first direction D1 and are spaced apart from each other in the second direction D2. Each of the cell block columns R may include edge cell block regions CBe, which are disposed at opposite ends in the first direction D1, and center cell block regions CBc therebetween. The edge cell block regions CBe may be placed at or adjacent opposite edges of the cell block group region CBS in the first direction D1. The edge cell block regions CBe may be closer to the peripheral region PER or SL than the center cell block regions CBc. As an example, a first surface (e.g., a first side surface) of the edge cell block region CBe may be adjacent to the peripheral region PER or SL, and a second surface (e.g., a second side surface) of the edge cell block region CBe, which is opposite to the first surface, may be adjacent to the core region COR. The center cell block regions CBc may be surrounded by the core region COR.

The edge cell block regions CBe may have a first width W1 in the first direction D1. The center cell block regions CBc may have a second width W2 in the first direction D1. As an example, the first width W1 may be smaller than the second width W2.

Figure 4A:
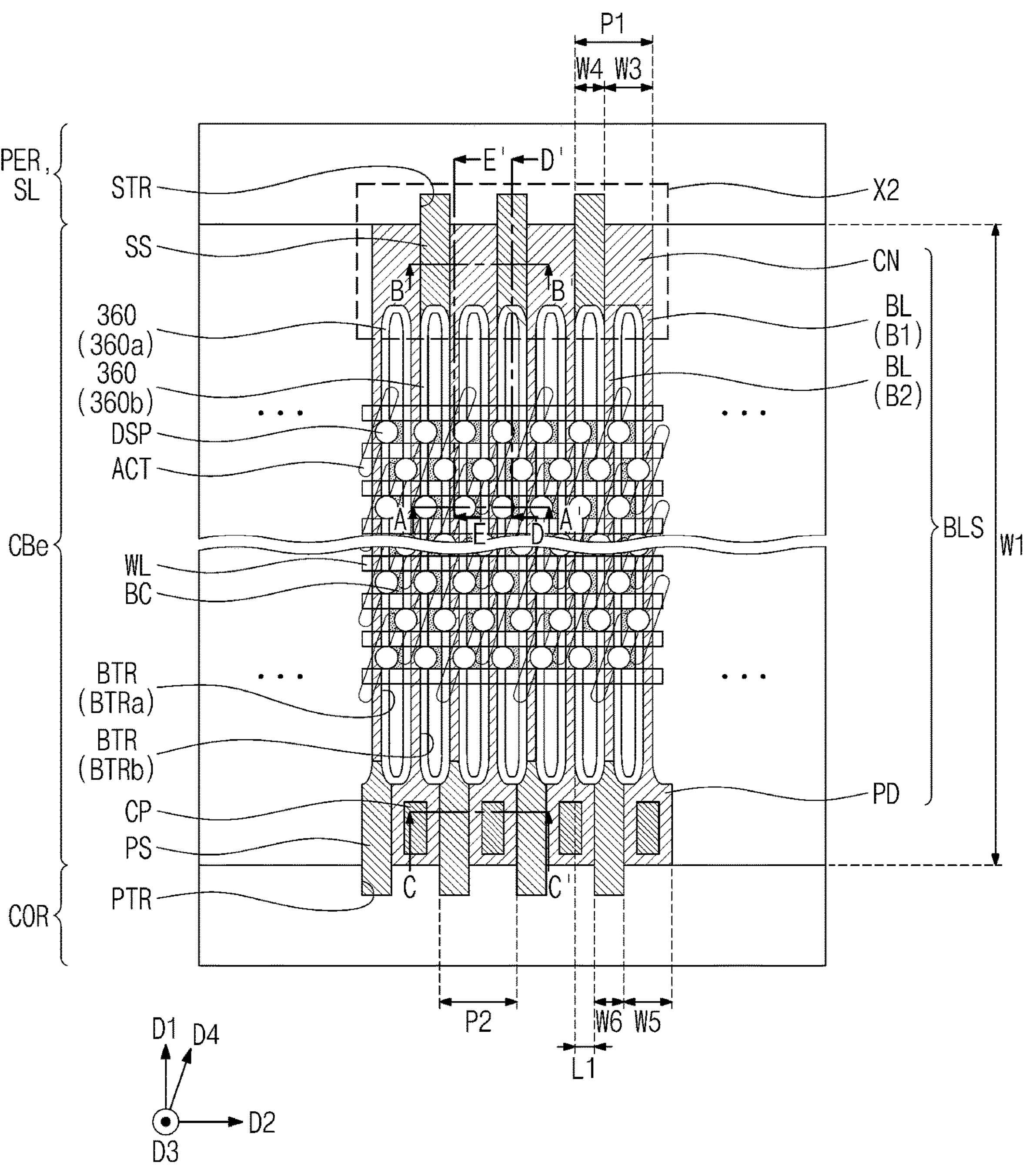
FIGS. 4A and 4B are plan views illustrating an edge cell block region and a center cell block region of FIG. 3, respectively.
Figure 4B:
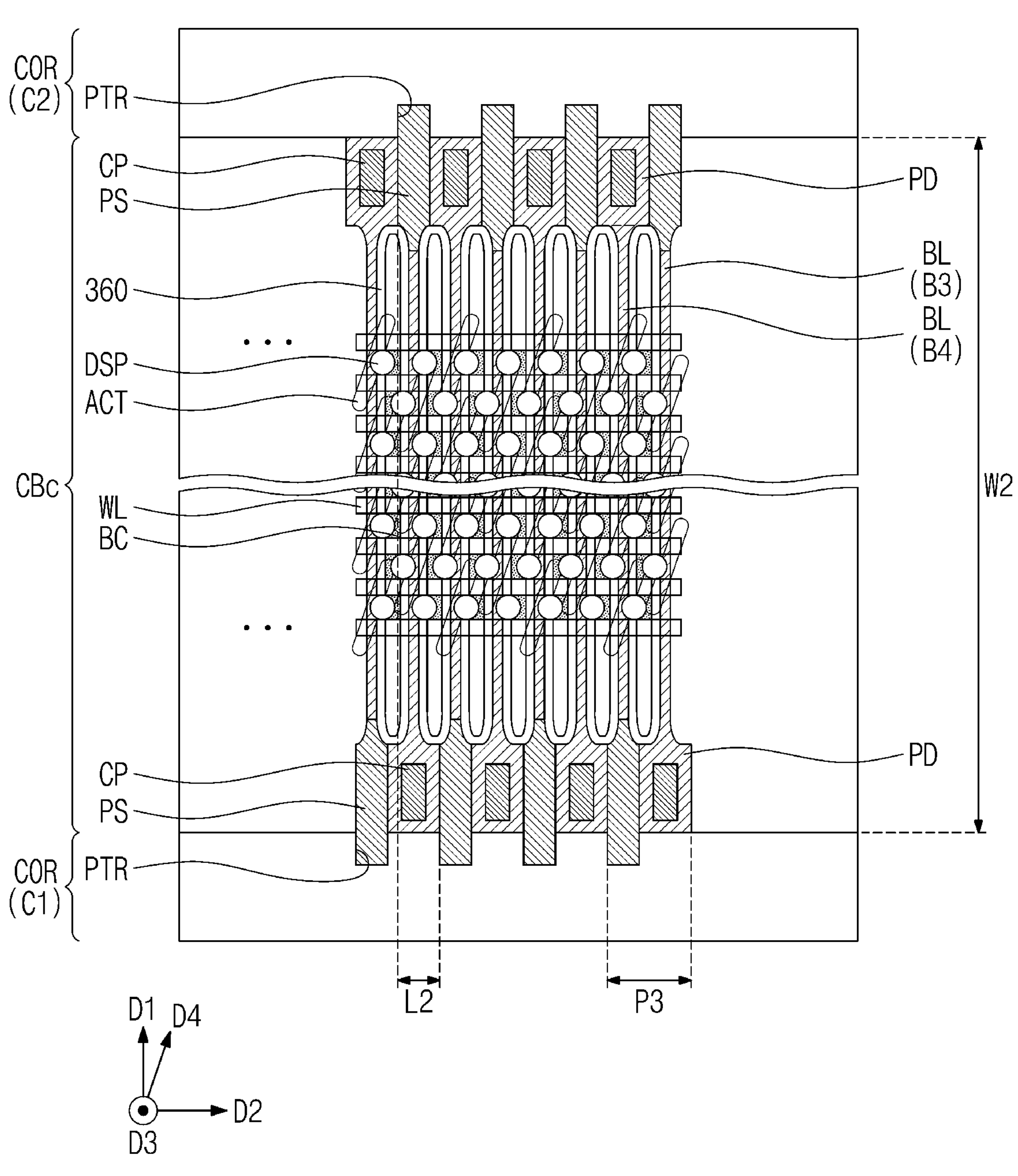

FIGS. 4A and 4B are plan views illustrating an edge cell block region and a center cell block region of FIG. 3, respectively. FIGS. 5A to 5E are sectional views, which are respectively taken alone lines A-A', B-B', C-C', D-D', and E-E' of FIG. 4A, illustrating a semiconductor device according to some embodiments of the inventive concept.

Referring to FIGS. 3, 4A, 4B, and 5A to 5E, a device isolation pattern 120 may be disposed in the substrate 100 to define active patterns ACT. The active patterns ACT may be provided on the cell block regions CB of the substrate 100. The active patterns ACT may have a shape protruding in a third direction D3 that is perpendicular to the bottom surface of the substrate 100. As an example, the active patterns ACT may be portions of the substrate 100 surrounded by the device isolation pattern 120. For convenience of explanation, in the present specification, the substrate 100 may be defined to represent the remaining portion of the substrate 100, except for the active patterns ACT, unless otherwise specified. The active patterns ACT may be disposed to be spaced apart from each other in the first and second directions D1 and D2. The active patterns ACT may be isolated bar-shaped patterns, which are spaced apart from each other and are elongated in a fourth direction D4. The fourth direction D4 may be parallel to the bottom surface of the substrate 100, but not the first and second directions D1 and D2. The device isolation pattern 120 may be formed of or include at least one of insulating materials (e.g., silicon oxide, silicon nitride, or combinations thereof). The device isolation pattern 120 may be a single layer, which is made of a single material, or a composite layer including two or more materials.

Each of the active patterns ACT may include a pair of edge portions 111 and a center portion 112. The pair of edge portions 111 may be two end portions of the active pattern ACT, which are opposite to each other in the fourth direction D4. The center portion 112 may be a portion of the active pattern ACT, which is interposed between the pair of edge portions 111, specially, between a pair of word lines WL that will be described below. The pair of edge portions 111 and/or the center portion 112 may be doped with impurities to have an n- or p-type conductivity.

The word line WL may be provided in the active patterns ACT. In some embodiments, a plurality of word lines WL may be provided. The word lines WL may be extending in the second direction D2 and may be spaced apart from each other in the first direction D1. The word lines WL may be disposed in trenches, which are formed in the active patterns ACT and the device isolation pattern 120. As an example, a pair of word lines WL, which are adjacent to each other in the first direction D1, may be provided to cross a single one of the active patterns ACT.

Each of the word lines WL may include a gate electrode GE, a gate dielectric pattern GI, and a gate capping pattern GC. The gate electrode GE may penetrate the active patterns ACT and the device isolation pattern 120 in the second direction D2. The gate dielectric pattern GI may be interposed between the gate electrode GE and the active patterns ACT and between the gate electrode GE and the device isolation pattern 120. The gate capping pattern GC may be provided on the gate electrode GE to cover a top surface of the gate electrode GE.

A buffer pattern 210 may be disposed on the substrate 100. The buffer pattern 210 may cover the active patterns ACT, the device isolation pattern 120, and the word lines WL. In some embodiments, the buffer pattern 210 may be formed of or include at least one of silicon oxide, silicon nitride, silicon oxynitride, or combinations thereof. The buffer pattern 210 may be a single layer, which is made of a single material, or a composite layer including two or more materials.

A bit line contact DC may be provided on one of the active patterns ACT, and in some embodiments, a plurality of bit line contacts DC may be provided. The bit line contacts DC may be connected to the center portions 112 of the active patterns ACT, respectively. In the present specification, the expression "A is connected to B" may be used to not only represent "A is in contact with B" but also represent the meaning that "A is electrically connected to B," even if they are not in physical contact with each other. The bit line contacts DC may be spaced apart from each other in the first and second directions D1 and D2. The bit line contact DC may be interposed between each of the active patterns ACT and a corresponding one of bit lines BL, which will be described below. Each of the bit line contacts DC may connect a corresponding one of the bit lines BL to the center portion 112 of a corresponding one of the active patterns ACT.

The bit line contacts DC may be disposed in first recess regions RS1, respectively. The first recess regions RS1 may be provided in upper portions of the active patterns ACT and an upper portion of the device isolation pattern 120, which is adjacent to the upper portions of the active patterns ACT. The first recess regions RS1 may be spaced apart from each other in the first and second directions D1 and D2.

Referring to FIGS. 4A and 4B, the bit line BL may be provided on the cell block region CB. In some embodiments, a plurality of bit lines BL may be provided. The bit lines BL may be extending in the first direction D1 and may be spaced apart from each other in the second direction D2. The bit line BL may be formed of or include at least one of metallic materials. As an example, the bit line BL may be formed of or include at least one of tungsten, rubidium, molybdenum, titanium, or combinations thereof.

Referring to FIG. 4A, a pair of the bit lines BL, which are provided on the edge cell block region CBe, may constitute a bit line structure BLS, along with a bit line connector CN and a bit line pad PD. For example, the pair of bit lines BL may include a first bit line B1 and a second bit line B2, which are adjacent to each other in the second direction D2.

The bit line connector CN may connect the first bit line B1 to the second bit line B2 and may be in contact with the first and second bit lines B1 and B2. The bit line connector CN may be adjacent to the peripheral region PER or SL. The bit line pad PD may be connected to or in contact with the first bit line B1. The bit line pad PD may be spaced apart from the second bit line B2. The bit line pad PD may be connected to the second bit line B2 through the first bit line B1 and the bit line connector CN or may not be in contact with the second bit line B2. One of the bit line pads PD may be connected to a pair of the bit lines BL. The bit line pad PD may be adjacent to the core region COR.

When viewed in the first direction D1, the edge cell block region CBe may be defined to span a region from an end portion of the bit line connector CN to an end portion of the bit line pad PD. Thus, the first width W1 of FIG. 3 may be a distance from the end portion of the bit line connector CN to the end portion of the bit line pad PD. The bit line connector CN and the bit line pad PD may be formed of or include the same material as the bit lines BL and may be connected to the bit lines BL without any interface (e.g., a visible interface) therebetween.

In some embodiments, a plurality of bit line structures BLS may be provided. The bit line structures BLS may be adjacent to each other in the second direction D2. Slit separation patterns SS and pad separation patterns PS may be interposed between adjacent ones of the bit line structures BLS. Each of the slit and pad separation patterns SS and PS may be interposed between bit line capping patterns 350, which will be described below.

The slit separation patterns SS may be respectively disposed between the bit line connectors CN of adjacent ones of the bit line structures BLS. Each of the slit separation patterns SS may separate the bit line connectors CN of the adjacent ones of the bit line structures BLS from each other. The slit separation patterns SS may be respectively disposed in slit trenches STR between the bit line connectors CN. The slit separation patterns SS may be extending from portions on the edge cell block region CBe to portions on the peripheral region PER or SL in the first direction D1. The slit separation patterns SS may be formed of or include the same material as a third capping pattern 353, which will be described below.

The pad separation patterns PS may be respectively disposed between the bit line pads PD of adjacent ones of the bit line structures BLS. Each of the pad separation patterns PS may separate the bit line pads PD of adjacent ones of the bit line structures BLS from each other. The pad separation patterns PS may be respectively disposed in pad trenches PTR between the bit line pads PD. The pad separation patterns PS may be extending from portions on the core region COR to portions on the edge cell block region CBe in the first direction D1. The pad separation patterns PS may be formed of or include the same material as a third capping pattern 353, which will be described below.

The bit line structures BLS may have a first pitch P1 and a second pitch P2, in the second direction D2. In the present specification, the term "pitch" may mean the minimum distance between repeated elements in a structure possessing translational symmetry. In detail, the bit line connectors CN of the bit line structures BLS may be provided to have the first pitch P1. The first pitch P1 may be defined as a sum of a third width W3 and a fourth width W4 that are widths of the bit line connector CN and the slit separation pattern SS, which are respectively measured in the second direction D2. The bit line pads PD of the bit line structures BLS may have the second pitch P2. The second pitch P2 may be defined as a sum of a fifth width W5 and a sixth width W6 that are widths of the bit line pad PD and the pad separation pattern PS, which are respectively measured in the second direction D2.

As an example, the first pitch P1 may be substantially equal to the second pitch P2. As another example, the first pitch P1 may be different from the second pitch P2. As an example, the third width W3 may be substantially equal to the fifth width W5, and the fourth width W4 may be substantially equal to the sixth width W6. As another example, the third width W3 may be different from the fifth width W5, and the fourth width W4 may be different from the sixth width W6.

The pad separation pattern PS may be shifted from the slit separation pattern SS in the second direction D2. As an example, the pad separation pattern PS may be shifted from the slit separation pattern SS by a first length L1 in the second direction D2. The first length L1 may be smaller than half of the first pitch P1 (or the second pitch P2). Accordingly, in each bit line structure BLS, the bit line pad PD may be shifted from the bit line connector CN in the second direction D2. As an example, the bit line pad PD may be shifted from the bit line connector CN by the first length L1 in the second direction D2. As used herein, "an element A is shifted from an element B in a direction X" (or similar language) may mean that a center (e.g., a center in the direction X) of the element A is offset from a center (e.g., a center in the direction X) of the element B in the direction X, and thus those centers are not aligned in a direction that is perpendicular to the direction X.

Referring to FIG. 4B, on the center cell block region CBc, the bit line BL may be connected to the bit line pad PD. Each of the bit lines BL may be connected to a corresponding one of the bit line pads PD. In some embodiments, a third bit line B3 and a fourth bit line B4 may be provided to be adjacent to each other in the second direction D2. One of the bit line pads PD may be connected to the third bit line B3 at a position adjacent to a first core region C1. Another one of the bit line pads PD may be connected to the fourth bit line B4 at a position adjacent to a second core region C2. The first core region C1 and the second core region C2 may be portions of the core regions COR facing each other in the first direction D1, with the center cell block region CBc interposed therebetween. The third bit line B3 and the fourth bit line B4 may not be connected to each other.

When viewed in the first direction D1, the center cell block region CBc may be defined to span a region from an end portion of the bit line pad PD connected to the third bit line B3 to an end portion of the bit line pad PD connected to the fourth bit line B4. Accordingly, the second width W2 of FIG. 3 may be a distance from the end portion of the bit line pad PD connected to the third bit line B3 to the end portion of the bit line pad PD connected to the fourth bit line B4. The bit line pad PD may be formed of or include the same material as the bit line BL and may be connected to the bit line BL without any interface (e.g., a visible interface) therebetween.

The pad separation patterns PS may be interposed between the bit line pads PD, which are adjacent to each other in the second direction D2. The pad separation patterns PS adjacent to the first core region C1 may be shifted from the pad separation patterns PS adjacent to the second core region C2 by a second length L2 in the second direction D2. The second length L2 may be different from the first length L1.

The bit line pads PD may have a third pitch P3 in the second direction D2. The third pitch P3 may be defined as a sum of widths of the bit line pad PD and the pad separation pattern PS measured in the second direction D2. As an example, the second length L2 may be substantially equal to half of the third pitch P3. As another example, the second length L2 may be different from half of the third pitch P3.

Referring to FIGS. 3, 4A, 4B, and 5A to 5E, a polysilicon pattern 310 may be provided between the bit line BL and the buffer pattern 210 and between the bit line contacts DC, which are adjacent to each other in the first direction D1. In some embodiments, a plurality of polysilicon patterns 310 may be provided. As an example, each of the polysilicon pattern 310 may be spaced apart from each other in the first and second directions D1 and D2. The polysilicon pattern 310 may have a top surface that is located at substantially the same height as (i.e., coplanar with) the top surface of the bit line contact DC. The polysilicon pattern 310 may be formed of or include doped polysilicon.

A first barrier pattern 320 may be provided between the bit line BL and the bit line contact DC, between the bit line BL and the polysilicon pattern 310, between the bit line connector CN and the polysilicon pattern 310, and between the bit line pad PD and the polysilicon pattern 310. In some embodiments, a plurality of first barrier patterns 320 may be extending along the bit lines BL or in the first direction D1 and may be spaced apart from each other in the second direction D2. The first barrier pattern 320 may be formed of or include at least one of conductive metal nitride materials (e.g., titanium nitride and tantalum nitride). A first ohmic pattern (not shown) may be additionally interposed between the bit line BL and the bit line contact DC and between the bit line BL and the polysilicon pattern 310. The first ohmic pattern may be formed of or include at least one of metal silicide materials.

The bit line capping pattern 350 may be provided on a top surface of the bit line BL. In some embodiments, a plurality of bit line capping patterns 350 may be provided to be spaced apart from each other in the second direction D2, and here, each of the bit line capping patterns 350 may be extending along a corresponding one of the bit lines BL or in the first direction D1. The bit line capping pattern 350 may be vertically overlapped with the bit line BL. The bit line capping pattern 350 may be provided to have a single- or multi-layered structure. As an example, the bit line capping pattern 350 may include a first capping pattern 351, a second capping pattern 352, and a third capping pattern 353, which are sequentially stacked. The first to third capping patterns 351, 352, and 353 may be formed of or include silicon nitride. As another example, the bit line capping pattern 350 may further include additional capping patterns (e.g., fourth and fifth capping patterns (not shown)).

Figure 5A:
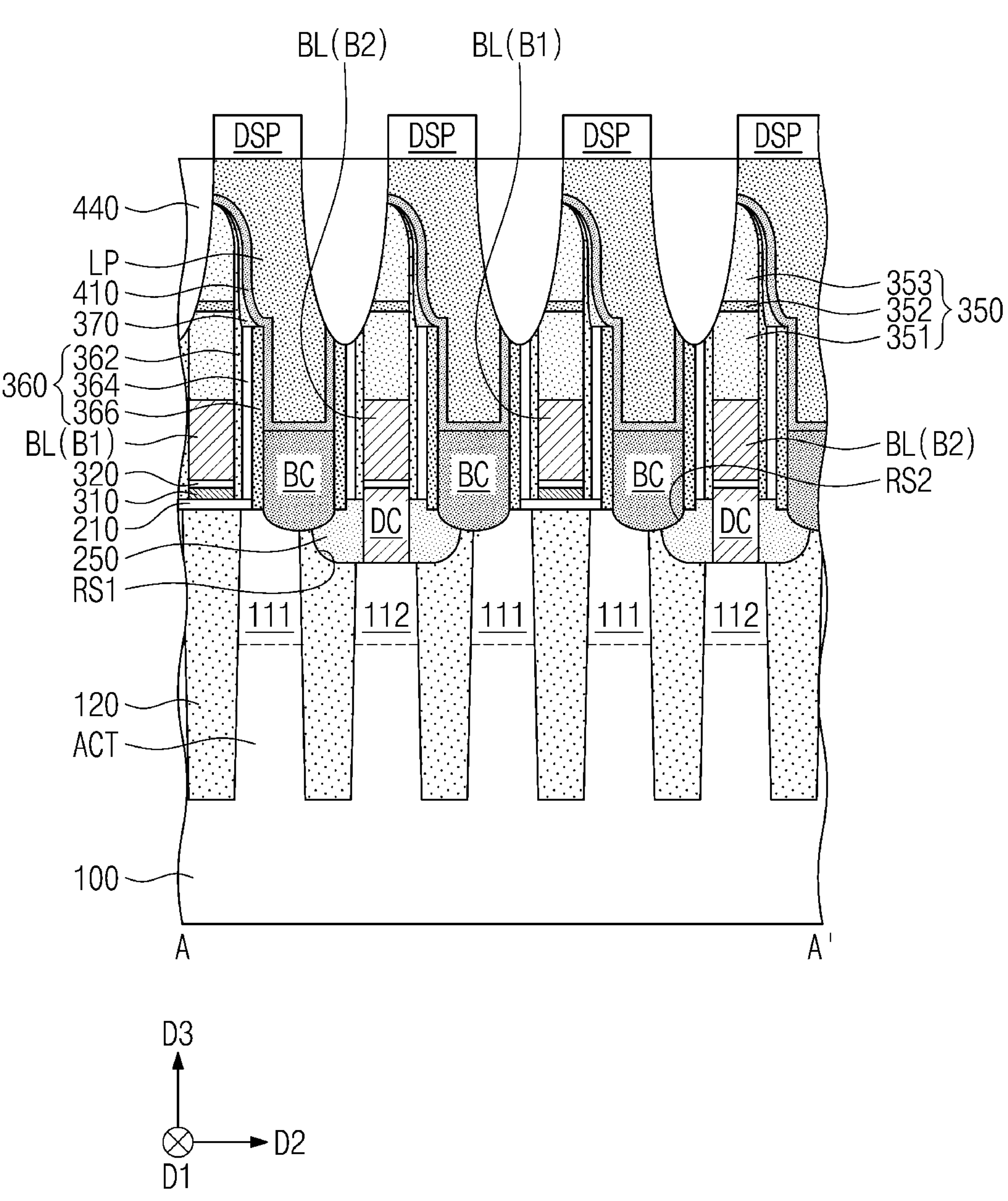
Figure 5B:
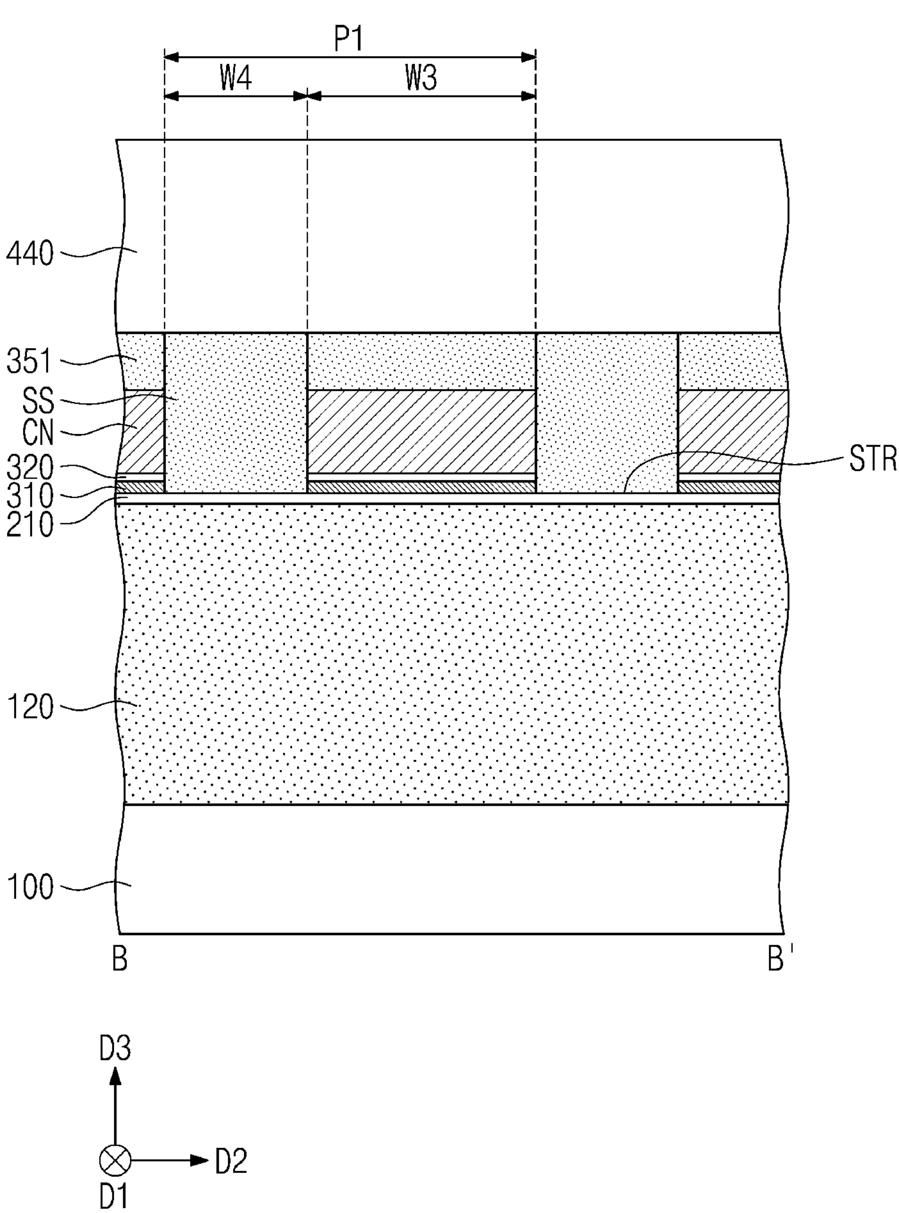
Figure 5C:
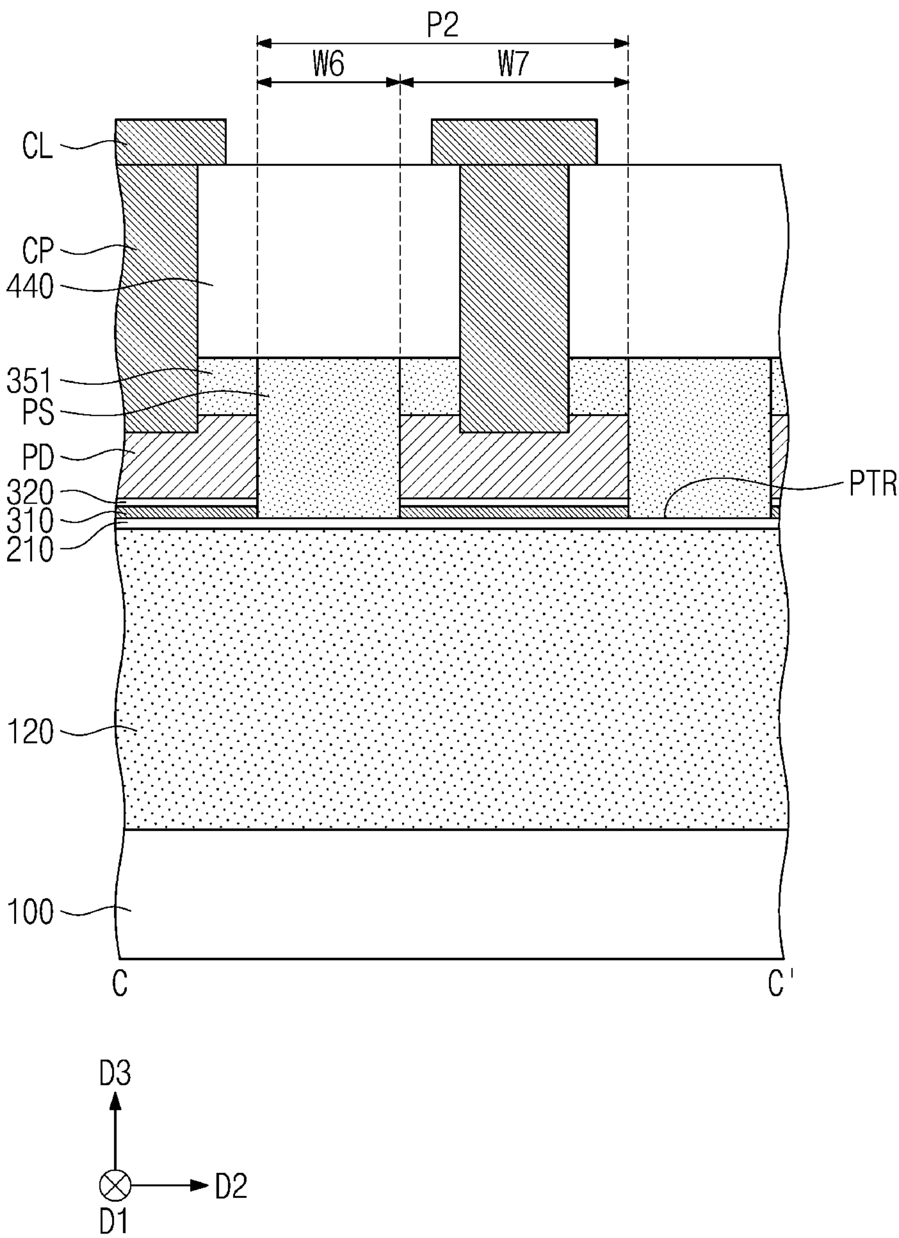
Figure 5D:
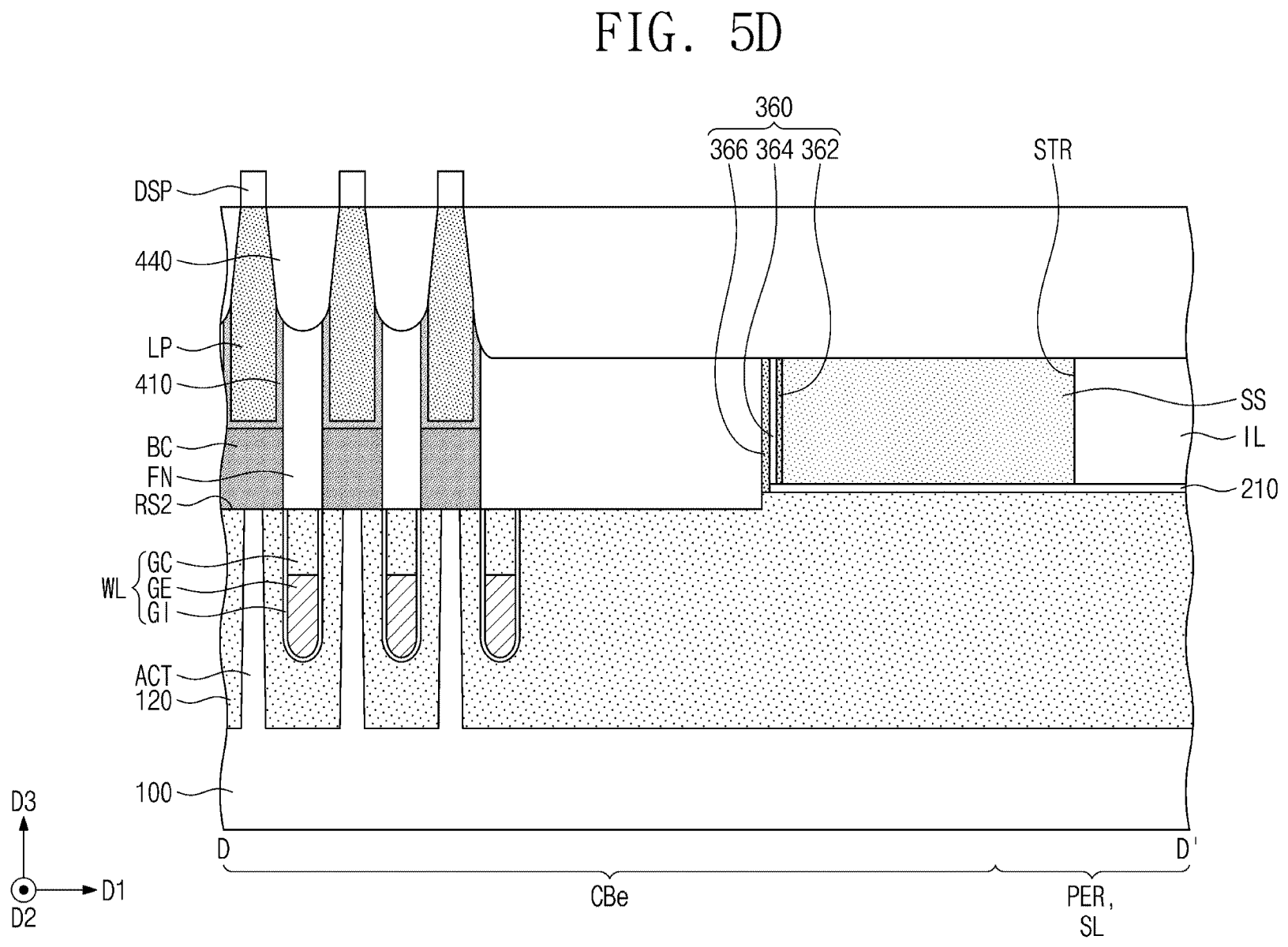
Figure 5E:
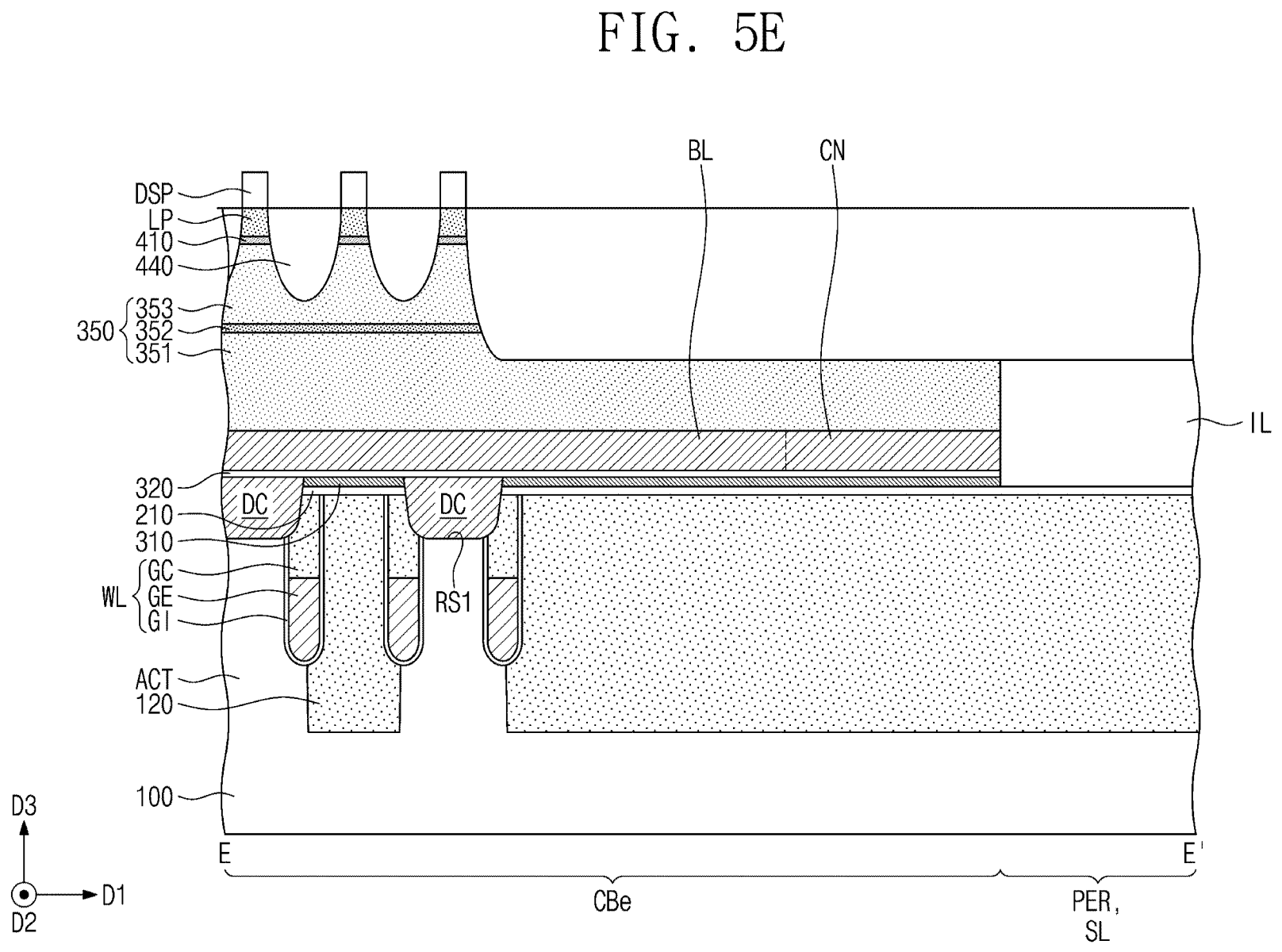

At least one of the first capping pattern 351, the second capping pattern 352, the third capping pattern 353, the fourth capping pattern, and the fifth capping pattern may be provided on the bit line connector CN. In some embodiments, the first capping pattern 351 may be provided on the bit line connector CN, as shown in FIGS. 5B and 5E. At least one of the first capping pattern 351, the second capping pattern 352, the third capping pattern 353, the fourth capping pattern, and the fifth capping pattern may be provided on the bit line pad PD. As an example, the first capping pattern 351 may be provided on the bit line pad PD, as shown in FIG. 5C.

A spacer structure 360 may be provided on a side surface of the bit line BL and a side surface of the bit line capping pattern 350. The spacer structure 360 may cover the side surface of the bit line BL and the side surface of the bit line capping pattern 350. A bit line trench BTR may be provided between the bit lines BL, and the spacer structure 360 may cover an inner side surface of the bit line trench BTR (e.g., see FIG. 4A). The bit line trench BTR and the spacer structure 360 may be extending in the first direction D1. In some embodiments, a plurality of spacer structures 360 may be provided.

The spacer structure 360 may include a plurality of spacers. As an example, the spacer structure 360 may include a first spacer 362, a second spacer 364, and a third spacer 366. The third spacer 366 may be provided on the side surface of the bit line BL and the side surface of the bit line capping pattern 350. The first spacer 362 may be interposed between the bit line BL and the third spacer 366 and between the bit line capping pattern 350 and the third spacer 366. The second spacer 364 may be interposed between the first spacer 362 and the third spacer 366. As an example, each of the first to third spacers 362, 364, and 366 may be formed of or include at least one of silicon nitride, silicon oxide, silicon oxynitride, or combinations thereof. As another example, the second spacer 364 may include a cavity (e.g., an air gap) separating the first and third spacers 362 and 366 from each other. It will be understood that "cavity" may be a gap filled with air (e.g., an air gap), a gap filled with an inert gas or gases (e.g., an inert gas gap), a gap defining a vacuum (e.g., a vacuum gap), etc.

Referring to FIG. 4A, on the edge cell block region CBe, the spacer structure 360 may include a first spacer structure 360*a* and a second spacer structure 360*b*. The first spacer structure 360*a* may be provided between the first and second bit lines B1 and B2 of each bit line structure BLS. As an example, a first bit line trench BTRa may be provided between the first and second bit lines B1 and B2 of the bit line structure BLS, and the first spacer structure 360*a* may be provided in the first bit line trench BTRa. The second spacer structure 360*b* may be provided between the bit line structures BLS, which are adjacent to each other in the second direction D2. As an example, the second bit line trench BTRb may be provided between the adjacent ones of the bit line structures BLS, and the second spacer structure 360*b* may be provided in the second bit line trench BTRb.

The first spacer structure 360*a* may be in contact with the bit line structure BLS and the pad separation pattern PS. The first spacer structure 360*a* may be spaced apart from the slit separation pattern SS and may not be in contact with the slit separation pattern SS. The second spacer structure 360*b* may be in contact with the adjacent ones of the bit line structures BLS, the slit separation pattern SS, and the pad separation pattern PS.

Referring to FIG. 4B, on the center cell block region CBc, the spacer structure 360 may be interposed between the bit lines BL, which are adjacent to each other in the second direction D2. As an example, the spacer structure 360 may be interposed between the third bit line B3 and the fourth bit line B4. The spacer structure 360 may be in contact with the adjacent ones of the bit lines BL and the pad separation patterns PS, which are in contact with the adjacent ones of the bit lines BL, respectively.

Referring to FIGS. 3, 4A, 4B, and 5A to 5E, a gapfill insulating pattern 250 may be provided to fill each of the first recess regions RS1. The gapfill insulating pattern 250 may fill an inner space of the first recess region RS1. As an example, the gapfill insulating pattern 250 may cover an inner surface of the first recess region RS1 and at least a portion of a side surface of the bit line contact DC (e.g., in the first recess region RS1). The gapfill insulating pattern 250 may be formed of or include at least one of silicon oxide, silicon nitride, or combinations thereof. The gapfill insulating pattern 250 may be a single layer, which is made of a single material, or a composite layer including two or more materials.

An interlayer insulating layer IL may be provided on the peripheral region PER or SL and the core region COR. Peripheral circuits and core circuits may be disposed in the interlayer insulating layer IL. The interlayer insulating layer IL may be formed of or include at least one of silicon oxide, silicon nitride, low-k dielectric materials, or combinations thereof. The low-k dielectric material may be a material having a dielectric constant lower than silicon oxide.

A capping spacer 370 may be placed on the spacer structure 360. The capping spacer 370 may cover an upper portion of a side surface of the spacer structure 360. In some embodiments, the capping spacer 370 may be formed of or include silicon nitride.

A storage node contact BC may be provided between adjacent ones of the bit lines BL. As an example, the storage node contact BC may be interposed between the spacer structure 360. In some embodiments, a plurality of storage node contacts BC may be provided to be spaced apart from each other in the first and second directions D1 and D2. The storage node contacts BC may be spaced apart from each other in the first direction D1 by fence patterns FN on the word lines WL. The fence pattern FN may be provided between adjacent ones of the bit lines BL. In some embodiments, a plurality of fence patterns FN may be provided. The fence patterns FN may be spaced apart from each other in the first and second directions D1 and D2. The fence patterns FN, which are adjacent to each other in the first direction D1, may be spaced apart from each other, with the bit line BL interposed therebetween. The fence patterns FN, which are adjacent to each other in the first direction D1, may be spaced apart from each other, with the storage node contact BC interposed therebetween. In some embodiments, the fence patterns FN may be formed of or include silicon nitride.

The storage node contact BC may fill a second recess region RS2, which is provided on the edge portion 111 of the active pattern ACT. The storage node contact BC may be connected to the edge portion 111. The storage node contact BC may be formed of or include at least one of doped or undoped polysilicon, metallic materials, or combinations thereof.

A second barrier pattern 410 may conformally cover the spacer structure 360, the fence pattern FN, and the storage node contact BC. The second barrier pattern 410 may be formed of or include metal nitride materials (e.g., titanium nitride and tantalum nitride). A second ohmic pattern (not shown) may be further interposed between the second barrier pattern 410 and the storage node contact BC. The second ohmic pattern may be formed of or include a metal silicide material.

A landing pad LP may be provided on the storage node contact BC. In some embodiments, a plurality of landing pads LP may be provided to be spaced apart from each other in the first and second directions D1 and D2. Each of the landing pads LP may be connected to a corresponding one of the storage node contacts BC. The landing pad LP may cover a top surface of the bit line capping pattern 350. A lower region of the landing pad LP may be vertically overlapped with the storage node contact BC. An upper region of the landing pad LP may be shifted from the lower region in the second direction D2. The landing pad LP may be formed of or include at least one of metallic materials (e.g., tungsten, titanium, and tantalum).

A filler pattern 440 may be provided to enclose the landing pad LP. The filler pattern 440 may be interposed between adjacent ones of the landing pads LP. When viewed in a plan view, the filler pattern 440 may be provided in a mesh shape with holes, and in this case, the landing pads LP may be provided in the holes to penetrate the filler pattern 440. As an example, the filler pattern 440 may be formed of or include at least one of silicon nitride, silicon oxide, silicon oxynitride, or combinations thereof. As another example, the filler pattern 440 may include an empty space with a cavity (i.e., an air gap).

A contact plug CP may be provided on the bit line pad PD. The contact plug CP may penetrate the filler pattern 440 and the bit line capping pattern 350 (e.g., the first capping pattern 351) in the third direction D3 and may be connected to the bit line pad PD. The contact plug CP may include the same material as the landing pad LP.

Contact lines CL may be provided on the filler pattern 440 and may be connected to the contact plug CP. The contact lines CL may be provided to form one or more interconnection layers. The contact lines CL may be connected to the core circuits on the core region COR. The bit lines BL may be connected to the core circuits (e.g., the sense amplifier circuits SA) through the bit line pad PD, the contact plug CP, and the contact lines CL.

In some embodiments, on the center cell block region CBc, the third bit line B3 may be connected to a core circuit on the first core region C1, and the fourth bit line B4 adjacent to the third bit line B3 may be connected to a core circuit on the second core region C2. During this process, the third bit line B3 and the fourth bit line B4 may be connected to respective ones of the core circuits through respective ones of the bit line pads PD, respective ones of the contact plug CP, and respective ones of the contact lines CL.

As another example, on the edge cell block region CBe, the first and second bit lines B1 and B2 may be connected to the core circuit via the same bit line pad PD, the same contact plug CP, and the same contact line CL. That is, a pair of the bit lines BL may be connected to the core circuit via one of the bit line pads PD adjacent to the core region COR.

In the case where the bit line pad PD on the edge cell block region CBe is provided adjacent to the peripheral region PER or SL, there may be difficulties in constructing a routing structure, particularly in connecting the bit line pad PD, which is far from the core region COR, to the core circuit. Or the bit line pad PD, which is adjacent to the peripheral region PER or SL, may not be connected to the core circuit, and thus, some of the bit lines BL may malfunction. By contrast, according to some embodiments of the inventive concept, since not the bit line pad PD but the bit line connector CN is configured to be adjacent to the peripheral region PER or SL, a pair of the bit lines BL may be connected to the core circuit via one of the bit line pads PD adjacent to the core region COR. Accordingly, it may be possible to reduce the number of the bit lines BL, which are not connected to the core circuits, and thereby to increase an integration density of the semiconductor device. Furthermore, it may be possible to reduce technical difficulties in a routing process.

A data storage pattern DSP may be provided on the landing pad LP. In some embodiments, a plurality of data storage patterns DSP may be provided, and the data storage patterns DSP may be spaced apart from each other in the first and second directions D1 and D2. The data storage patterns DSP may be connected to the edge portions 111, respectively, via corresponding landing pads LP and corresponding storage node contacts BC.

In some embodiments, the data storage pattern DSP may be a capacitor including a bottom electrode, a dielectric layer, and a top electrode. In this case, the semiconductor memory device according to some embodiments of the inventive concept may be a dynamic random access memory (DRAM) device. In some embodiments, the data storage pattern DSP may include a magnetic tunnel junction pattern. In this case, the semiconductor memory device may be a magnetic random access memory (MRAM) device. In some embodiments, the data storage pattern DSP may be formed of or include a phase-change material or a variable resistance material. In this case, the semiconductor memory device may be a phase-change random access memory (PRAM) device or a resistive random access memory (Re- RAM) device. However, the inventive concept is not limited to these examples, and the data storage pattern DSP may include various structures and/or materials which can be used to store data.

Figure 6:
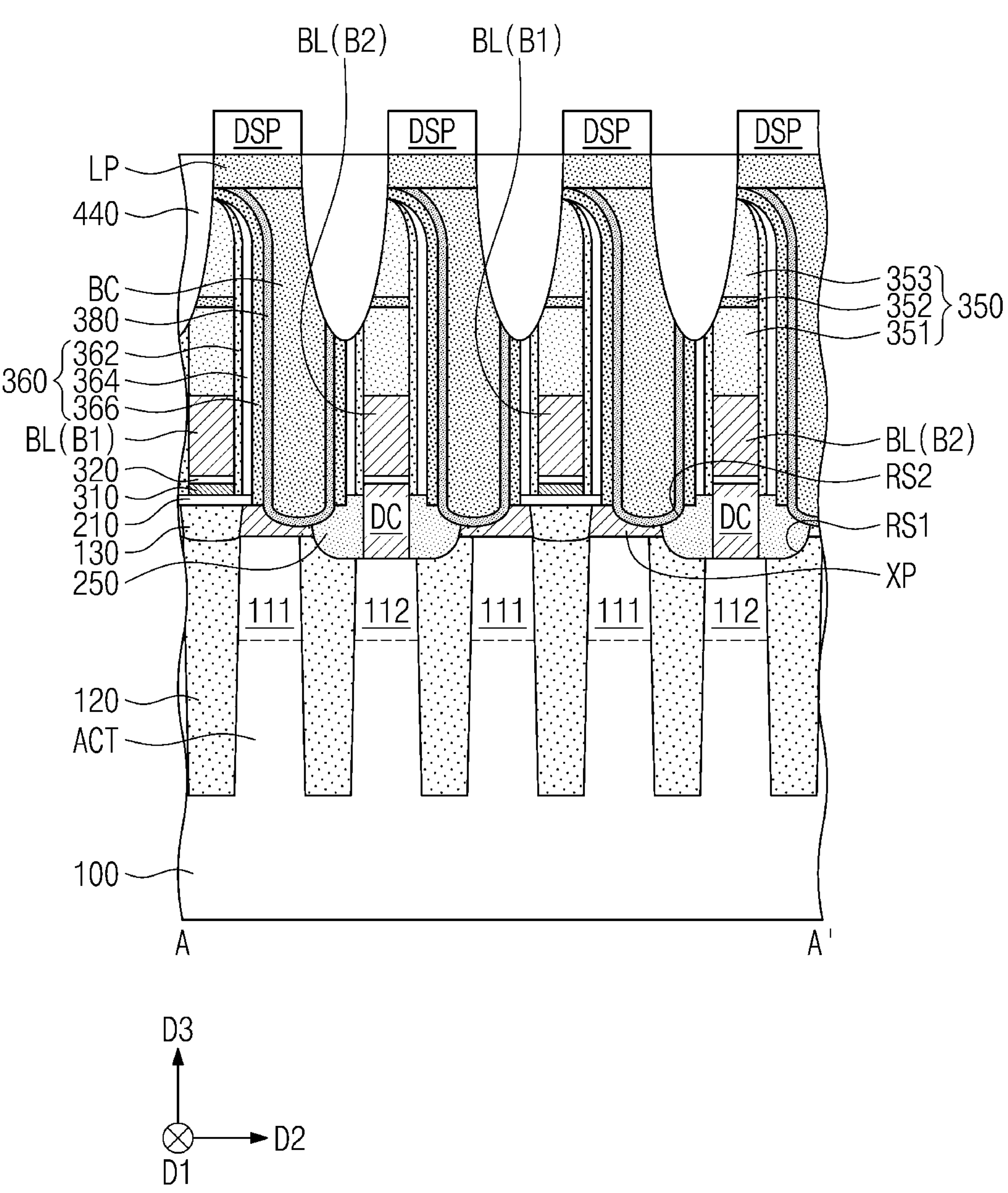
FIG. 6 is a sectional view, which is taken along the line A-A' of FIG. 4A to illustrate a semiconductor device according to some embodiments of the inventive concept.

FIG. 6 is a sectional view, which is taken along the line A-A' of FIG. 4A to illustrate a semiconductor device according to some embodiments of the inventive concept.

Referring to FIG. 6, a connection pattern XP may be provided on the edge portion 111 of the active pattern ACT. In some embodiments, a plurality of connection patterns XP may be provided. The connection patterns XP may be spaced apart from each other by a separation insulating pattern 130. The connection pattern XP may be interposed between the storage node contact BC and the edge portion 111 and may connect them to each other. As an example, each of the connection patterns XP may connect a corresponding one of the storage node contacts BC to a corresponding one of the edge portions 111. As an example, a top surface of the connection pattern XP and a top surface of the separation insulating pattern 130 may be located at substantially the same level and may be coplanar with each other. As used herein, a level A is higher than a level B" (or similar language) may mean that the level B is closer than the level A to a substrate 100.

The storage node contact BC may be interposed between the bit lines BL and between the bit line capping patterns 350. As an example, a top surface of the storage node contact BC may be located at a level that is higher than a top surface of the bit line BL. An upper portion of the storage node contact BC may be shifted from a lower portion thereof in the second direction D2. The storage node contact BC may be formed of or include at least one of doped or undoped polysilicon, metallic materials, or combinations thereof.

A third barrier pattern 380 may be provided between the storage node contact BC and the spacer structure 360 and between the storage node contact BC and the connection pattern XP. The third barrier pattern 380 may be formed of or include at least one of conductive metal nitride materials (e.g., titanium nitride, tungsten nitride, and tantalum nitride). A third ohmic pattern (not shown) may be provided between the third barrier pattern 380 and the connection pattern XP. The third ohmic pattern may be formed of or include at least one of metal silicide materials.

The landing pad LP may be provided on the storage node contact BC. In some embodiments, a plurality of landing pads LP may be provided, and here, the landing pads LP may be spaced apart from each other in the first and second directions D1 and D2. Each of the landing pads LP may be connected to a corresponding one of the storage node contact BC. The landing pad LP may cover the top surface of the bit line capping pattern 350. The landing pad LP may be shifted from the connection pattern XP in the second direction D2. The landing pad LP may be formed of or include at least one of metallic materials (e.g., tungsten, titanium, and tantalum).

The filler pattern 440 may be provided to surround each of the landing pads LP. The filler pattern 440 may be interposed between adjacent ones of the landing pads LP. When viewed in a plan view, the filler pattern 440 may be provided in a mesh shape with holes, and in this case, the landing pads LP may be provided in the holes to penetrate the filler pattern 440. As an example, the filler pattern 440 may be formed of or include at least one of silicon nitride, silicon oxide, or silicon oxynitride. As another example, the filler pattern 440 may be a cavity (e.g., an air gap) that may be filled with, for example, a gaseous material.

FIGS. 7A to 7E are enlarged plan views, each of which illustrates a region 'X2' of FIG. 4A.

Figure 7A:
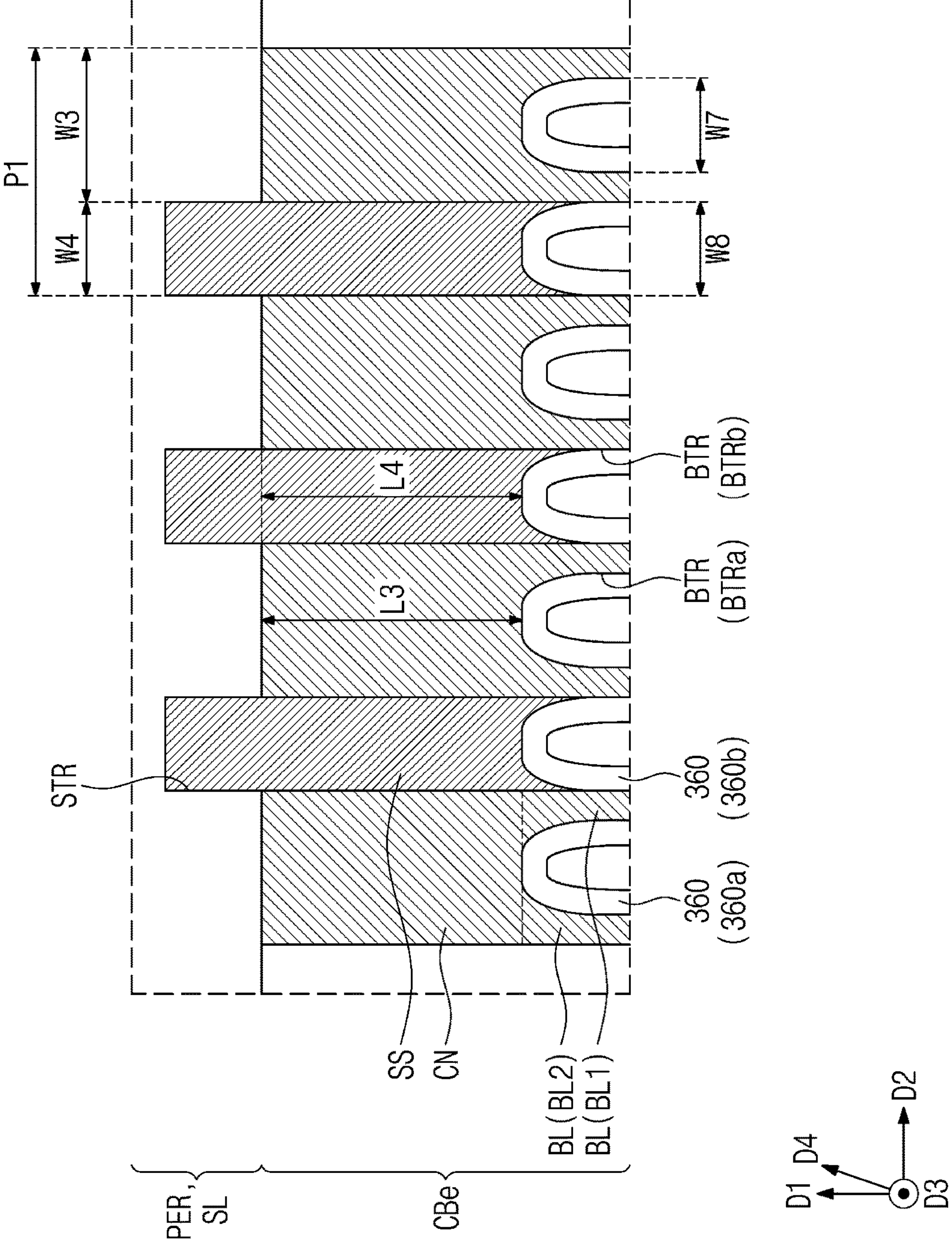
Figure 7B:
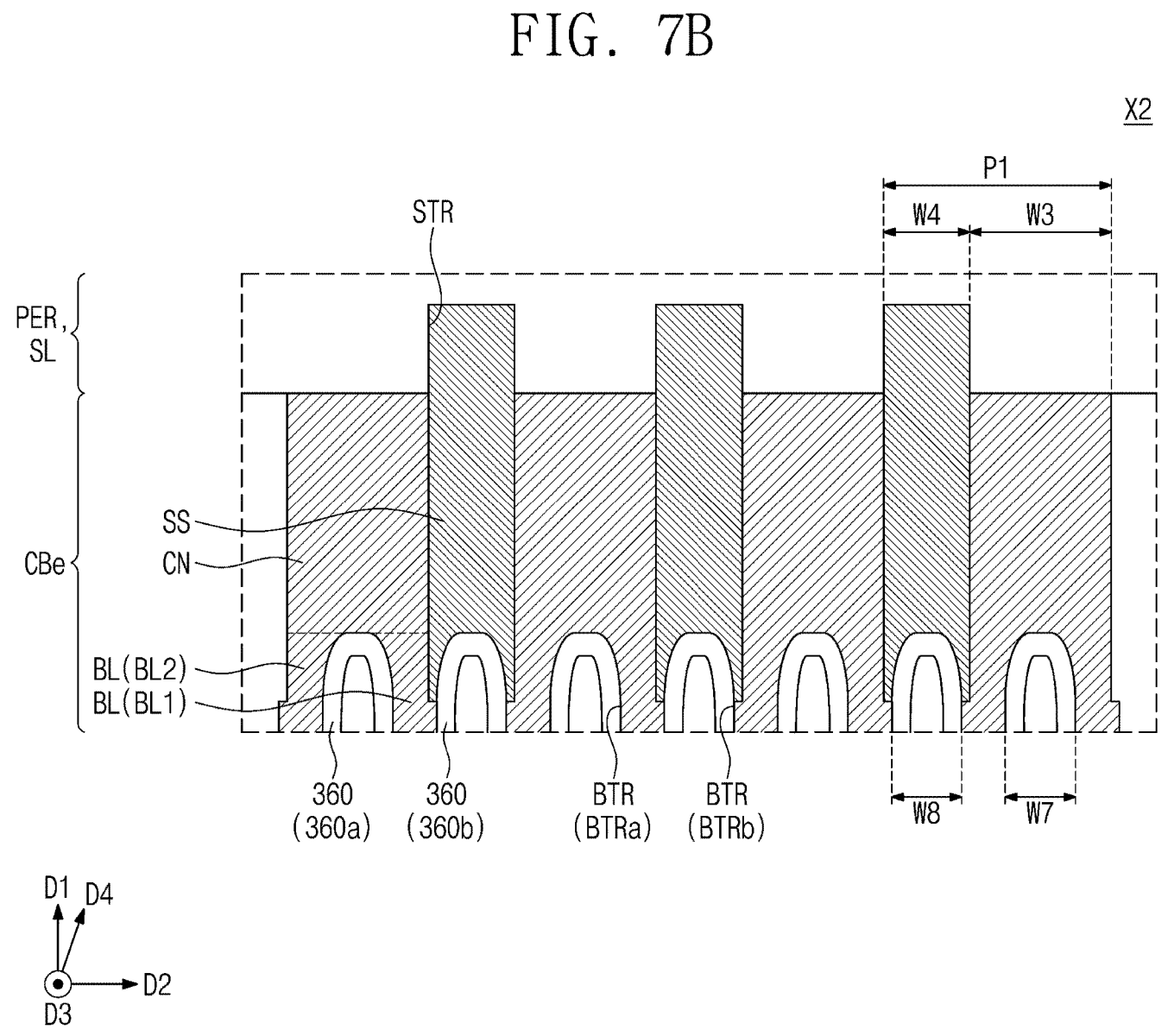
Figure 7C:
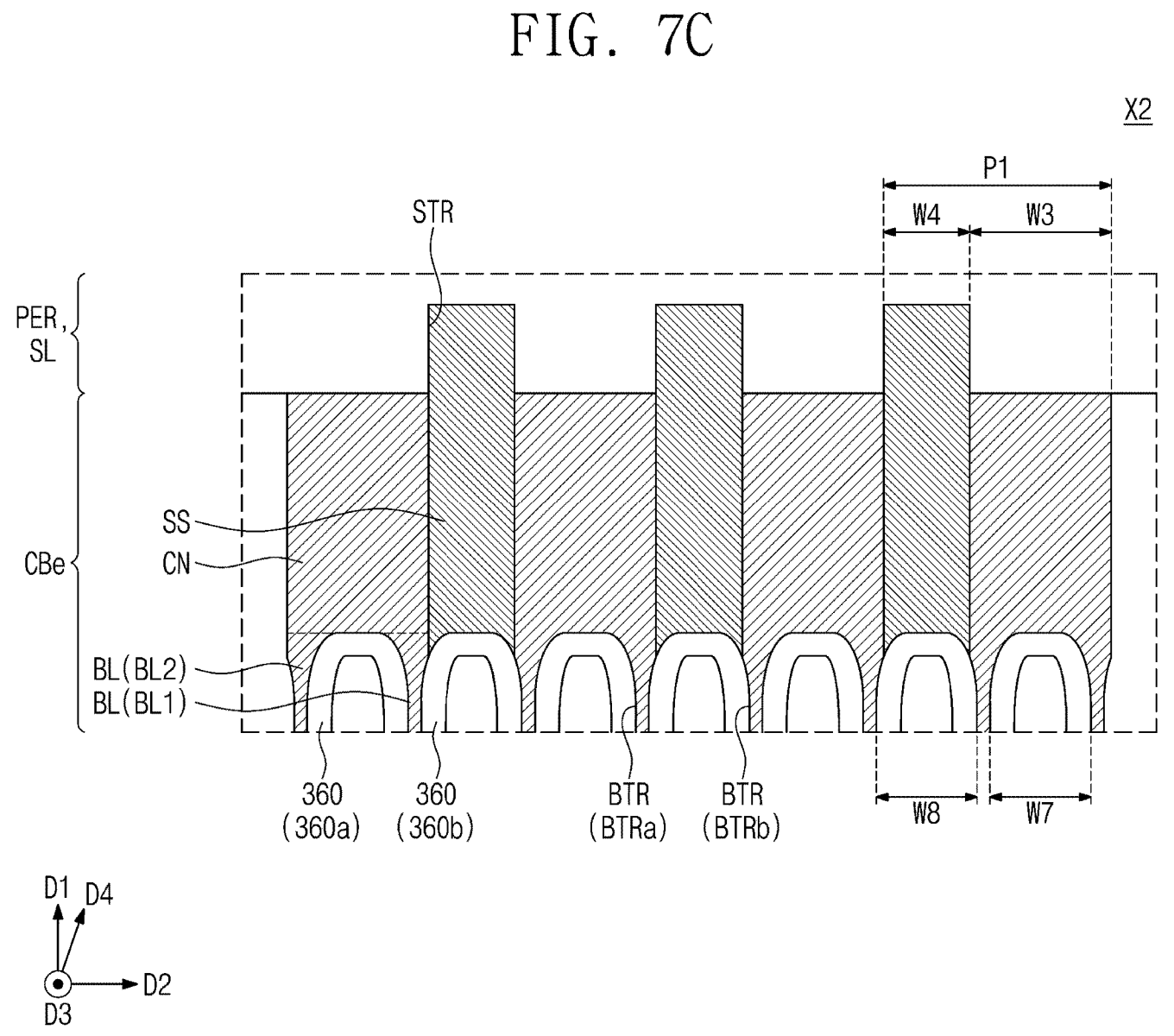

Referring to FIGS. 7A to 7C, a width of the first spacer structure 360*a* in the second direction D2 may be a seventh width W7. A width of the second spacer structure 360*b* in the second direction D2 may be an eighth width W8. The seventh width W7 may be substantially equal to the eighth width W8. Each of the seventh and eighth widths W7 and W8 may be equal to or different from the fourth width W4 of the slit separation pattern SS.

As an example, each of the seventh and eighth widths W7 and W8 may be substantially equal to the fourth width W4 of the slit separation pattern SS, as shown in FIG. 7A. As another example, each of the seventh and eighth widths W7 and W8 may be smaller than the fourth width W4 of the slit separation pattern SS, as shown in FIG. 7B. As still other example, each of the seventh and eighth widths W7 and W8 may be larger than the fourth width W4 of the slit separation pattern SS, as shown in FIG. 7C.

Figure 7D:
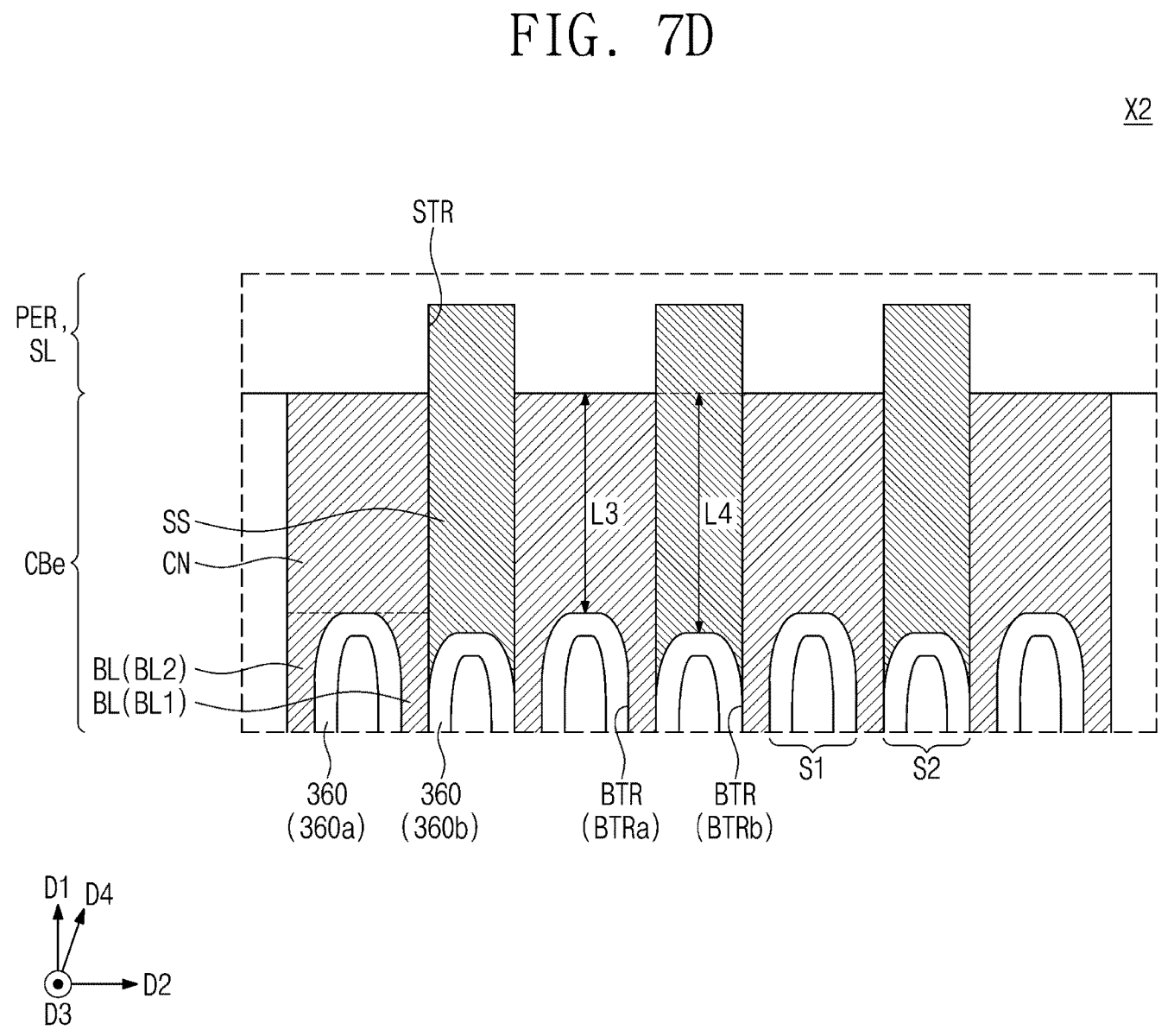
Figure 7E:
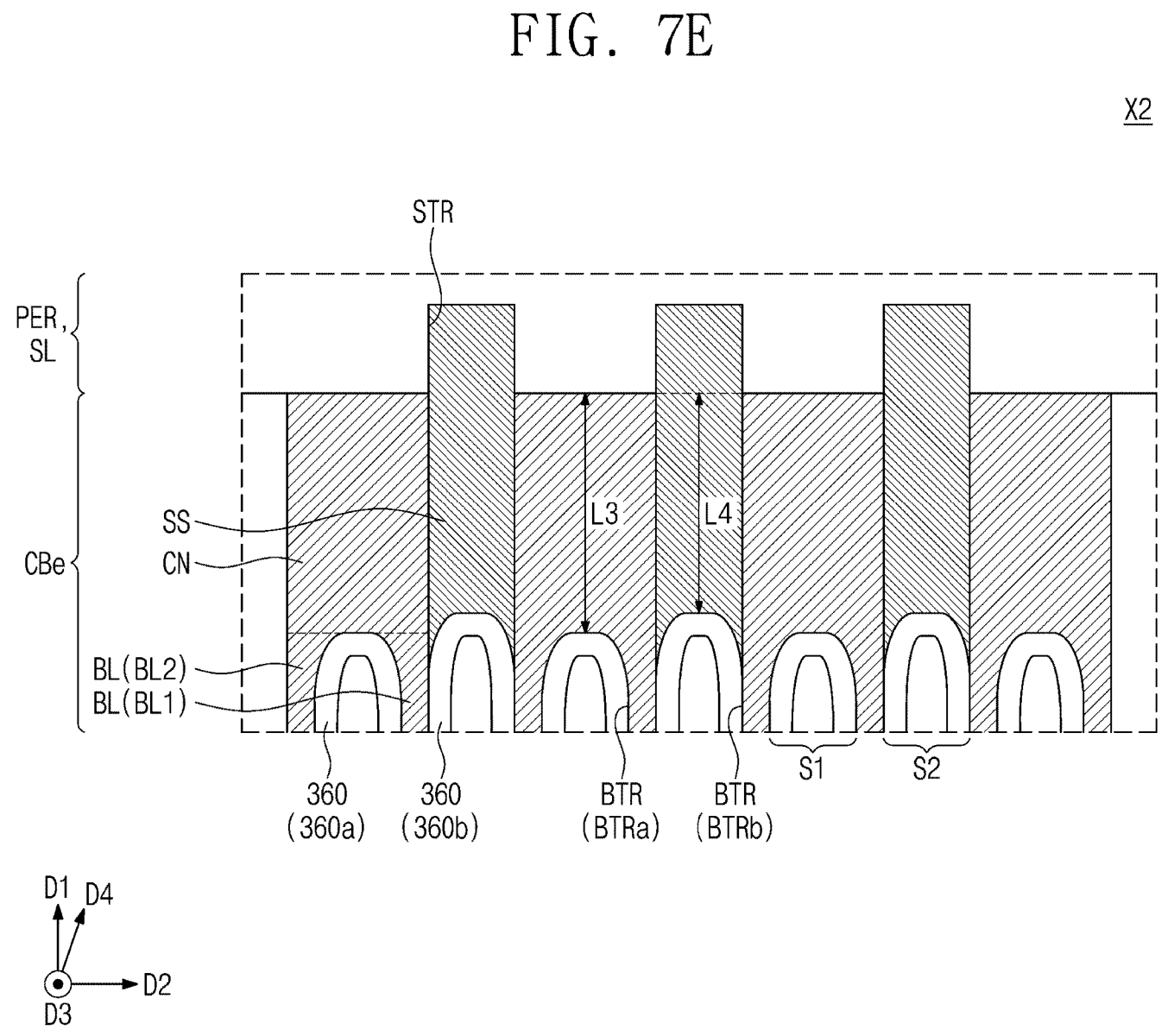

Referring to FIGS. 7A, 7D, and 7E, a distance from the first spacer structure 360*a* to the peripheral region PER or SL may be defined as a third length L3. The third length L3 may be a distance from the spacer structure 360 to the peripheral region PER or SL, in a first section S1, which will be described below. A distance from the second spacer structure 360*b* to the peripheral region PER or SL may be defined as a fourth length LA. The fourth length L4 may be a distance from the spacer structure 360 to the peripheral region PER or SL, in a second section S2, which will be described below. The third length L3 may be equal to or different from the fourth length L4.

As an example, the third length L3 may be substantially equal to the fourth length L4, as shown in FIG. 7A. As another example, the third length L3 may be shorter than the fourth length L4, as shown in FIG. 7D. As still other example, the third length L3 may be longer than the fourth length L4, as shown in FIG. 7E.

Figure 8A:
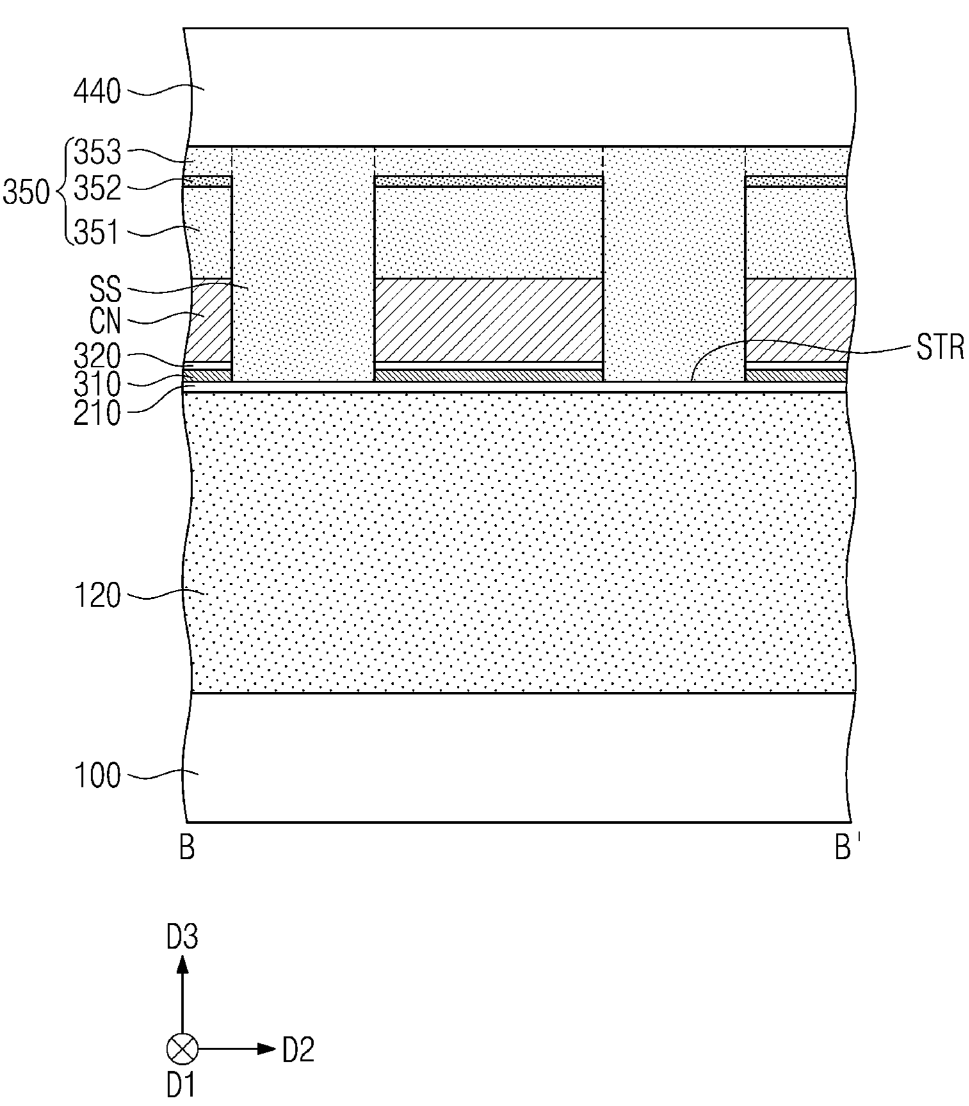
Figure 8B:
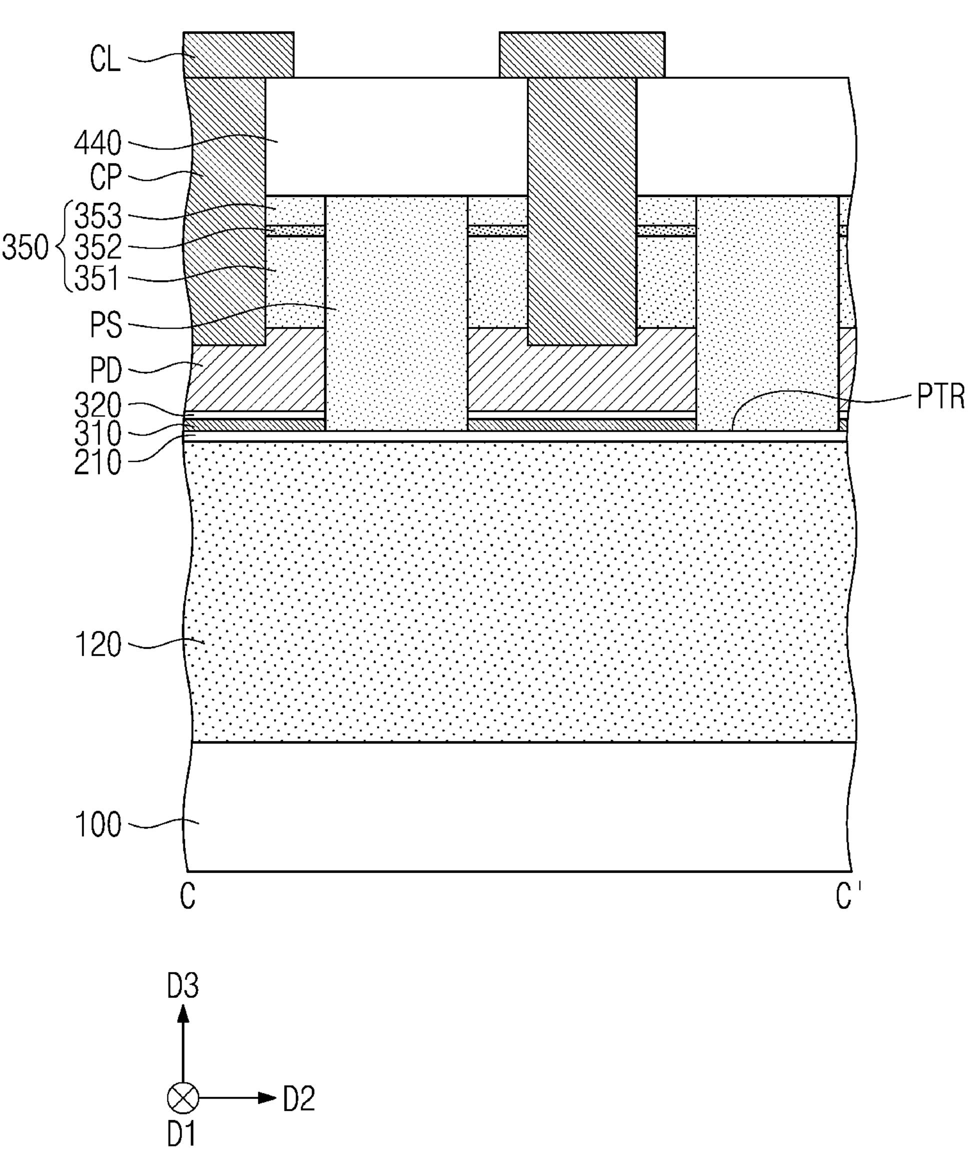
Figure 8C:
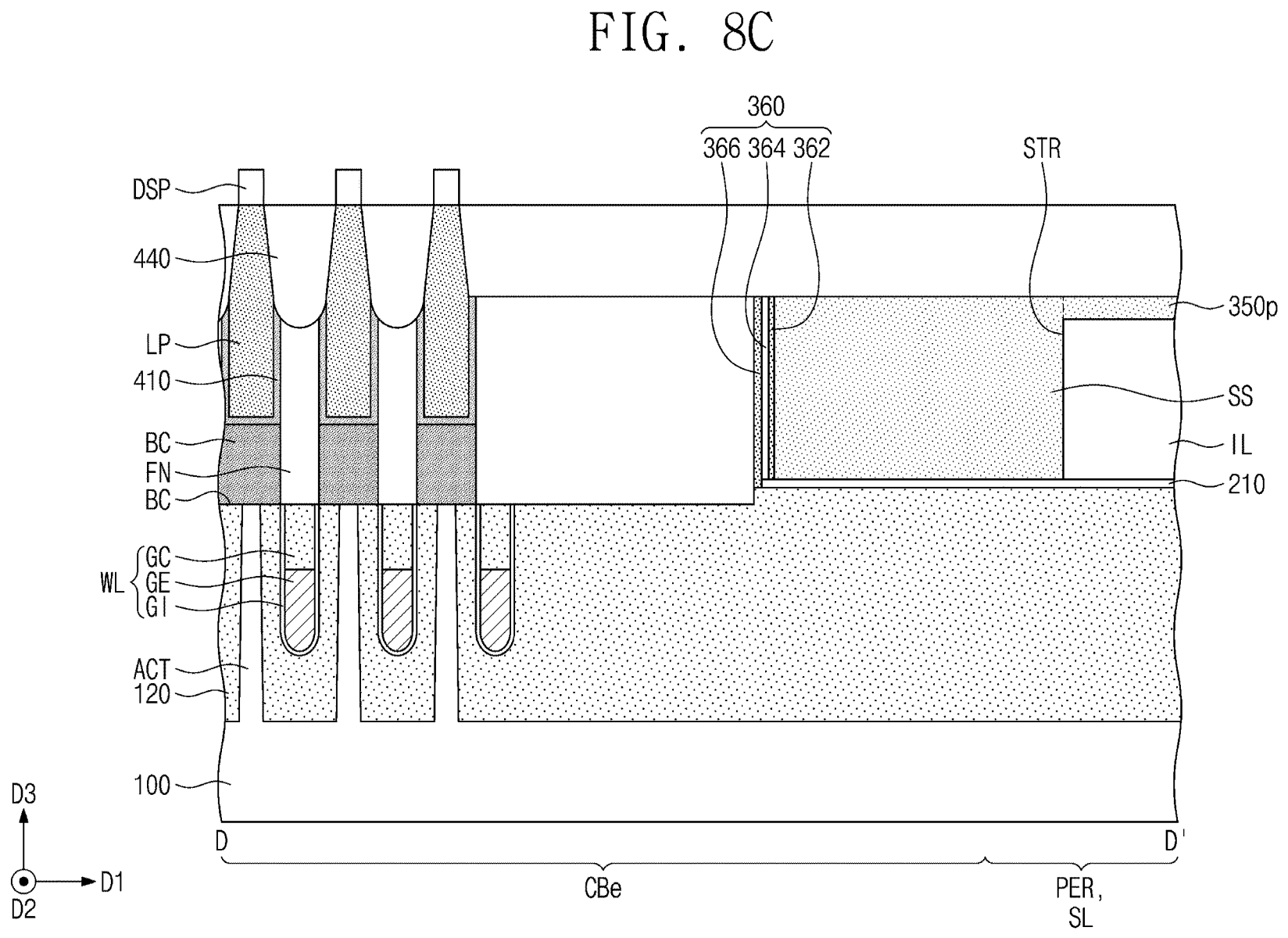
Figure 9:
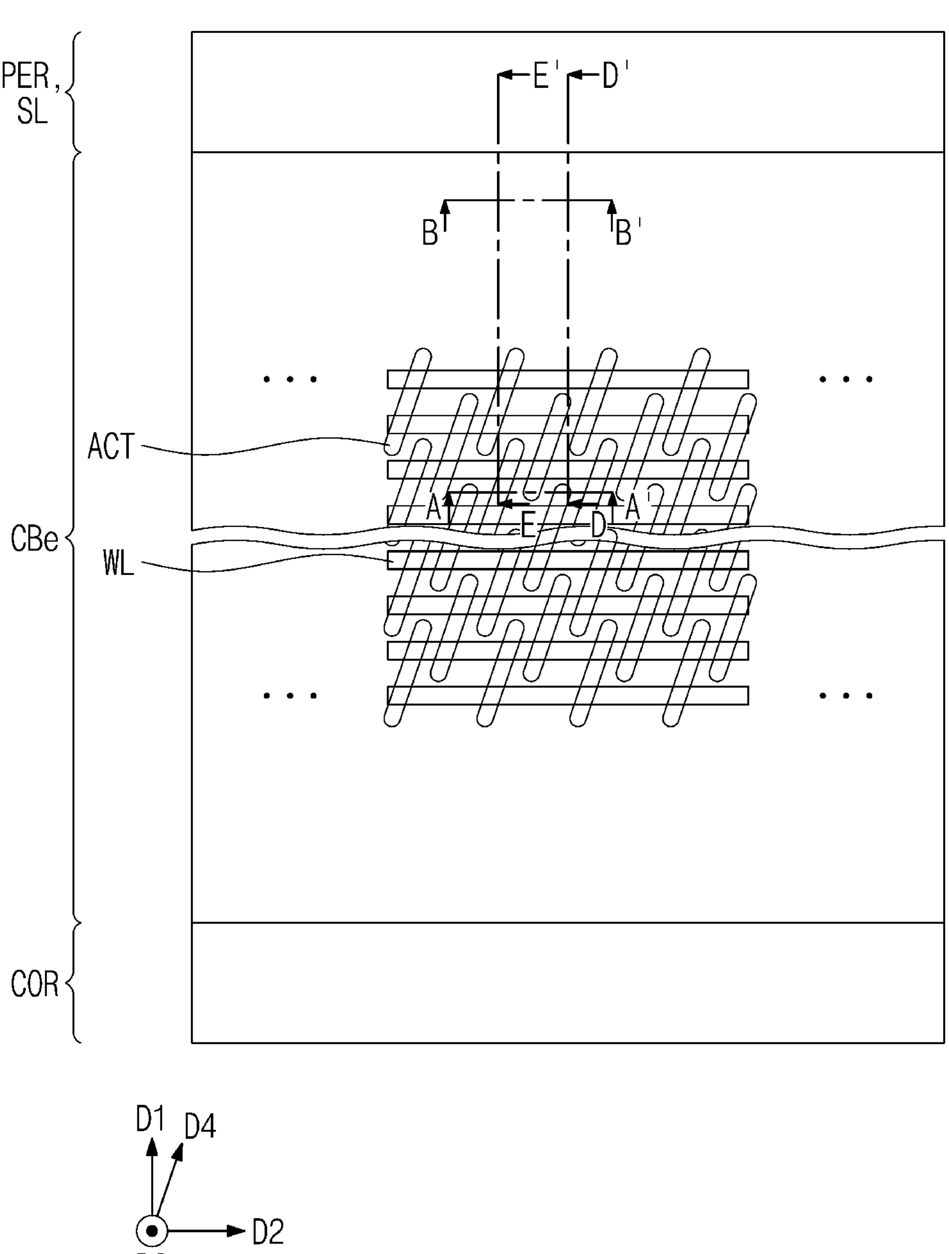
Figure 10A:
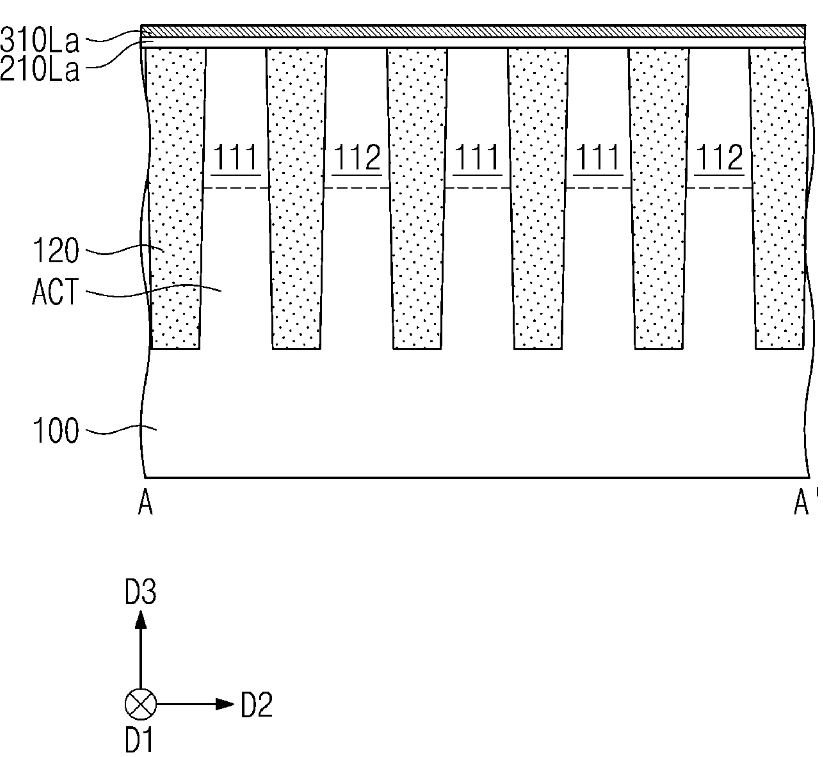
Figure 10B:
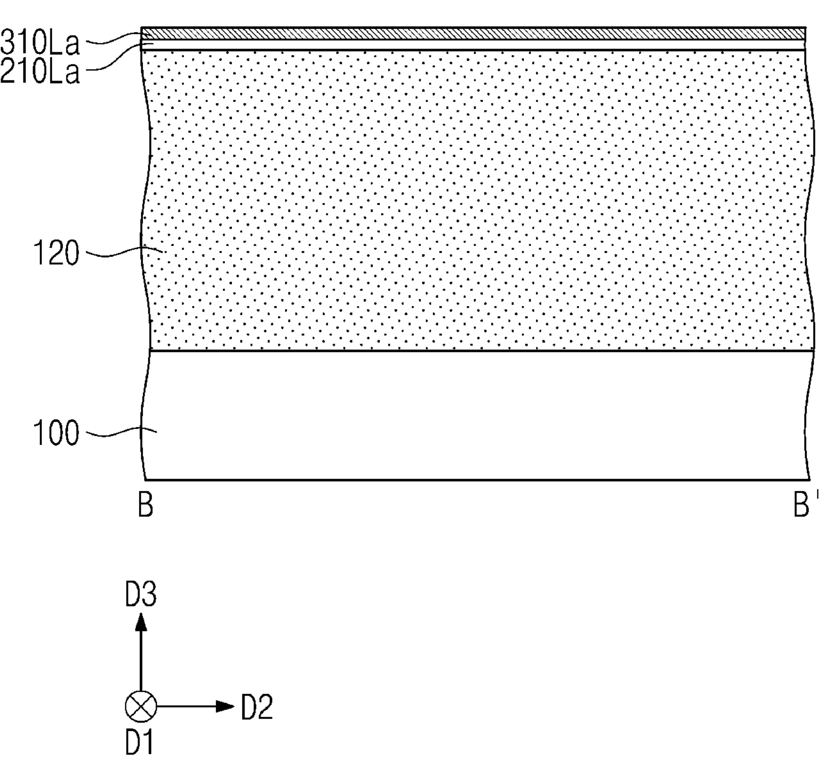
Figure 10C:
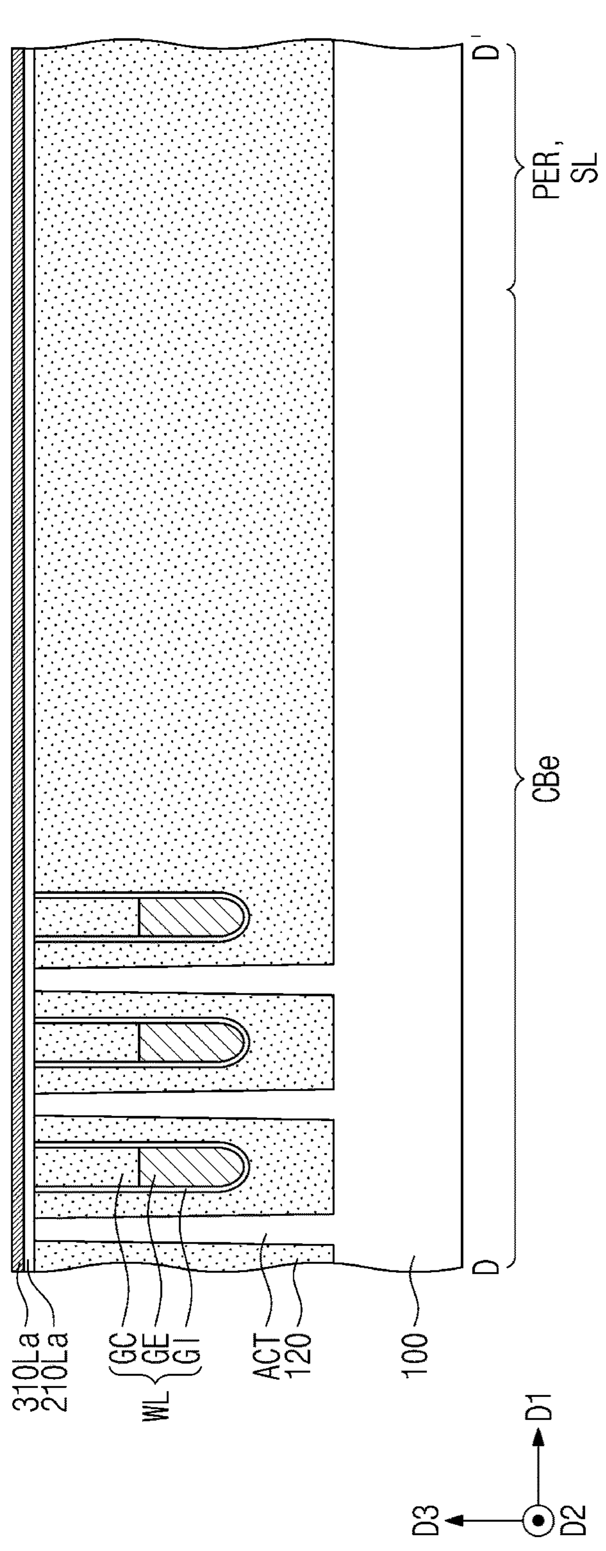
Figure 10D:
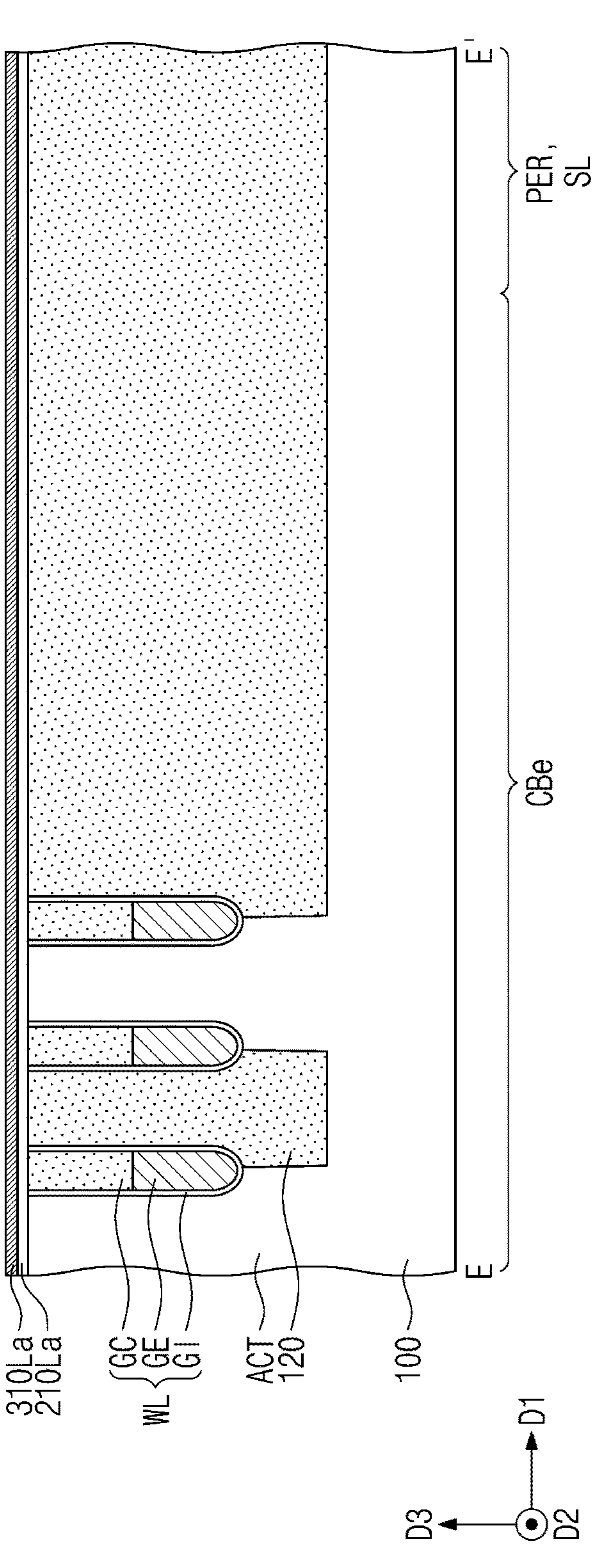
Figure 11:
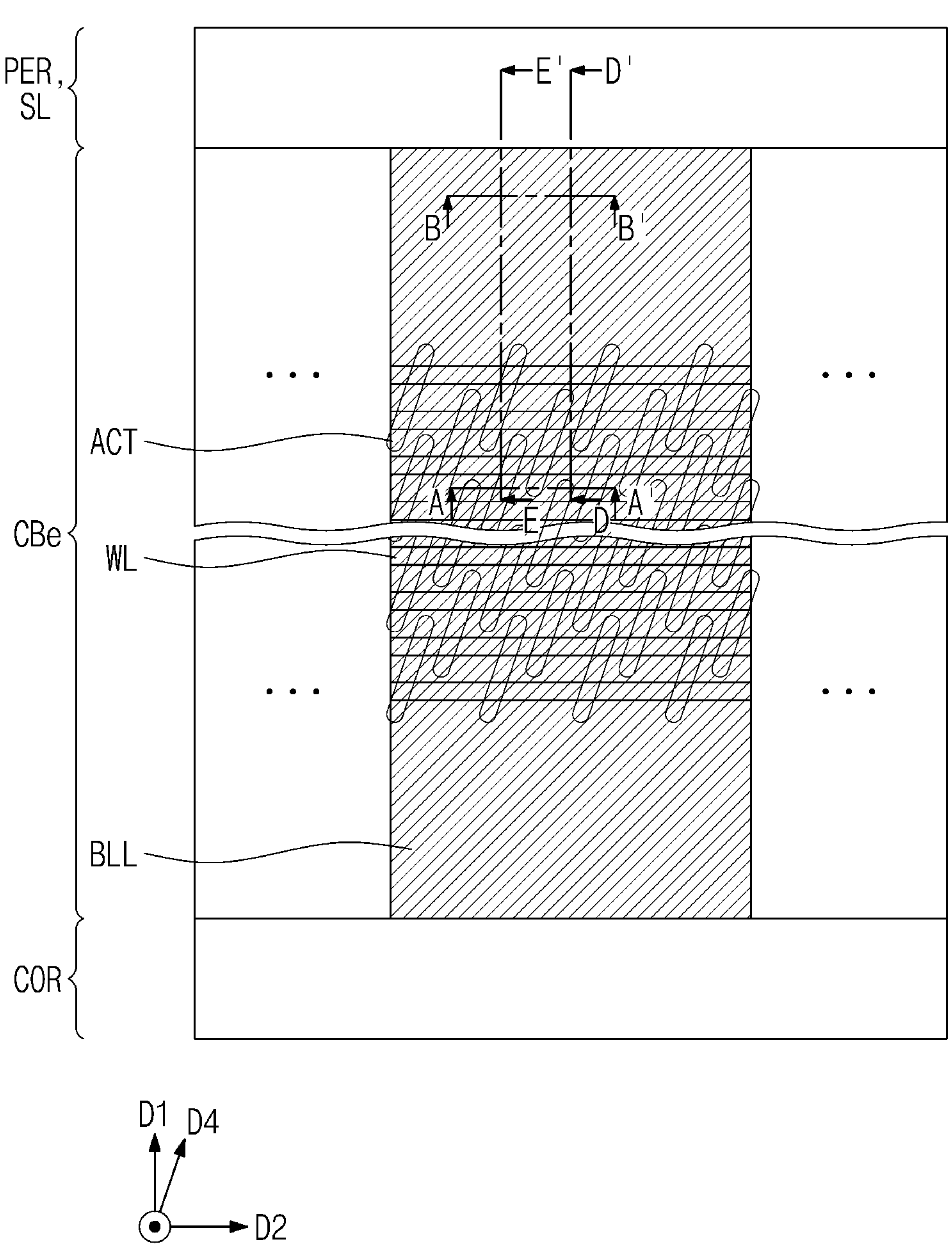
Figure 12A:
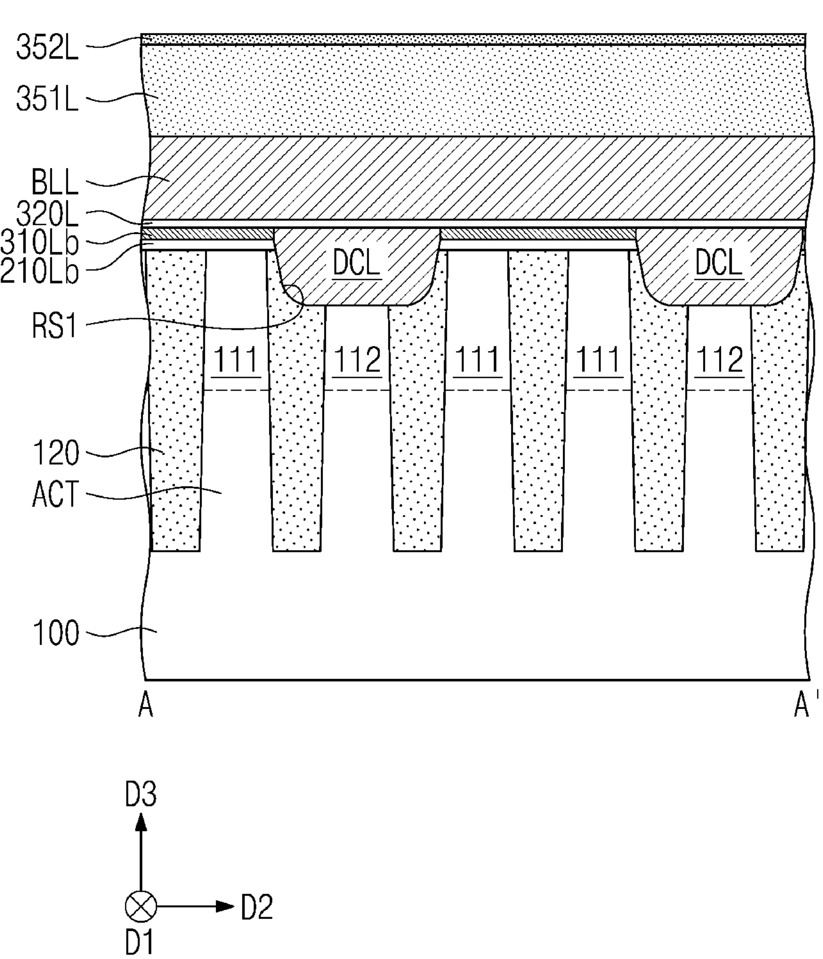
Figure 12B:
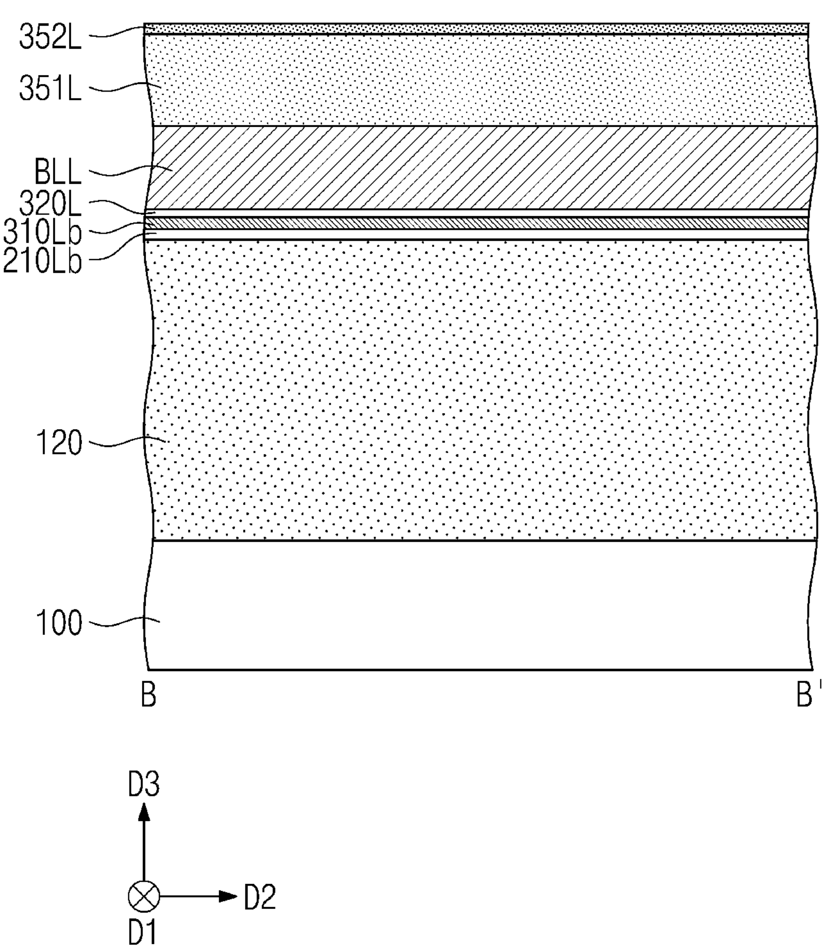
Figure 12C:
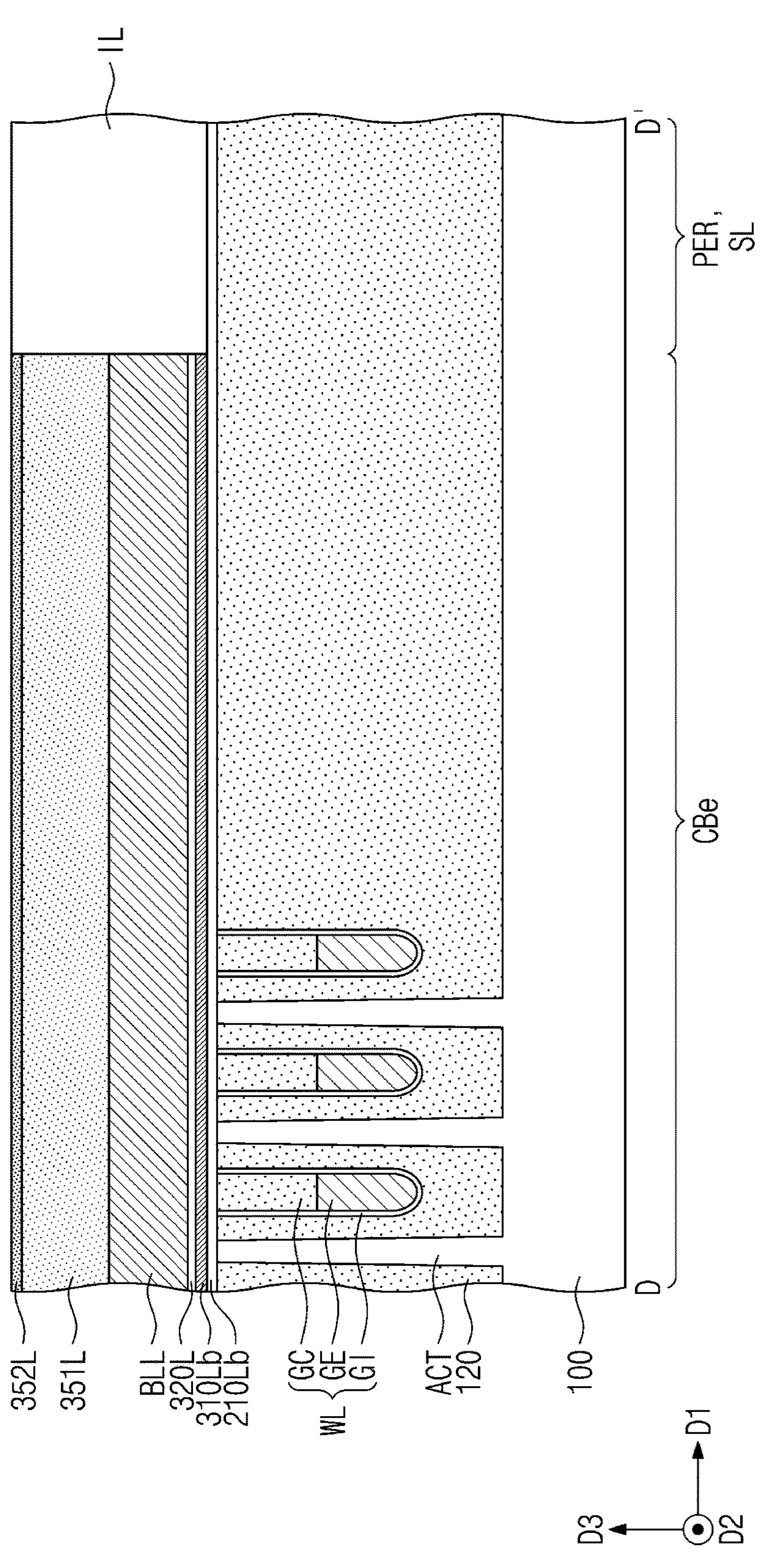
Figure 12D:
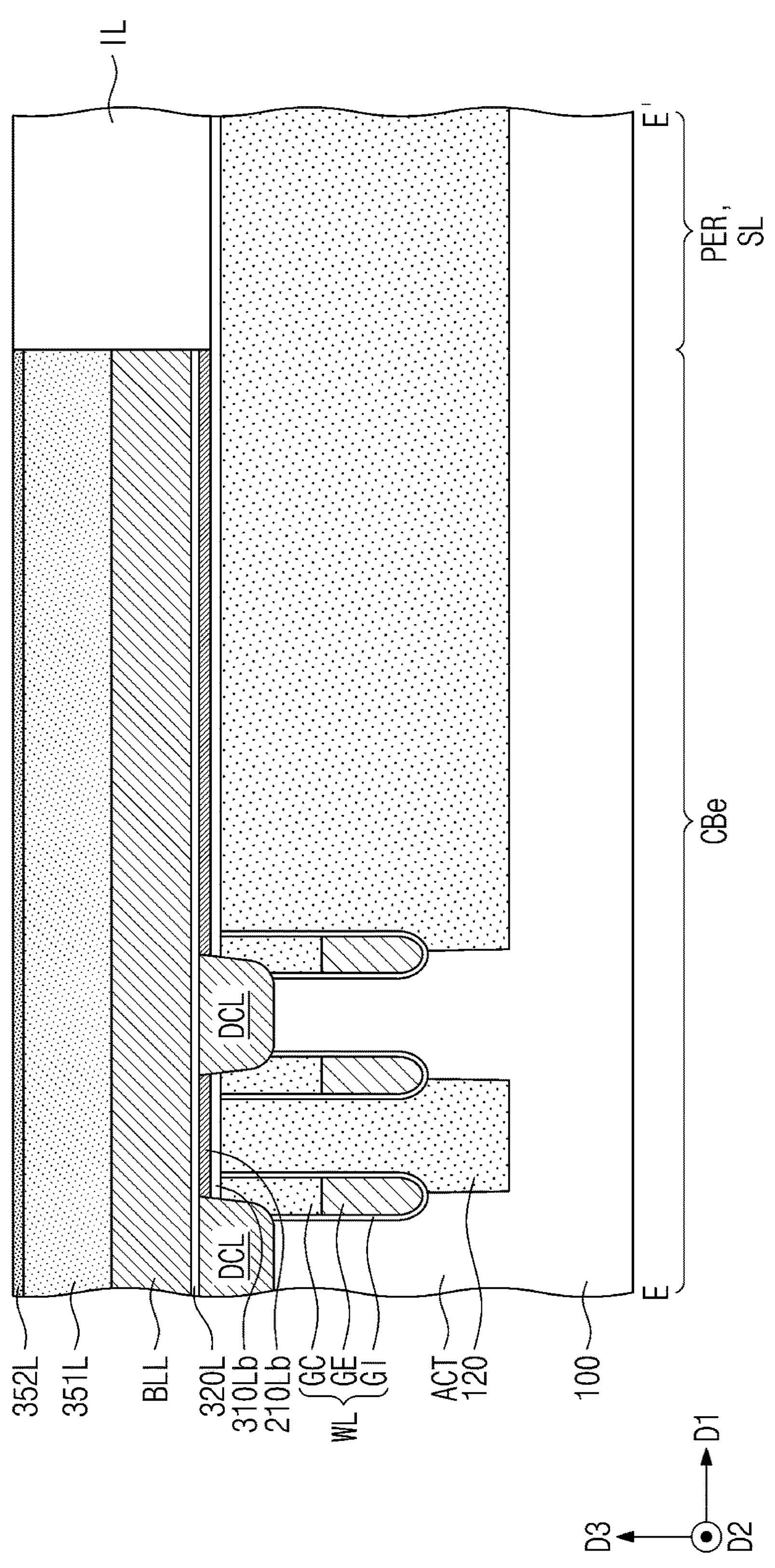
Figure 13:
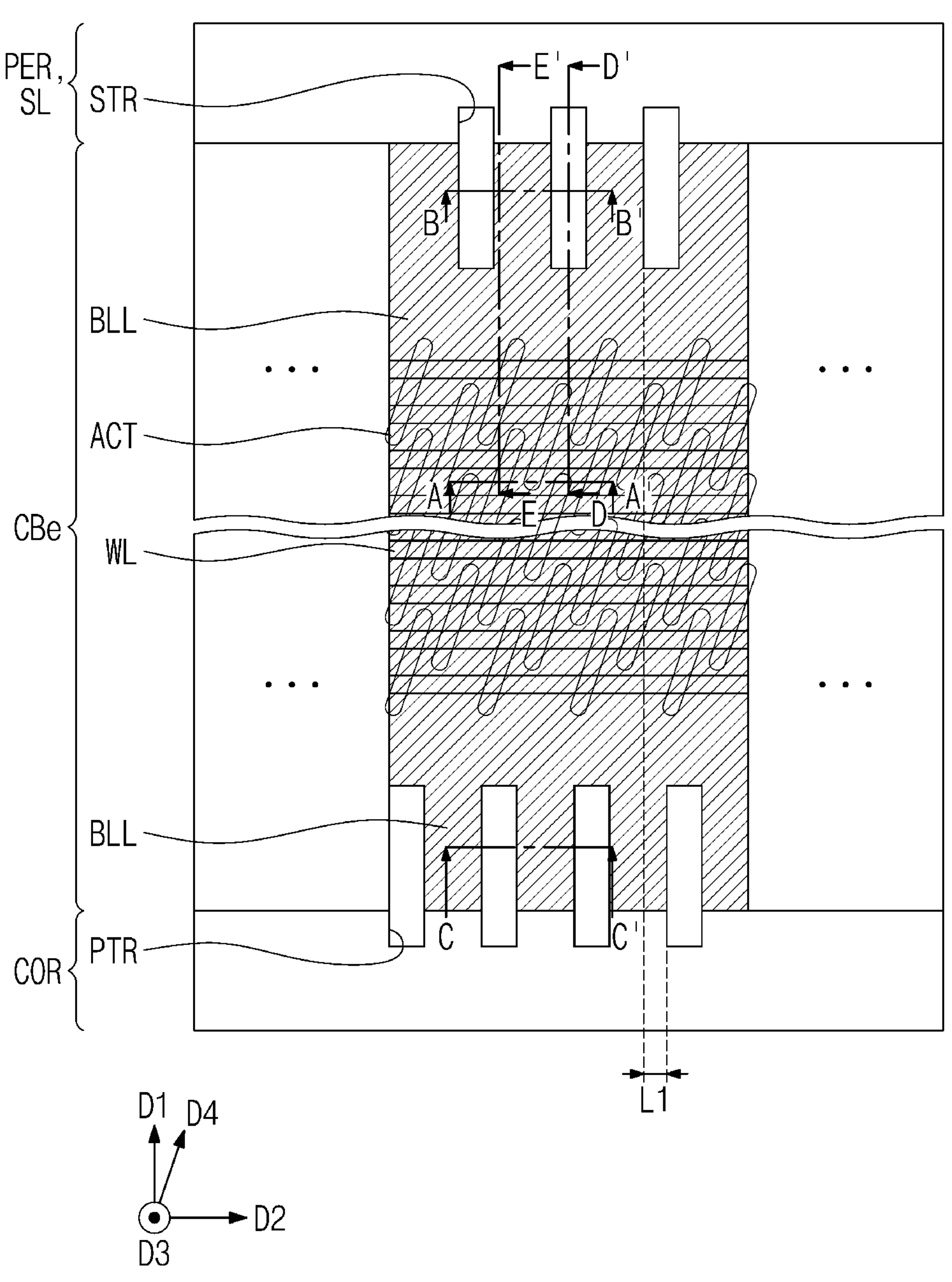
Figure 14A:
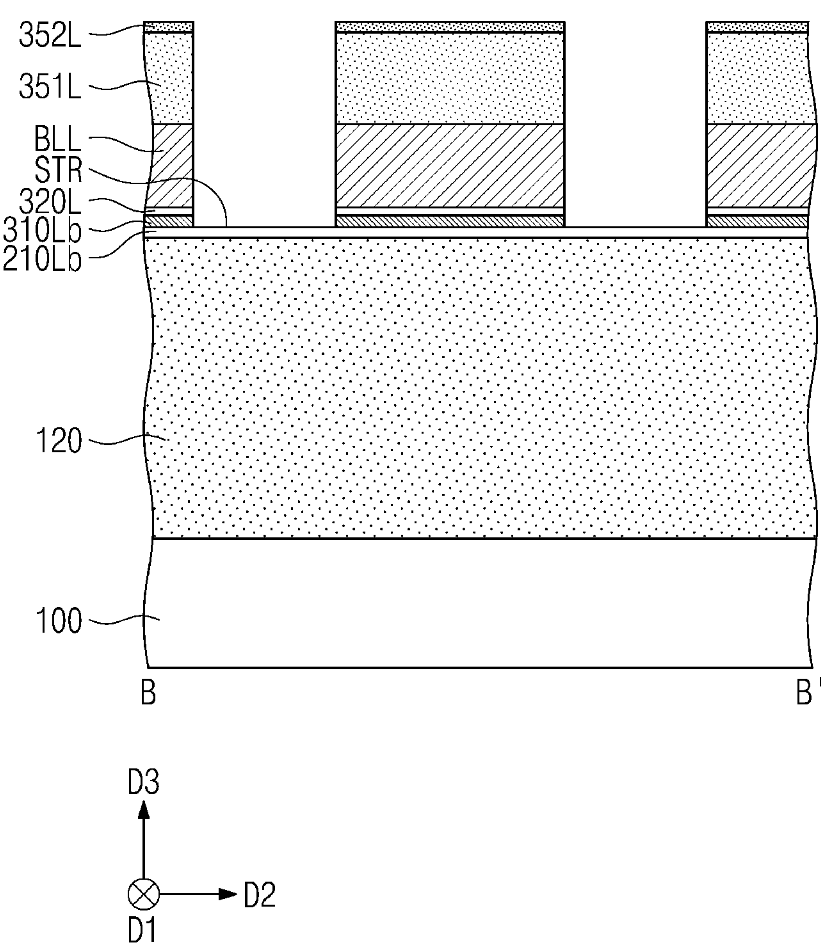
Figure 14B:
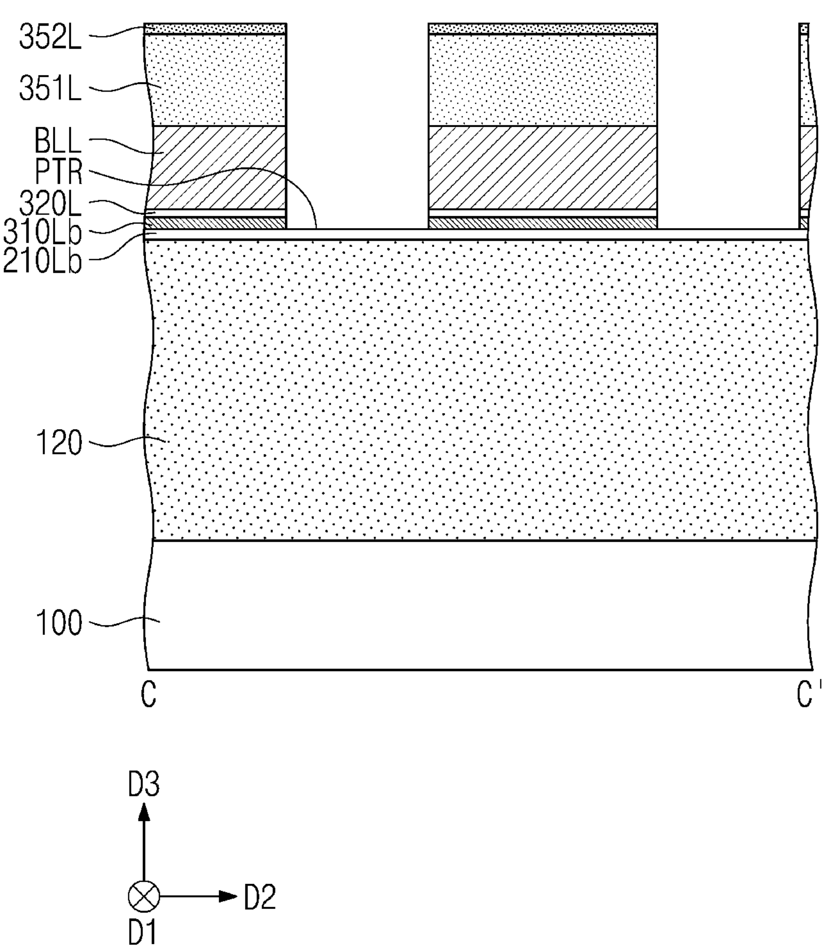
Figure 14C:
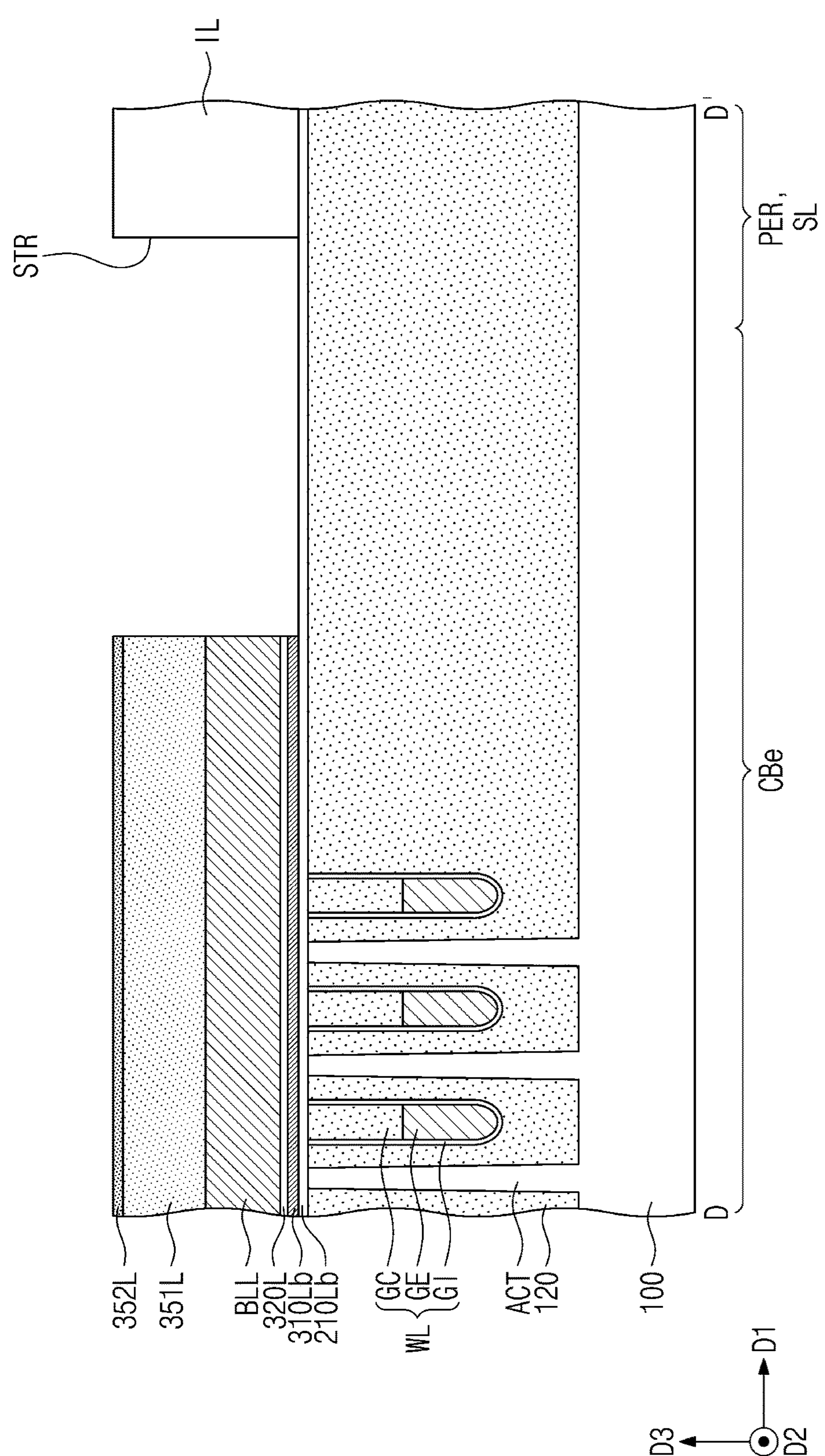
Figure 15:
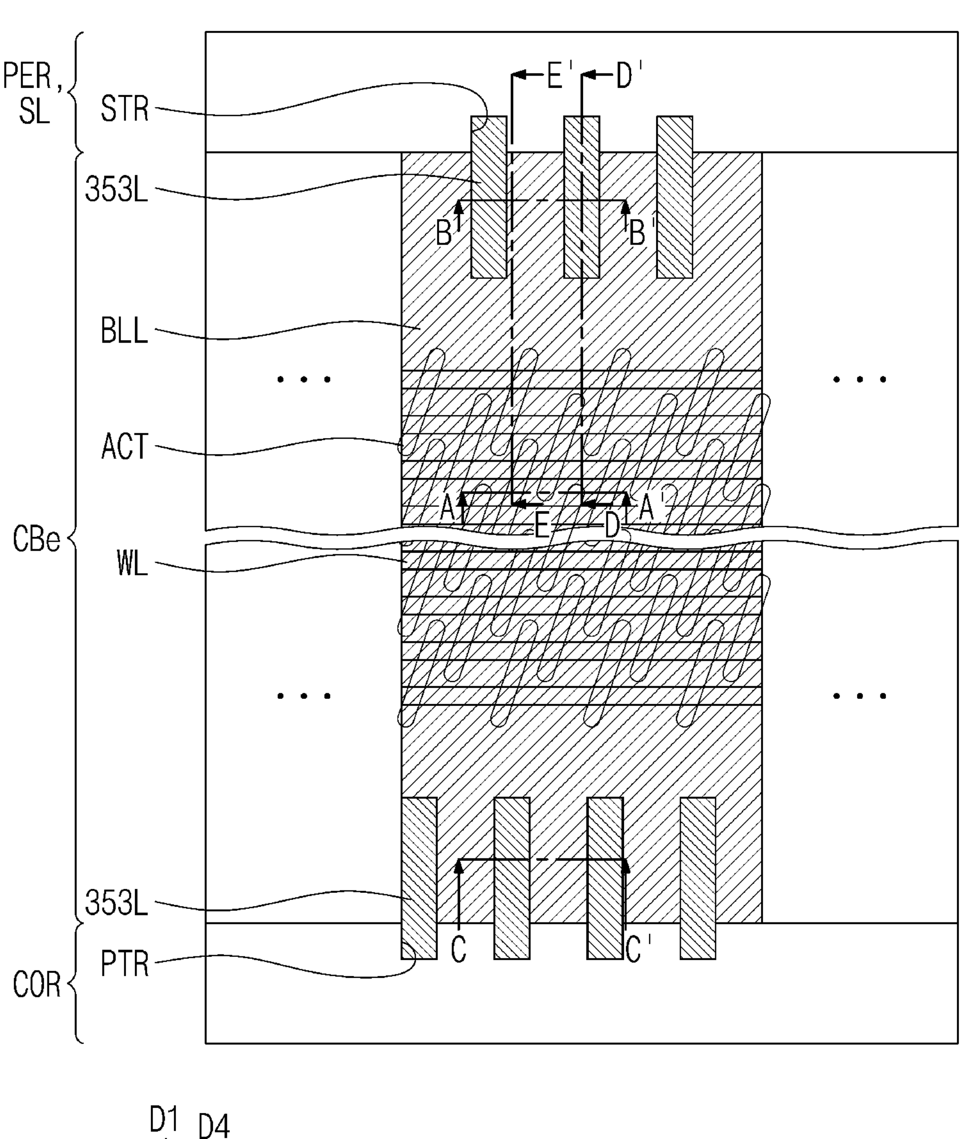
Figure 16A:
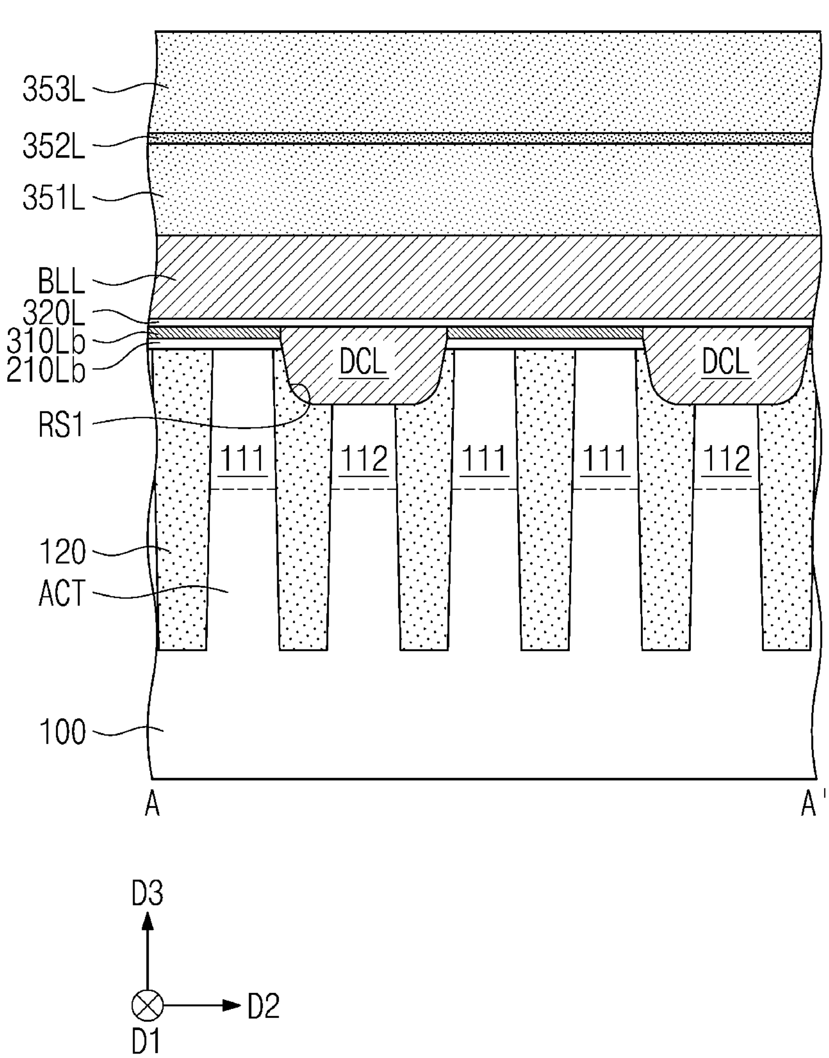
Figure 16B:
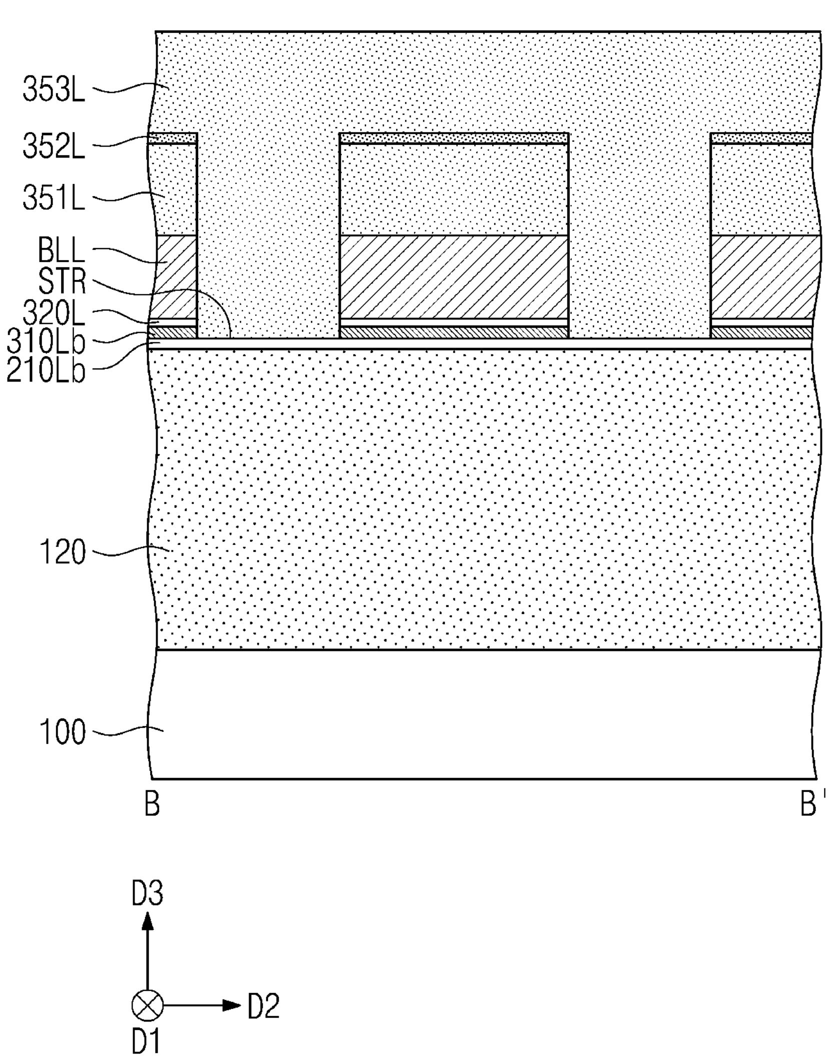
Figure 16C:
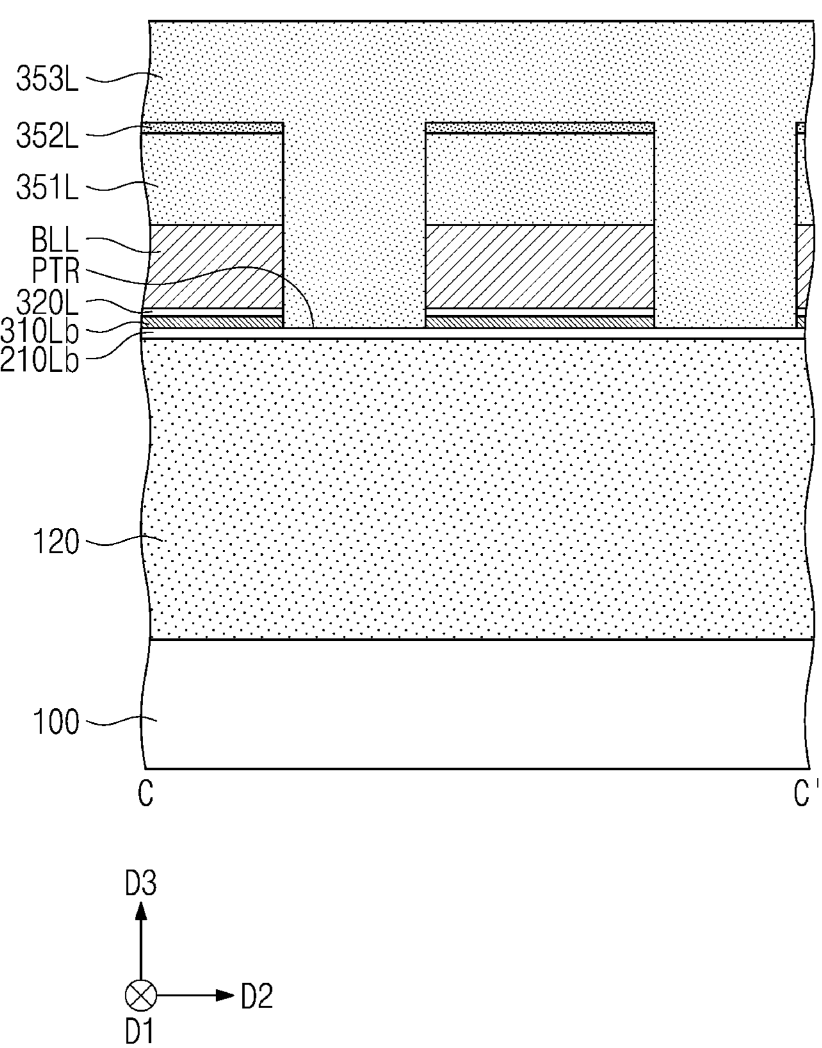
Figure 16D:
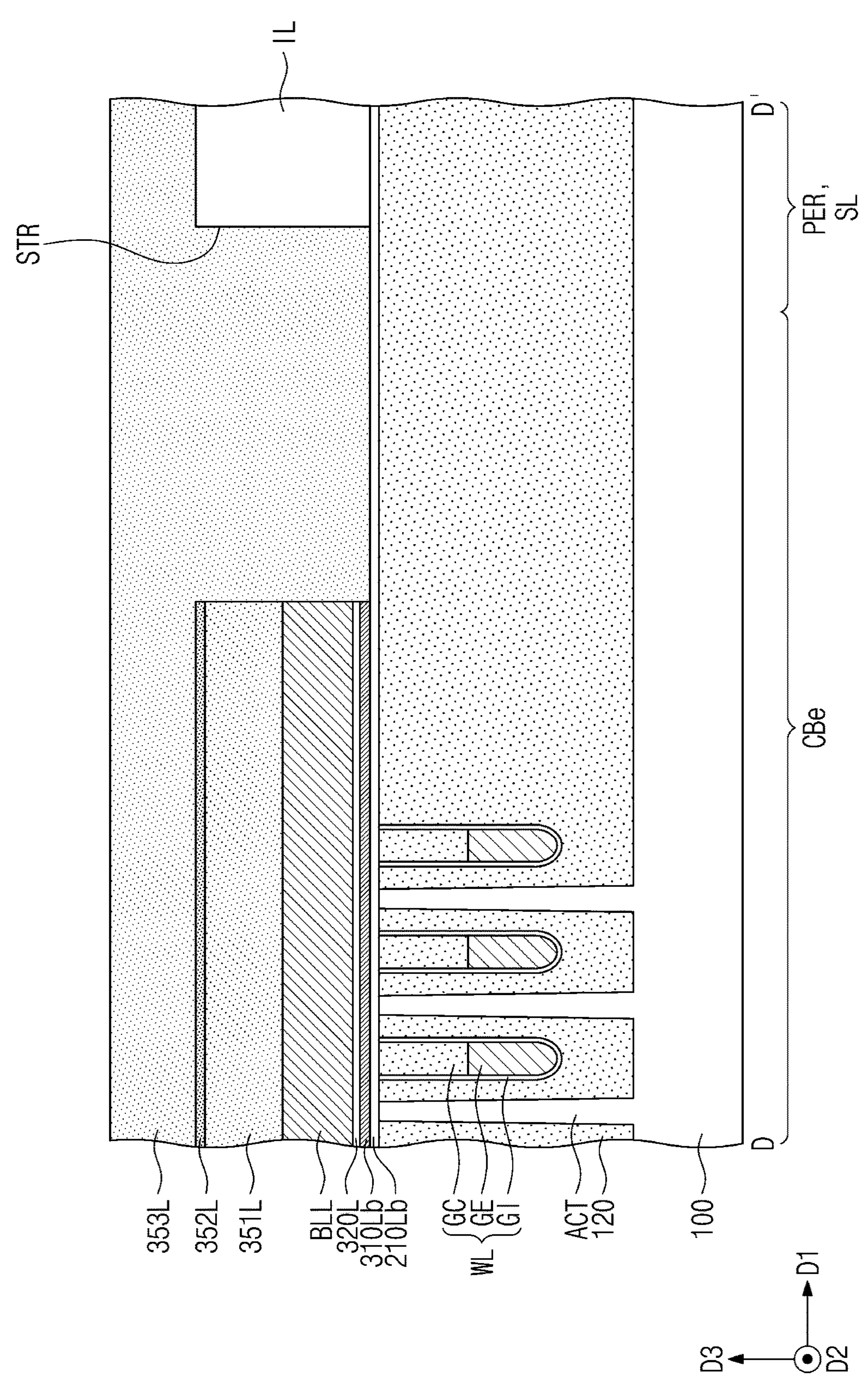
Figure 16E:
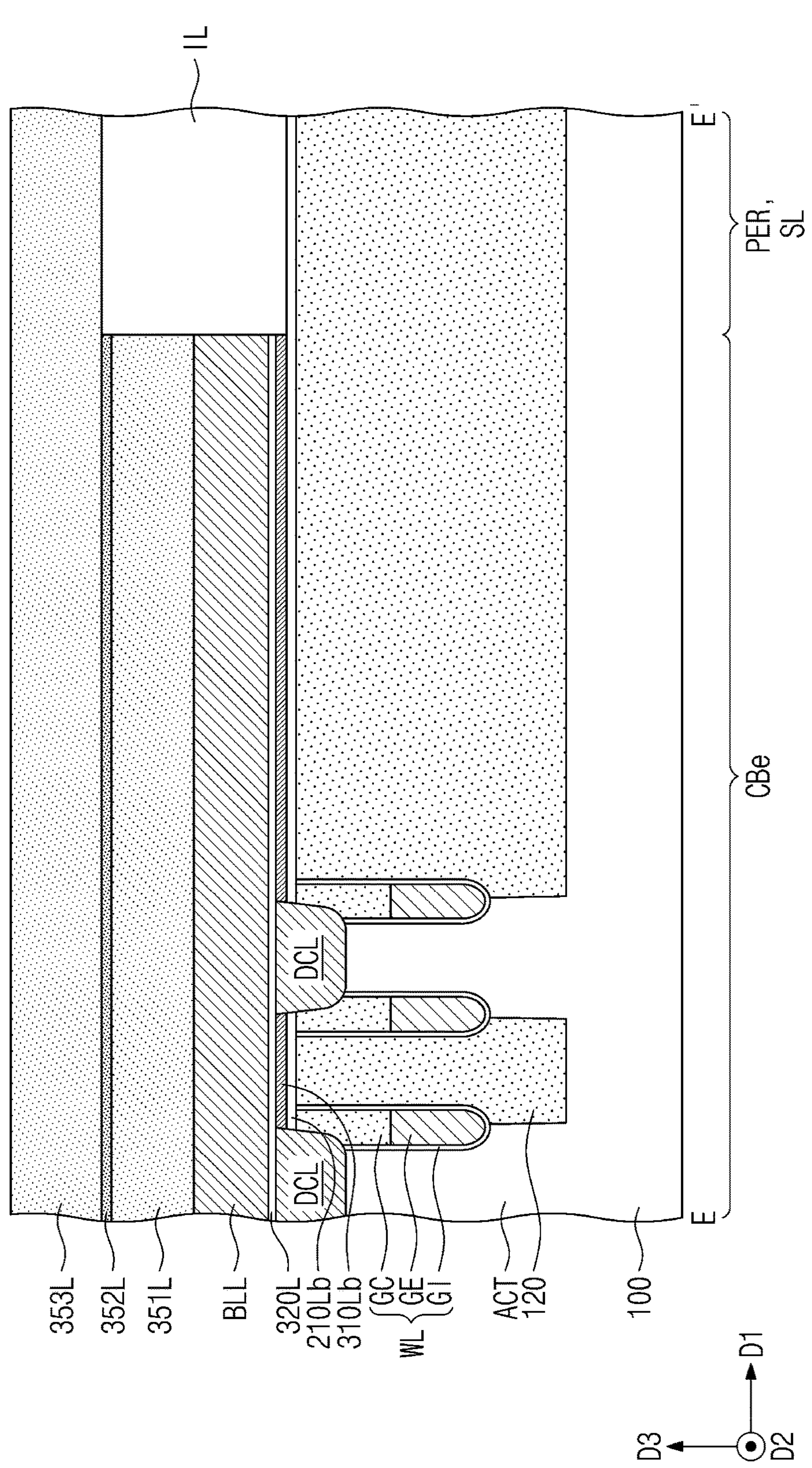
Figure 17:
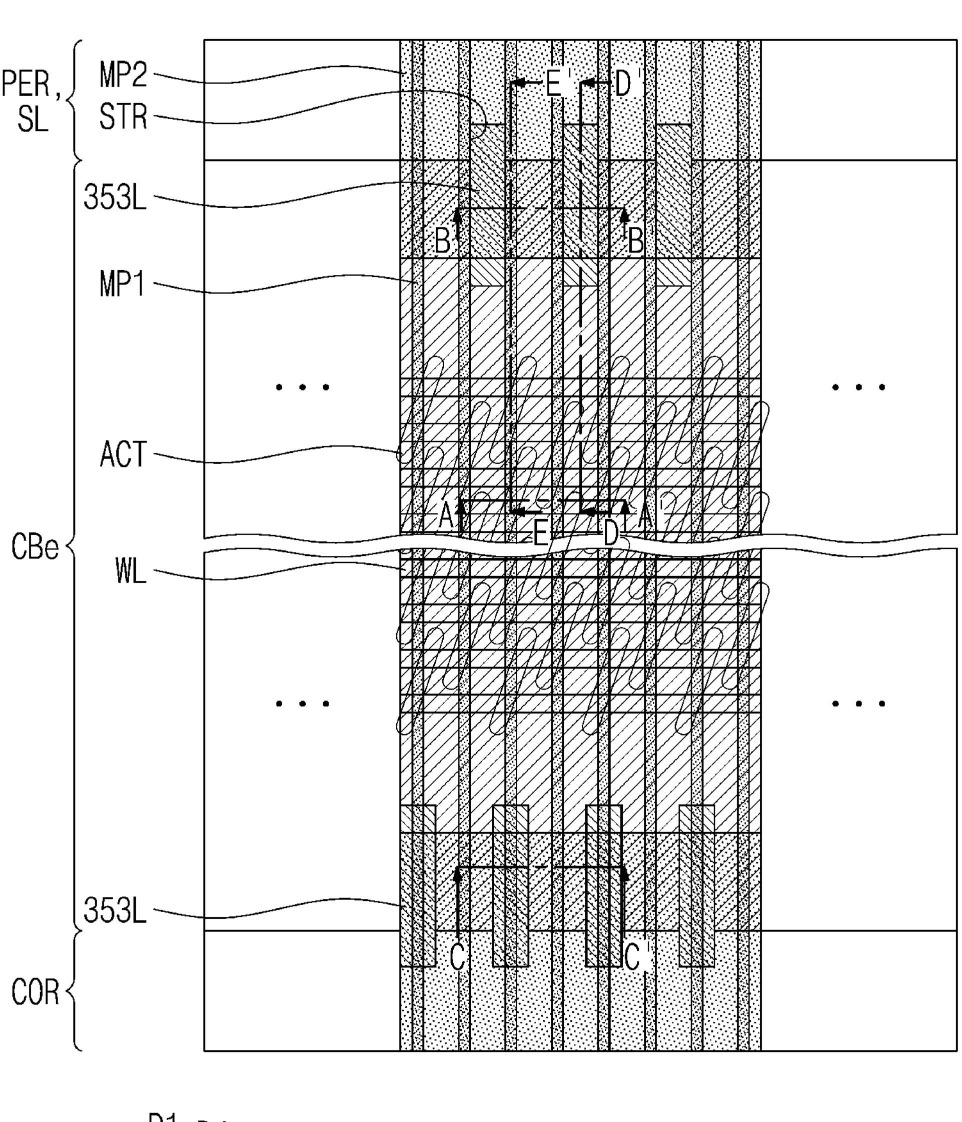
Figure 17:
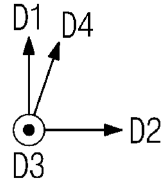
Figure 18A:
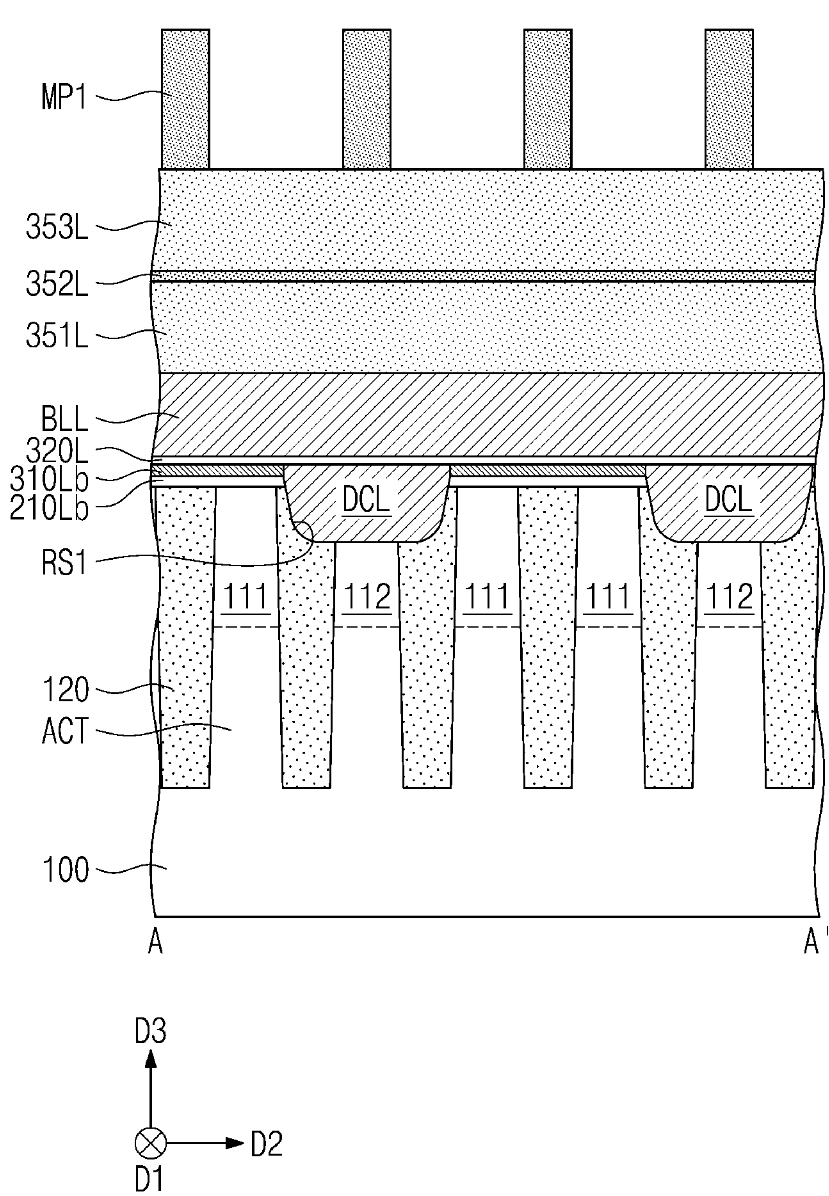
Figure 18B:
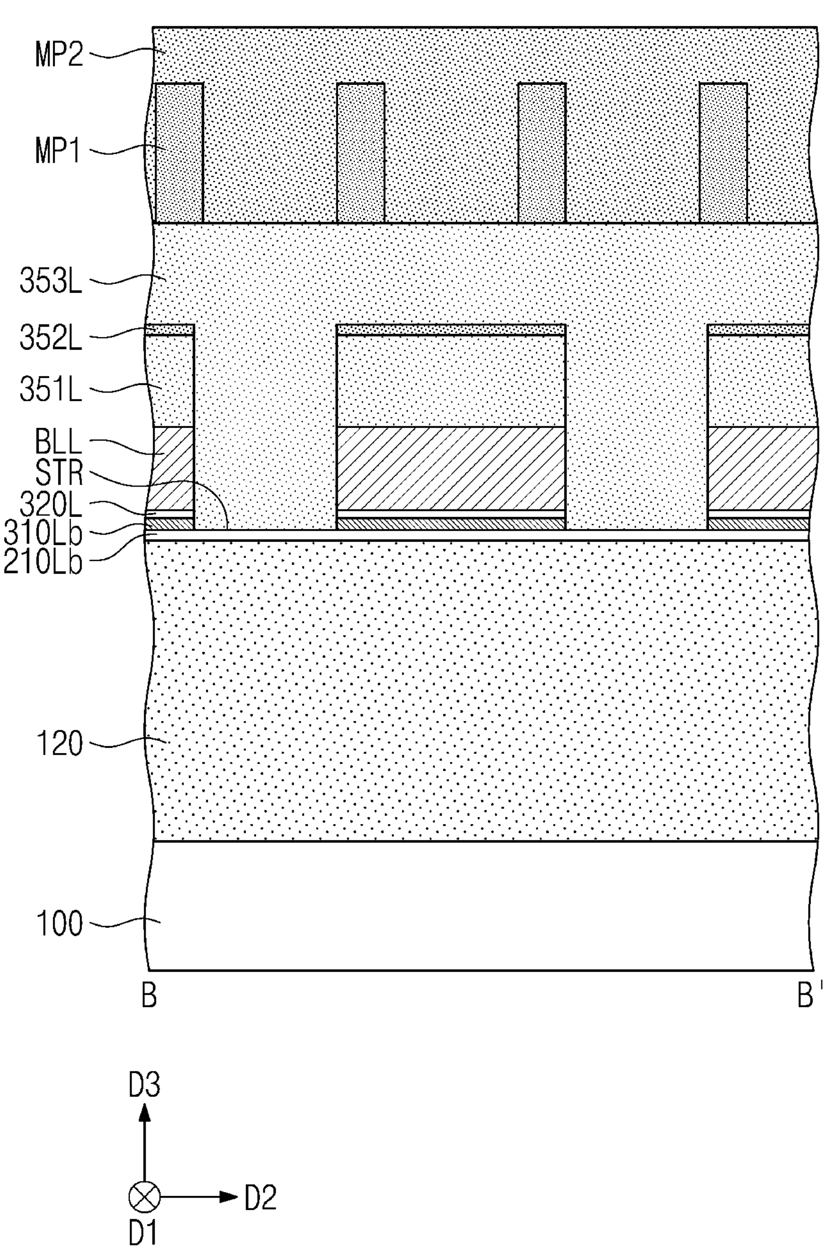
Figure 18C:
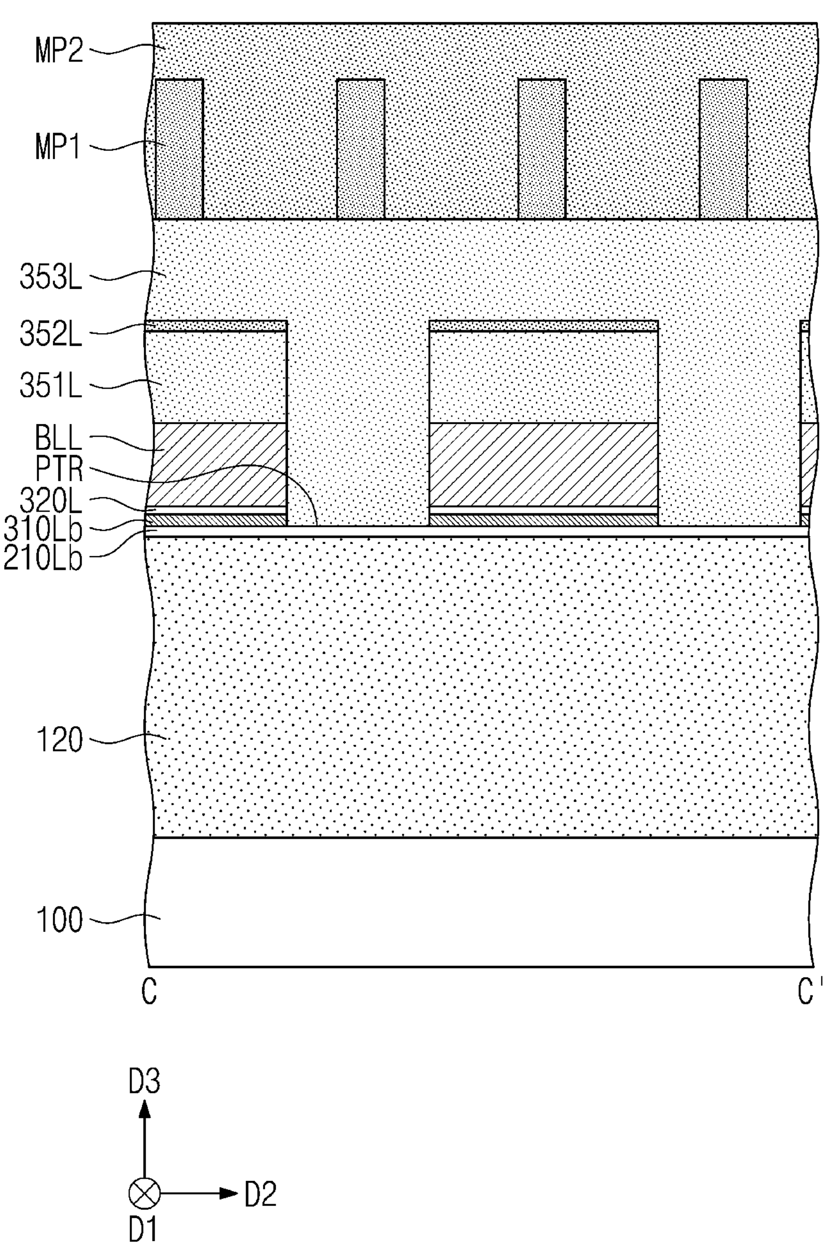
Figure 18D:
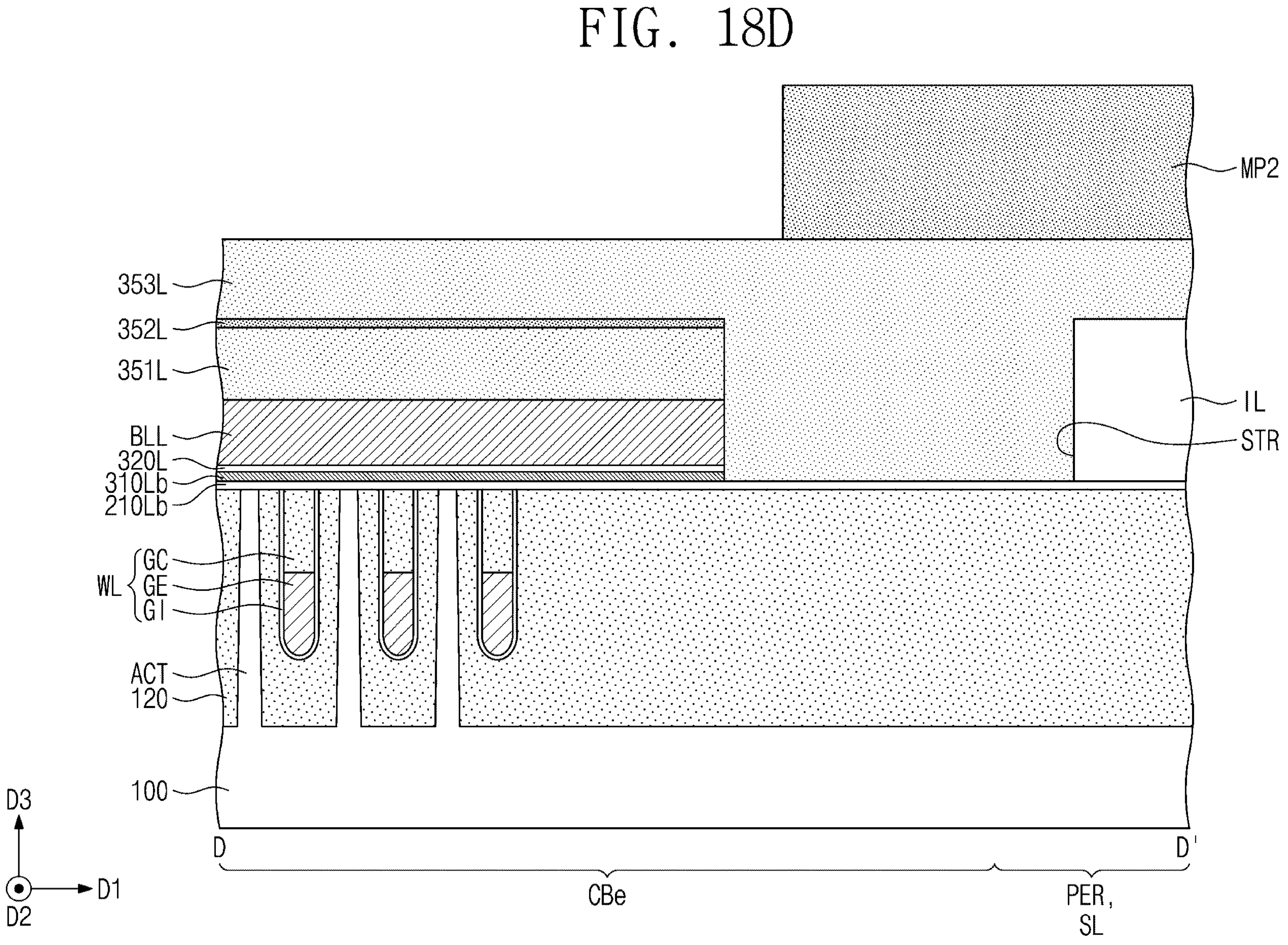
Figure 18E:
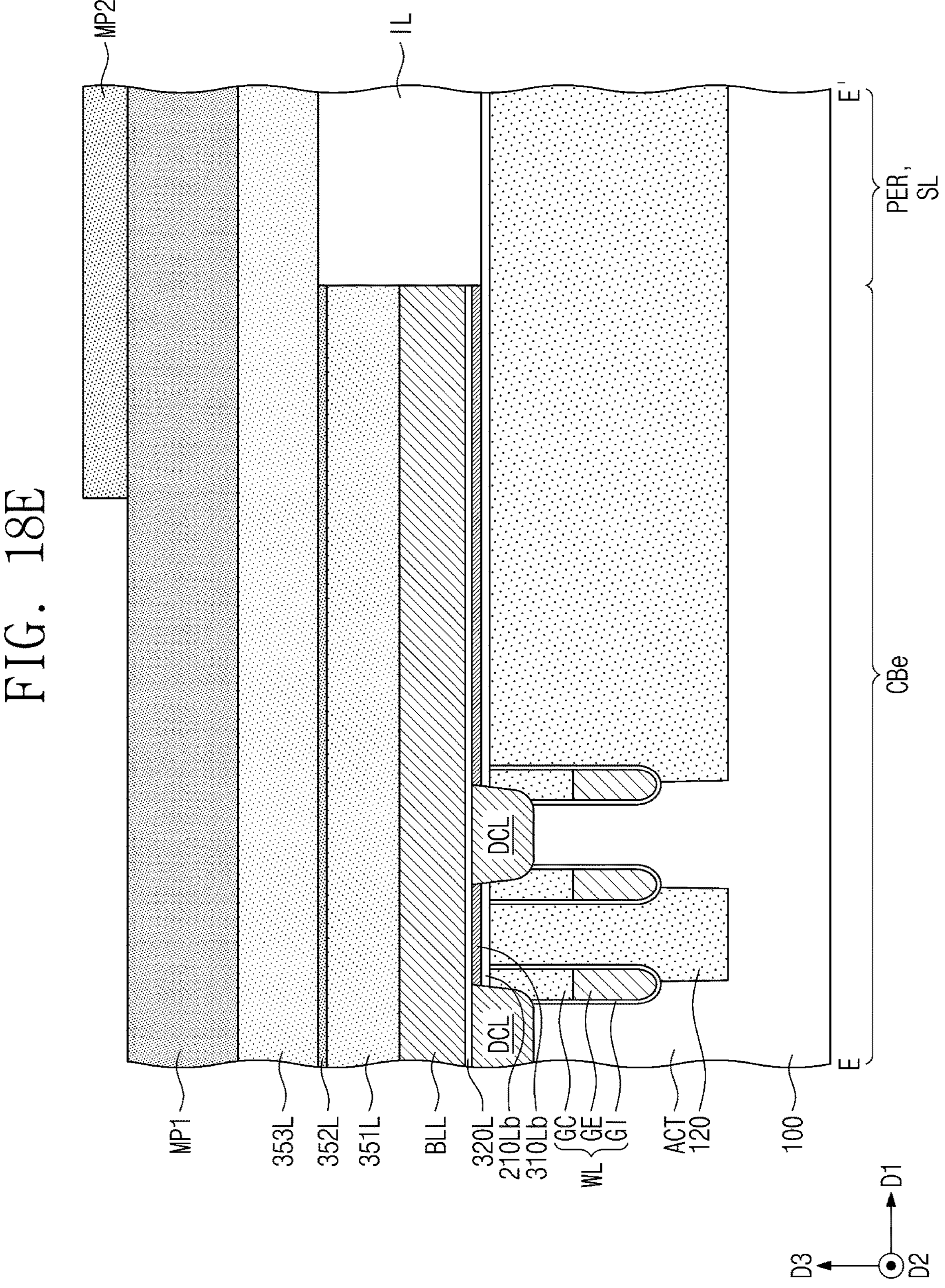

FIGS. 8A to 8C are sectional views, which are respectively taken alone the lines B-B', C-C', and D-D' of FIG. 4A to illustrate a semiconductor device according to some embodiments of the inventive concept.

Referring to FIGS. 8A to 8C, at least one of the first capping pattern 351, the second capping pattern 352, and the third capping pattern 353 may be provided on the bit line connector CN. As an example, the first capping pattern 351, the second capping pattern 352, and the third capping pattern 353 may be provided on the bit line connector CN, as shown in FIG. 8A. The slit separation pattern SS may be interposed between the bit line connectors CN and between the bit line capping patterns 350. As an example, the slit separation pattern SS and the third capping pattern 353 may be connected to each other, without any interface (e.g., a visible interface) therebetween. Here, the slit separation pattern SS and the third capping pattern 353 may be distinguished based on whether they are vertically overlapped with the bit line connector CN.

At least one of the first, second, and third capping patterns 351, 352 and 353 may be provided on the bit line pad PD. As an example, the first, second, and third capping patterns 351, 352 and 353 may be provided on the bit line pad PD, as shown in FIG. 8B. The pad separation pattern PS may be interposed between the bit line pads PD and between the bit line capping patterns 350. The pad separation pattern PS and the third capping pattern 353 may be connected to each other without any interface (e.g., a visible interface) therebetween. The pad separation pattern PS and the third capping pattern 353 may be distinguished based on whether they are vertically overlapped with the bit line pad PD.

A peripheral capping pattern 350*p* may be provided on the interlayer insulating layer IL. As an example, the peripheral capping pattern 350*p* may be connected to the slit separation pattern SS without any interface (e.g., a visible interface) therebetween. As another example, the peripheral capping pattern 350*p* may be connected to at least one of the first, second, and third capping patterns 351, 352 and 353 without any interface (e.g., a visible interface) therebetween. The peripheral capping pattern 350*p* may be formed of or include the same material as at least one of the slit separation pattern SS, the first, second, and third capping patterns 351, 352 and 353.

FIGS. 9, 10A, 10B, 10C, 10D, 11, 12A, 12B, 12C, 12D, 13, 14A, 14B, 14C, 15, 16A, 16B, 16C, 16D, 16E, 17, 18A, 18B, 18C, 18D, 18E, 19, 20A, 20B, 20C, 20D and 20E are diagrams illustrating a method of fabricating a semiconductor device, according to some embodiments of the inventive concept. In detail, FIGS. 9, 11, 13, 15, 17, and 19 are plan views illustrating a method of fabricating a semiconductor device, according to some embodiments of the inventive concept. FIGS. 10A, 12A, 16A, 18A, and 20A are sectional views taken along lines A-A' of FIGS. 9, 11, 15, 17, and 19, respectively. FIGS. 10B, 12B, 14A, 16B, 18B, and 20B are sectional views taken along lines B-B' of FIGS. 9, 11, 13, 15, 17, and 19, respectively. FIGS. 14B, 16C, 18C, and 20C are sectional views taken along lines C-C' of FIGS. 13, 15, 17, and 19, respectively. FIGS. 10C, 12C, 14C, 16D, 18D, and 20D are sectional views taken along lines D-D' of FIGS. 9, 11, 13, 15, 17, and 19, respectively. FIGS. 10D, 12D, 16E, 18E, and 20E are sectional views taken along lines E-E' of FIGS. 9, 11, 15, 17, and 19, respectively.

Hereinafter, a method of fabricating a semiconductor device will be described in more detail with reference to FIGS. 9 to 20E. For concise description, a previously described element may be identified by the same reference number without repeating an overlapping description thereof.

Referring to FIGS. 9 and 10A to 10D, the substrate 100 including the cell block region CB, the peripheral region PER or SL, and the core region COR may be prepared. The cell block region CB may include the center cell block region CBc and the edge cell block region CBe.

The device isolation pattern 120 and the active pattern ACT may be formed in the cell block region CB of the substrate 100. The formation of the device isolation pattern 120 and the active pattern ACT may include forming a groove in the substrate 100 through a patterning process and filling the groove with an insulating material to form the device isolation pattern 120. The active pattern ACT may include a portion of the substrate 100, in which the groove is not formed.

The word lines WL may be formed in trenches, which are formed in an upper portion of the substrate 100. The formation of the word lines WL may include forming mask patterns on the active patterns ACT and the device isolation pattern 120, performing an anisotropic etching process using the mask patterns to form trenches, and filling the trenches with the word lines WL. The word lines WL may be spaced apart from each other in the first direction D1 and may be extending in the second direction D2 within the active patterns ACT. In some embodiments, the filling of the trenches with the word lines WL may include depositing the gate dielectric pattern GI to conformally cover an inner surface of each of the trenches, filling inner spaces of the trenches with a conductive layer, performing an etch-back and/or polishing process on the conductive layer to form the gate electrode GE, and forming the gate capping pattern GC on the gate electrode GE to fill a remaining space of each trench. A pair of the word lines WL may be provided to cross the active pattern ACT, and the active pattern ACT may have the center portion 112 that is defined between the pair of the word lines WL. The active pattern ACT may further include the edge portions 111, which are spaced apart from the center portion 112 with each of the pair of the word lines WL interposed therebetween.

A first buffer layer 210La and a first polysilicon layer 310La may be sequentially formed on the substrate 100. The first buffer layer 210La and the first polysilicon layer 310La may cover a top surface of the active pattern ACT, a top surface of the device isolation pattern 120, and a top surface of the word line WL.

Referring to FIGS. 11 and 12A to 12D, the first recess region RS1 may be formed in an upper portion of the active pattern ACT. In some embodiments, a plurality of first recess regions RS1 may be provided. The first recess regions RS1 may be spaced apart from each other in the first and second directions D1 and D2. The first recess region RS1 may be formed on the center portion 112 of the active pattern ACT. The formation of the first recess region RS1 may include performing an anisotropic etching process. As a result of the anisotropic etching process, a second buffer layer 210Lb and a second polysilicon layer 310Lb may be formed from the first buffer layer 210La and the first polysilicon layer 310La, respectively. In some embodiments, the first recess region RS1 may be formed to expose a portion of the center portion 112, a portion of the device isolation pattern 120, and a portion of the gate capping pattern GC to the outside.

A preliminary bit line contact DCL may be formed to fill the first recess region RS1. In some embodiments, a plurality of preliminary bit line contacts DCL may be provided on the center portions 112 of the active patterns ACT, respectively. The preliminary bit line contact DCL may have a top surface, which is located at substantially the same height as a top surface of the second polysilicon layer 310Lb or is coplanar with the top surface of the second polysilicon layer 310Lb.

A first barrier layer 320L, a bit line layer BLL, a first capping layer 351L, and a second capping layer 352L may be sequentially formed on the preliminary bit line contact DCL and the second polysilicon layer 310Lb. The first barrier layer 320L, the bit line layer BLL, the first capping layer 351L, and the second capping layer 352L may be formed to fully cover the cell block region CB, the peripheral region PER or SL, and the core region COR of the substrate 100. The first barrier layer 320L, the bit line layer BLL, the first capping layer 351L, and the second capping layer 352L may be etched to form an empty space on the peripheral region PER or SL and the core region COR. The interlayer insulating layer IL may be formed to fill the empty space.

Referring to FIGS. 13 and 14A to 14C, the pad trenches PTR and the slit trenches STR may be formed to penetrate the second polysilicon layer 310Lb, the first barrier layer 320L, the bit line layer BLL, the first capping layer 351L, and the second capping layer 352L in the third direction D3. The pad trenches PTR may be extending from portions on the core region COR to portions on the edge cell block region CBe in the first direction D1. The slit trenches STR may be extending from portions on the edge cell block region CBe to portions on the peripheral region PER or SL in the first direction D1. The pad trenches PTR and the slit trenches STR may be formed to expose the second buffer layer 210Lb thereunder. Although not shown, the pad trenches PTR may be further formed on the center cell block region CBc.

The pad trenches PTR may be spaced apart from each other in the second direction D2. The slit trenches STR may be spaced apart from each other in the second direction D2. The slit trenches STR may be spaced apart from the pad trenches PTR in the first direction D1. Each of the pad trenches PTR may be shifted from each of the slit trenches STR in the second direction D2, respectively. As an example, each of the pad trenches PTR may be shifted from each of the slit trenches STR by the first length L1 in the second direction D2, respectively.

Referring to FIGS. 15 and 16A to 16E, a third capping layer 353L may be formed on a top surface of the substrate 100. The third capping layer 353L may fill the pad trenches PTR and the slit trenches STR and may cover the second capping layer 352L and the interlayer insulating layer IL.

Referring to FIGS. 17 and 18A to 18E, first mask patterns MP1 may be formed on the third capping layer 353L. The first mask patterns MP1 may be extending in the first direction D1 and may be spaced apart from each other in the second direction D2. When viewed in a plan view, the first mask patterns MP1 may cross the center portions 112 of the active patterns ACT in the first direction D1. When viewed in a plan view, the first mask patterns MP1 may further cross the pad trenches PTR in the first direction D1. In some embodiments, the first mask patterns MP1 may be formed on the edge cell block region CBe and may be extending to the peripheral region PER or SL and the core region COR.

As an example, the first mask patterns MP1 may be formed using a multi-patterning technology. The multi-patterning technology may include double patterning technologies (DPTs), such as a lithography-etch-lithography-etch (LELE) technology, a self-aligned double patterning (SADP) technology, and a self-aligned reverse patterning (SARP) technology, and quadruple patterning technologies (QPTs), such as a lithography-etch-lithography-etch-lithography-etch (LELELE) technology and a self-aligned quadruple patterning (SAQP) technology.

Second mask patterns MP2 may be formed on the pad trenches PTR and the slit trenches STR. One of the second mask patterns MP2 may be extending from a portion on the core region COR to a portion on the edge cell block region CBe to at least partially cover the pad trenches PTR. Another one of the second mask patterns MP2 may be extending from a portion on the peripheral region PER or SL to a portion on the edge cell block region CBe to at least partially cover the slit trenches STR. The third capping layer 353L on the edge cell block region CBe and between the second mask patterns MP2 may be exposed to the outside.

The second mask patterns MP2 may cover the first mask patterns MP1, on the peripheral region PER or SL and the core region COR. The second mask patterns MP2 may cover at least a portion of the first mask patterns MP1, on the edge cell block region CBe. As an example, the second mask patterns MP2 on the edge cell block region CBe may cover portions of the first mask patterns MP1 but may expose the remaining portions of the first mask patterns MP1.

Referring to FIGS. 19 and 20A to 20E, an etching process may be performed using the first and second mask patterns MP1 and MP2. The second capping layer 352L, the first capping layer 351L, the first barrier layer 320L, the second polysilicon layer 310Lb, and the preliminary bit line contact DCL may be etched by the etching process, and as a result, the second capping pattern 352, the first capping pattern 351, the first barrier pattern 320, the polysilicon pattern 310, and the bit line contact DC may be formed.

During the etching process, the bit line layer BLL may also be etched to form the bit line structure BLS. The bit line structure BLS may include a pair of the bit lines BL, the bit line pad PD, and the bit line connector CN. On the edge cell block region CBe exposed by the second mask patterns MP2, the pair of the bit lines BL may be formed to have substantially the same shape as the first mask patterns MP1. The bit line pad PD and the bit line connector CN may be formed on the edge cell block region CBe covered with the second mask patterns MP2.

During the etching process, the third capping layer 353L may be additionally etched, and in this case, a remaining portion of the third capping layer 353L may be classified into the third capping pattern 353, the pad separation pattern PS, and the slit separation pattern SS. The third capping pattern 353 may be a portion of the third capping layer 353L vertically overlapped with the bit line structure BLS. The pad separation pattern PS may be a portion of the third capping layer 353L formed in and on the pad trench PTR. The slit separation pattern SS may be a portion of the third capping layer 353L formed in or on the slit trench STR. In some embodiments, a portion of the third capping layer 353L, which is left on the interlayer insulating layer IL, may constitute the peripheral capping pattern 350*p*.

The bit line trench BTR may be provided between the bit lines BL. In detail, the first bit line trench BTRa may be formed between the pair of the bit lines BL of the bit line structure BLS. The second bit line trench BTRb may be formed between adjacent ones of the bit line structures BLS.

Referring back to FIGS. 4A, 4B, and 5A to 5E, the spacer structure 360 may be formed to cover the side surface of the bit line BL and the side surface of the bit line capping pattern 350. The formation of the spacer structure 360 may include sequentially forming the first spacer 362, the second spacer 364, and the third spacer 366 to conformally cover the side surfaces of the bit line BL and the bit line capping pattern 350.

The spacer structure 360 may be formed in the bit line trench BTR. In detail, the first spacer structure 360*a* may be formed in the first bit line trench BTRa. The second spacer structure 360*b* may be formed in the second bit line trench BTRb. The first spacer structure 360*a* may be formed to be spaced apart from the slit separation pattern SS. The second spacer structure 360*b* may be formed to be in contact with adjacent ones of the bit line structures BLS, the slit separation pattern SS, and the pad separation pattern PS.

In some embodiments, the formation of the storage node contact BC and the fence pattern FN may include forming a storage node contact line (not shown) to fill a space between adjacent ones of the bit lines BL and to extend in the first direction D1, partially removing the storage node contact line on the word line WL to form a preliminary storage node contact (not shown), forming the fence pattern FN in the partially-removed region, and removing an upper portion of the preliminary storage node contact to form the storage node contact BC. The storage node contact BC may be a lower portion of the preliminary storage node contact, which is not removed during the process.

In some other embodiments, the formation of the storage node contact BC and the fence pattern FN may include forming a fence line (not shown) to fill a space between the adjacent ones of the bit lines BL and to extend in the first direction D1, removing a portion of the fence line on the edge portion 111 of the active pattern ACT to form the fence pattern FN, and forming the storage node contact BC in the removed region.

An upper portion of the spacer structure 360 may be partially removed during the process of forming the storage node contact BC. In this case, the capping spacer 370 may be further formed in an empty region, which is formed by the partial removal of the spacer structure 360. Thereafter, the second barrier pattern 410 may be formed to conformally cover the spacer structure 360, the capping spacer 370, and the storage node contacts BC.

The landing pads LP may be formed on the storage node contacts BC. The formation of the landing pads LP may include sequentially forming a landing pad layer (not shown) and mask patterns (not shown) to cover top surfaces of the storage node contacts BC and dividing the landing pad layer into a plurality of landing pads LP through an anisotropic etching process using the mask patterns as an etch mask. As a result of the etching process, the second barrier pattern 410, the spacer structure 360, and the bit line capping pattern 350 may be partially etched and may be exposed to the outside.

In some embodiments, the etching process on the landing pad layer may be performed to expose the second spacer 364. The second spacer 364 may be further etched through the exposed portion of the second spacer 364, and in this case, a final structure of the second spacer 364 may include a cavity (e.g., an air gap). However, the inventive concept is not limited to this example. The contact plug CP may be formed on the bit line pad PD. The formation of the contact plug CP may include forming a contact hole on the bit line pad PD, forming a contact plug layer to fill the contact hole, and etching the contact plug layer to form the contact plug CP. In some embodiments, the contact plug layer may be formed together with the landing pad layer.

Thereafter, the filler pattern 440 may be formed in the etched region of the landing pad layer and the etched region of the contact plug layer. The filler pattern 440 may be formed to cover exposed portions of the landing pads LP and the contact plugs CP and to enclose each of them. The data storage pattern DSP may be formed on each of the landing pads LP. The contact lines CL may be formed on the contact plugs CP.

Figure 21A:
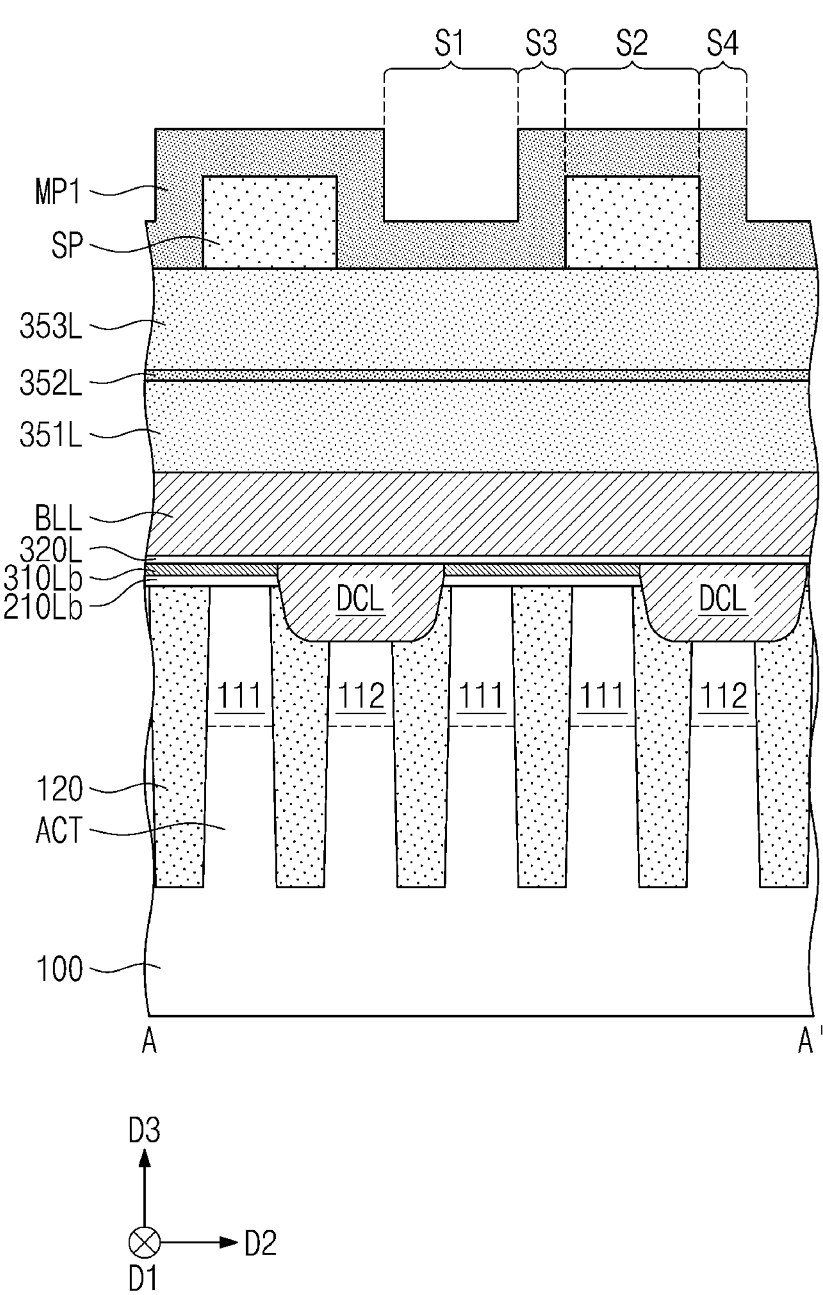
FIGS. 21A, 21B and 21C are sectional views illustrating a method of fabricating a semiconductor device, according to some embodiments of the inventive concept.
Figure 21B:
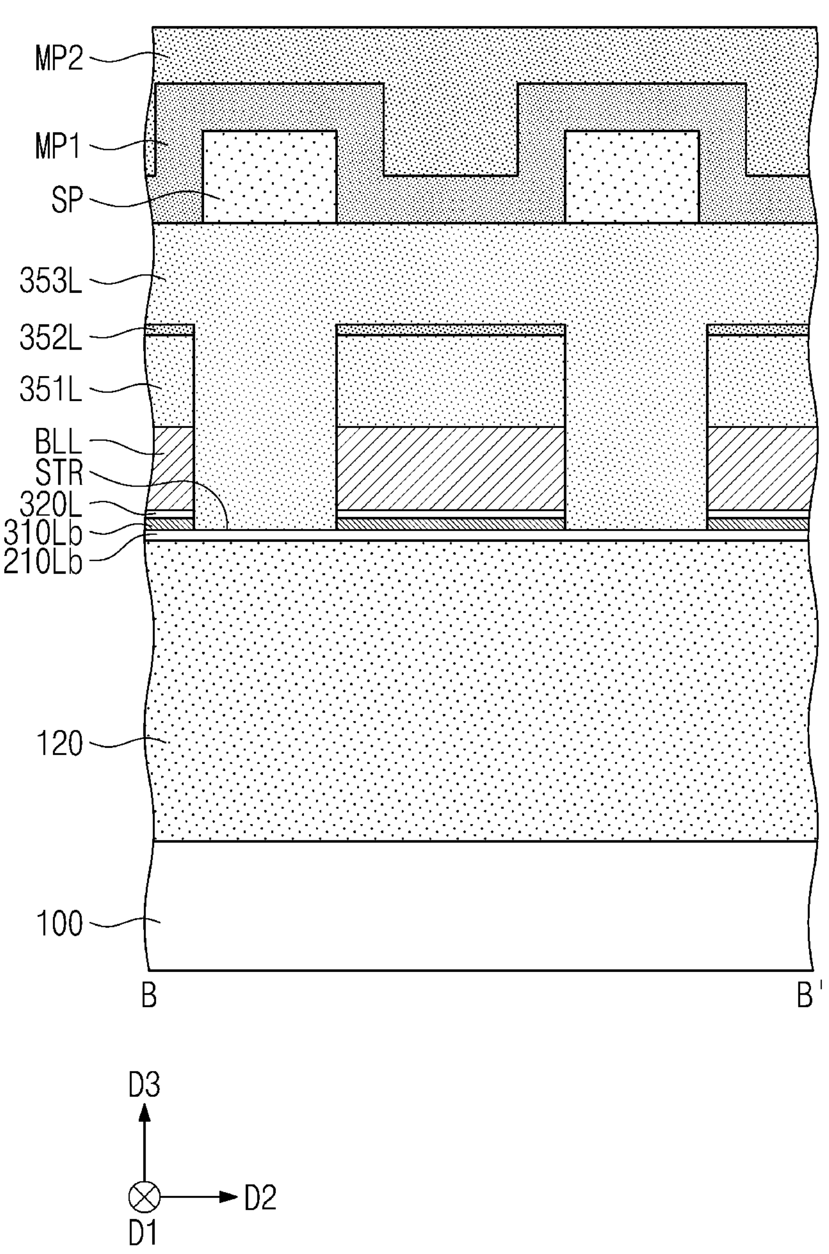
Figure 21C:
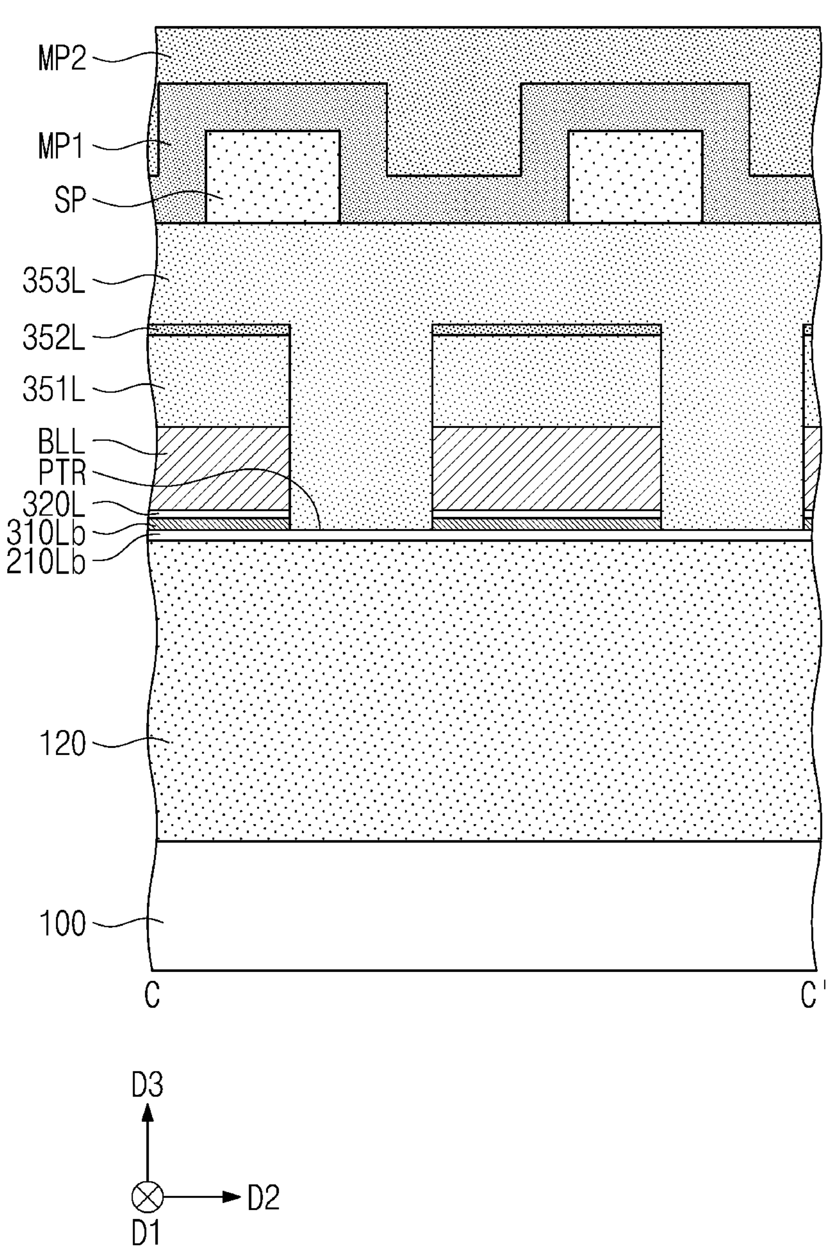

FIGS. 21A to 21C are sectional views illustrating a method of fabricating a semiconductor device according to some embodiments of the inventive concept. Hereinafter, a method of fabricating the semiconductor devices of FIGS. 7A to 7E will be described in more detail with reference to FIGS. 17 and 21A to 21C.

Referring to FIGS. 17 and 21A to 21C, a multi-patterning technology may be used in the process of forming the first mask patterns MP1. In the multi-patterning technology according to some embodiments of the inventive concept, a mask sacrificial pattern SP may be formed, and then, the first mask pattern MP1 may be formed to cover the mask sacrificial pattern SP.

The first mask pattern MP1 may be formed to have a plurality of unit structures, which are repeated in the second direction D2, and each of which is sectioned into four portions that are placed on first to fourth sections S1, S2, S3, and S4, respectively. The first section S1 may be defined in a region where the first bit line trench BTRa will be formed in the final structure of the semiconductor device. The second section S2 may be defined in a region where the second bit line trench BTRb will be formed in the final structure of the semiconductor device. As an example, the mask sacrificial patterns SP may be spaced apart from each other, with the first section S1 interposed therebetween, and may be disposed on the second section S2, as shown in FIG. 21A. As another example, although not shown, the mask sacrificial patterns SP may be spaced apart from each other, with the second section S2 interposed therebetween, and may be disposed on the first section S1. The third and fourth sections S3 and S4 may be defined on opposite side surfaces of the mask sacrificial pattern SP, respectively.

Thereafter, the first mask pattern MP1 may be partially removed. For example, the first mask pattern MP1 on the first section S1 may be removed to expose a top surface of the third capping layer 353L on the first section S1. Similarly, the first mask pattern MP1 on the second section S2 may be removed to expose the mask sacrificial pattern SP on the second section S2. The portions of the first mask pattern MP1 on the third and fourth sections S3 and S4 may be left on the opposite side surfaces of the mask sacrificial pattern SP, after the removing of the first mask pattern MP1 from the first and second sections S1 and S2.

Figure 19:
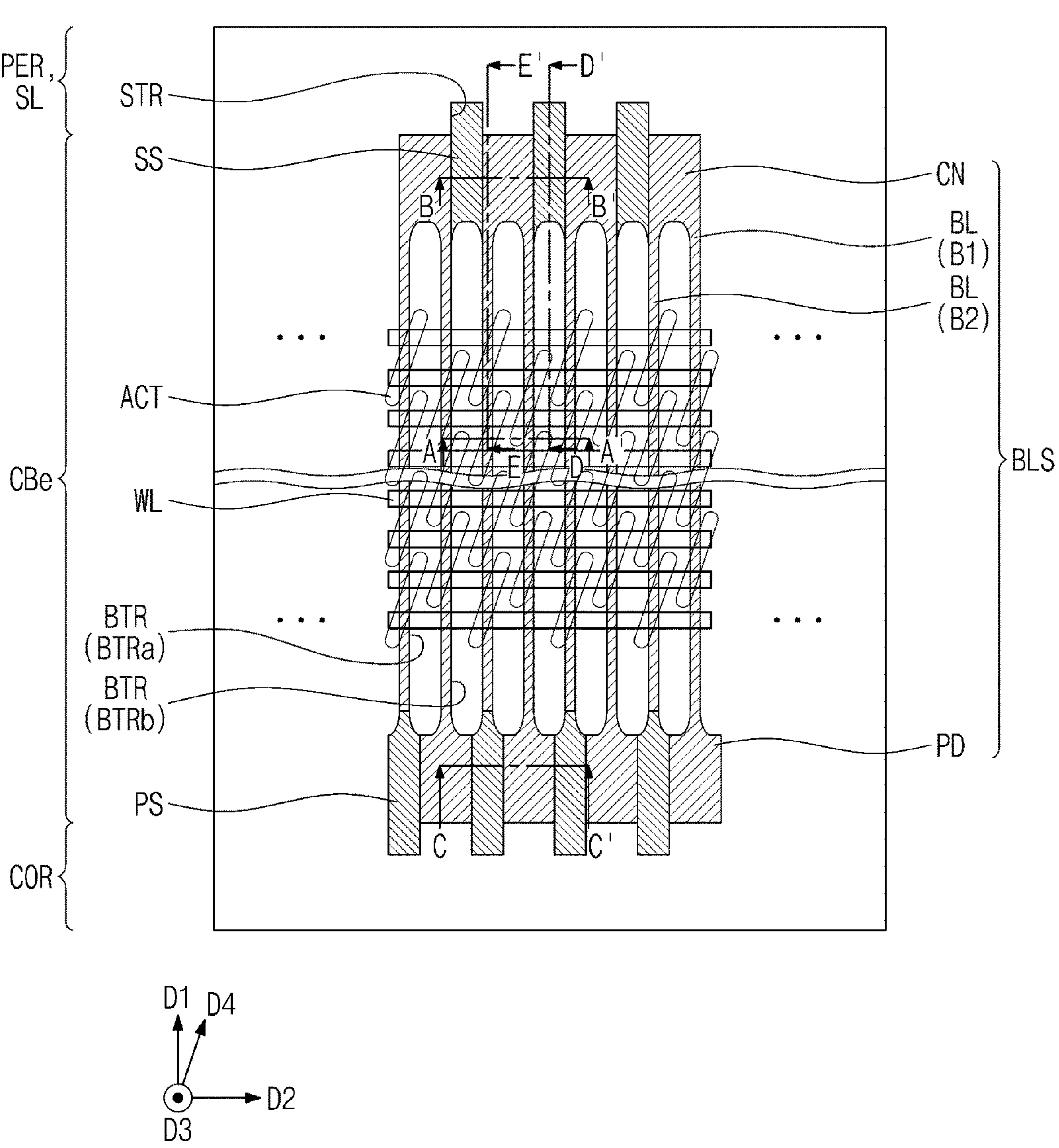
Figure 20A:
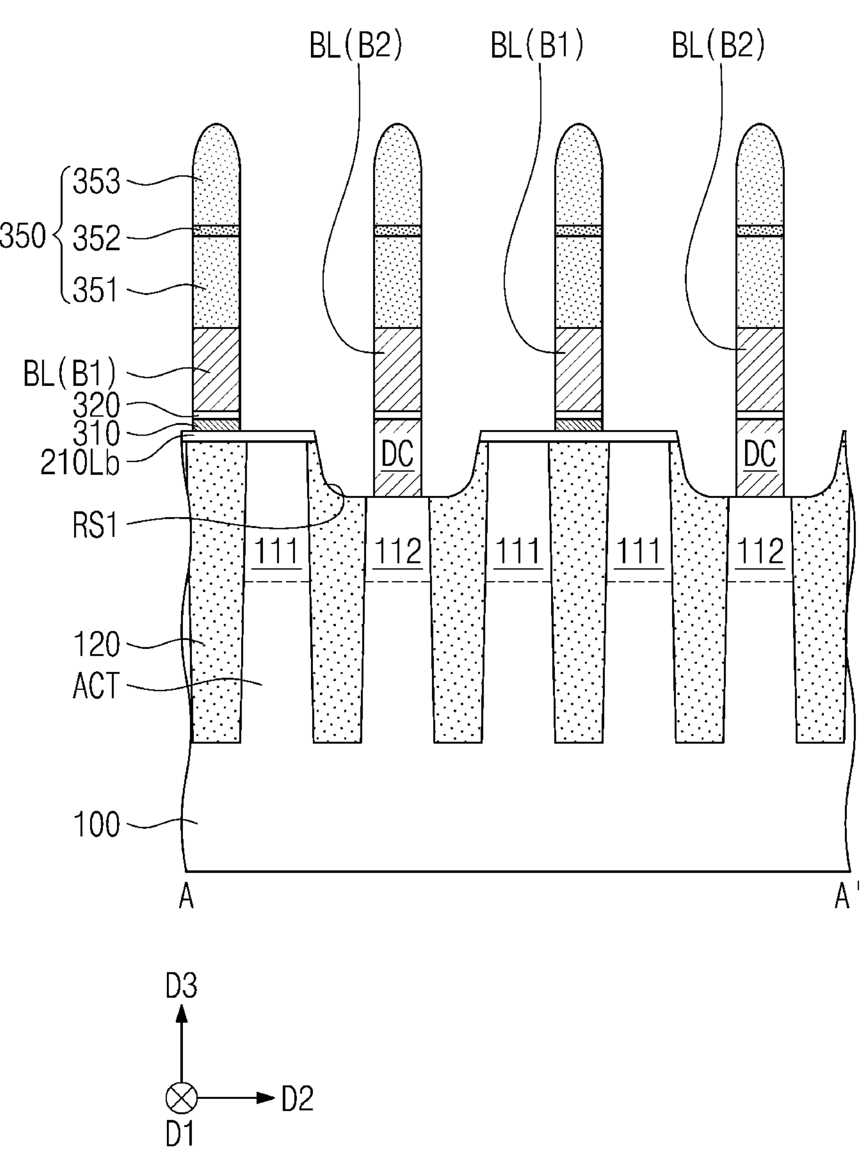
Figure 20B:
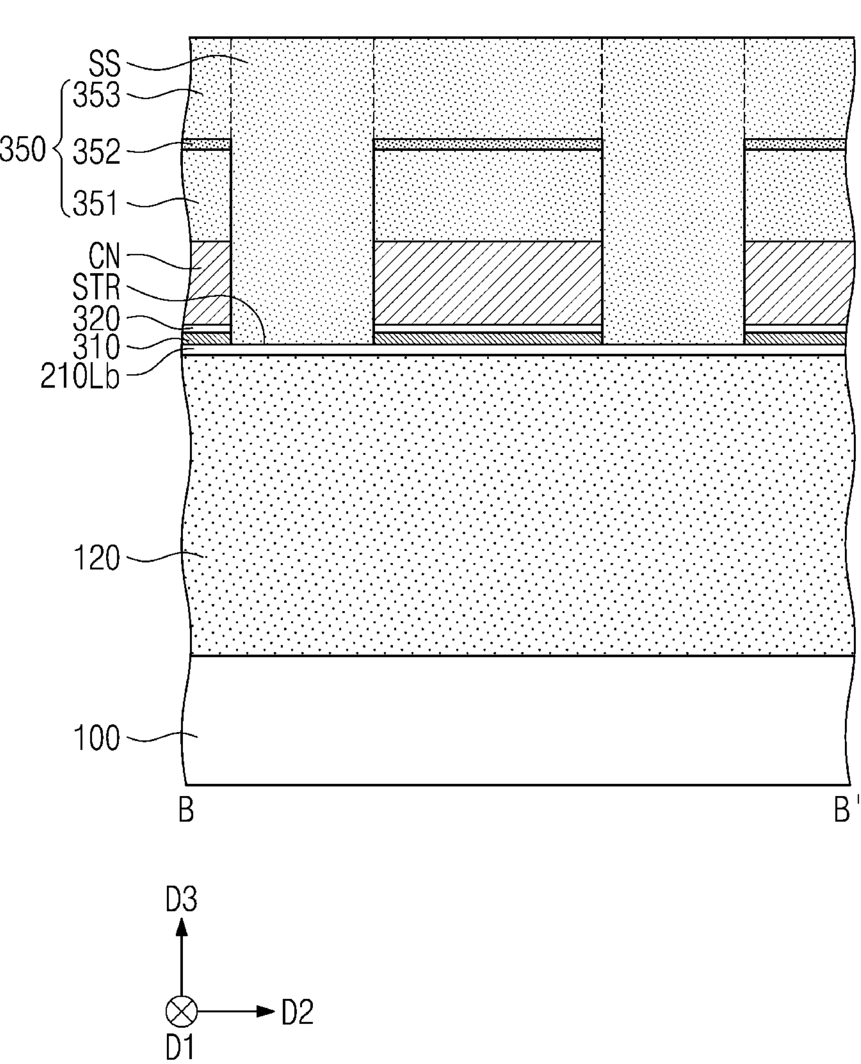
Figure 20C:
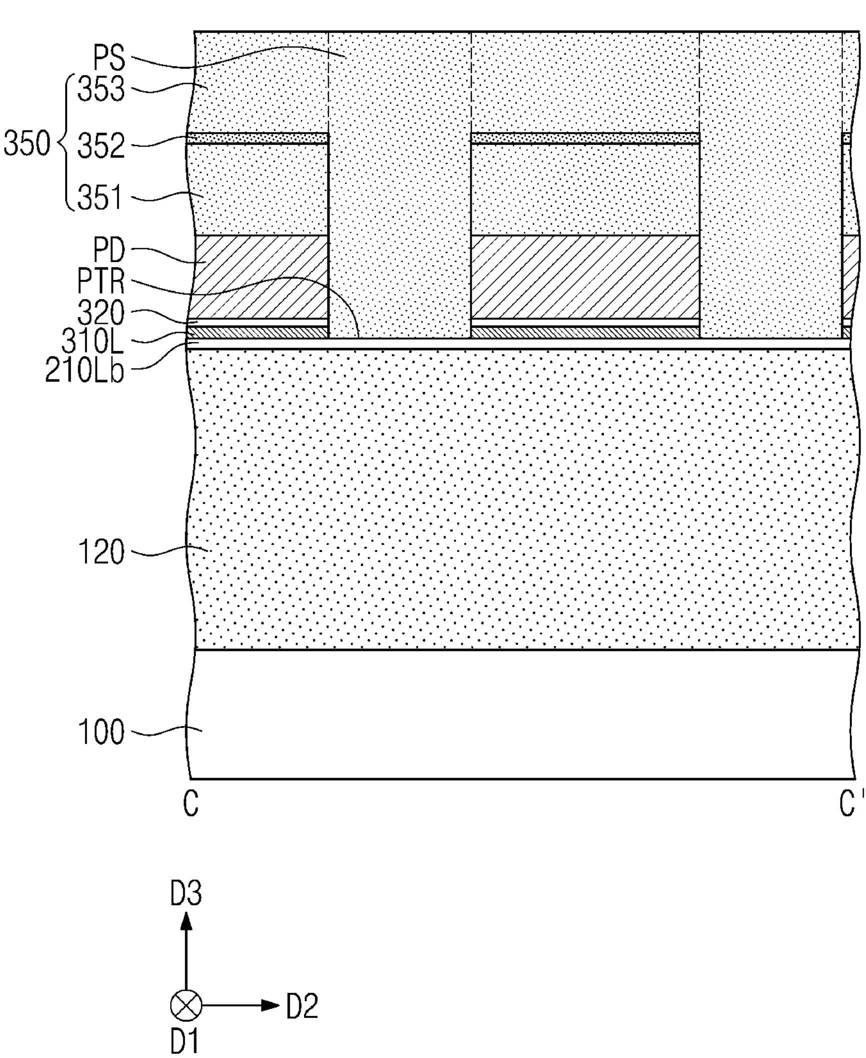
Figure 20E:
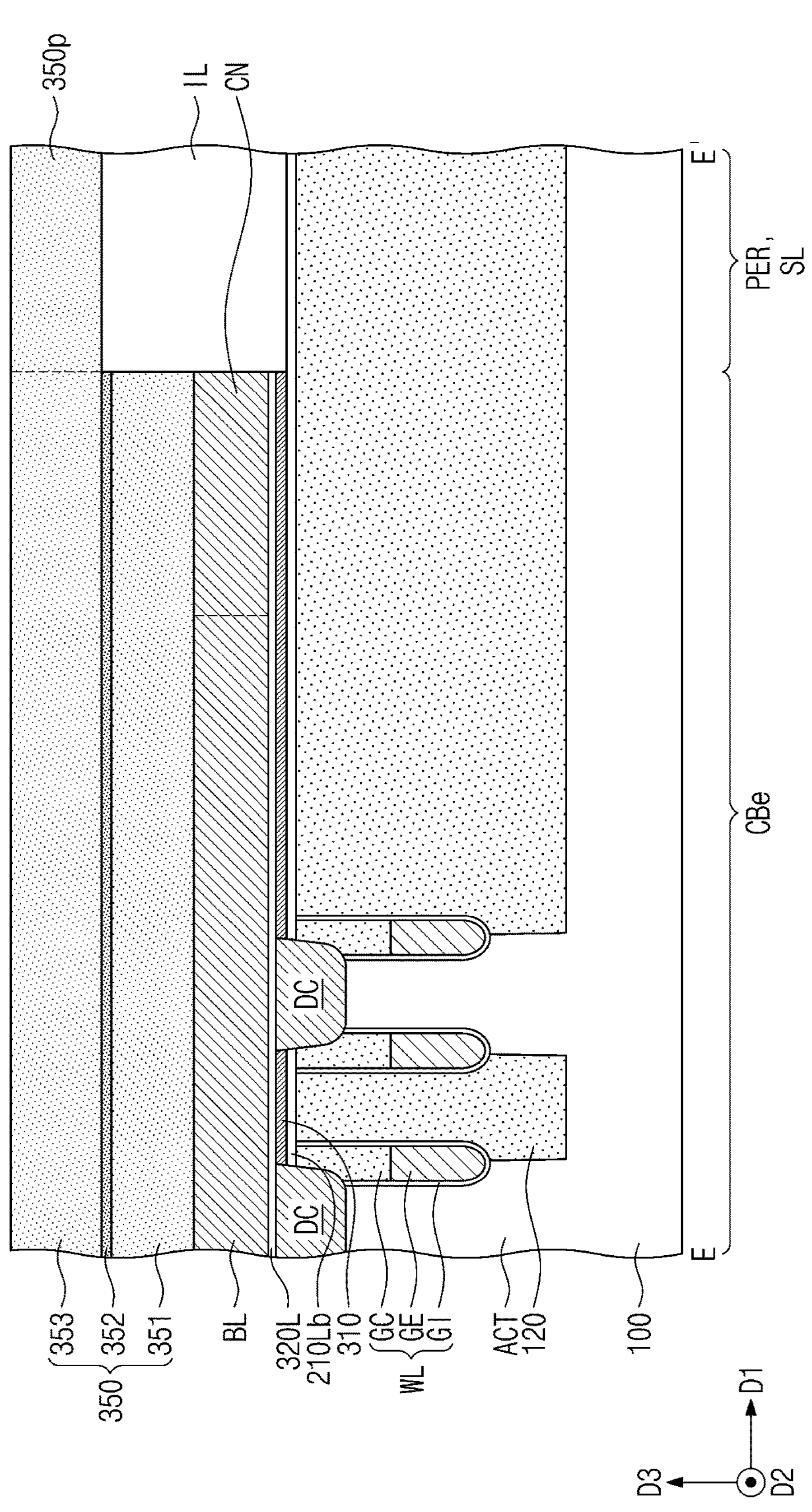

The etching process described with reference to FIG. 19 may be performed using the first mask pattern MP1 on the third and fourth sections S3 and S4 and the second mask patterns MP2 as an etch mask. After the etching process, end portions of the bit line trenches BTR on the first and second sections S1 and S2 may be equal to or different from each other in terms of their widths or lengths.

For example, the bit line trench BTR may be formed to have a variety of widths, as shown in FIGS. 7A to 7C. As an example, the width of the bit line trench BTR may be variously changed depending on a width of the mask sacrificial pattern SP and a thickness of the first mask pattern MP1 (e.g., on the side surface of the mask sacrificial pattern SP). Thus, the seventh width W7 of the first spacer structure 360*a* and the eighth width W8 of the second spacer structure 360*b* may have various values.

For example, the third length L3 may be equal to or different from the fourth length L4, as shown in FIGS. 7A, 7D, and 7E. This is because, during the etching process described with reference to FIG. 19, an etching amount on the first and second sections S1 and S2 may be equal to or different from each other, depending on whether there is the mask sacrificial pattern SP on the first and second sections S1 and S2.

As an example, if the mask sacrificial pattern SP is provided on the second section S2 as shown in FIG. 21A, the etching amount may be increased in the first section S1 where the third capping layer 353L is exposed to the outside. Thus, the first bit line trench BTRa on the first section S1 may be formed to be longer than the second bit line trench BTRb on the second section S2, as shown in FIG. 7D. As a result, the third length L3 may be shorter than the fourth length L4. As another example, if, although not shown, the mask sacrificial pattern SP is formed on the first section S1, the third capping layer 353L on the second section S2 may be exposed to the outside. In this case, as shown in FIG. 7E, the fourth length L4 may be shorter than the third length L3 in a final structure of the semiconductor device. As still other example, if the etching amount in the etching process described with reference to FIG. 19 weakly depends on the presence of the mask sacrificial pattern SP, the third length L3 in the final structure of the semiconductor device may be substantially equal to the fourth length L4, as shown in FIG. 7A.

According to some embodiments of the inventive concept, it may be possible to increase the number of bit lines connected to core circuits and thereby to increase an integration density of a semiconductor device. In addition, it may be possible to reduce a difficulty in a routing process.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the teachings of the disclosure.

As used herein, an element or region that is "covering" or "surrounding" or "filling" another element or region may completely or partially cover or surround or fill the other element or region. Further, as used herein, "an element A connected to an element B" (or similar language) may mean that the element A is electrically connected to the element B and/or the element A contacts the element B.

While example embodiments of the inventive concept have been particularly shown and described, it will be understood by one of ordinary skill in the art that variations in form and detail may be made therein without departing from the scope of the attached claims. Accordingly, the above-disclosed subject matter is to be considered illustrative, and not restrictive, and the appended claims are intended to cover all such modifications, enhancements, and other embodiments, which fall within the scope of the inventive concept.

What is claimed is:

1. A semiconductor device comprising:

a substrate including a core region, a cell block region, and a peripheral region, which are sequentially arranged in a first direction; and a bit line structure on the cell block region, wherein the bit line structure comprises:

a first bit line and a second bit line, which extend in the first direction and are adjacent to each other in a second direction crossing the first direction;

a bit line connector, which electrically connects the first bit line and the second bit line and is adjacent to the peripheral region; and a bit line pad, which is electrically connected to the first bit line and is adjacent to the core region.

2. The semiconductor device of claim 1, further comprising a contact plug electrically connected to the bit line pad, wherein the second bit line is electrically connected to the contact plug through the bit line connector, the first bit line, and the bit line pad.

3. The semiconductor device of claim 2, further comprising a core circuit on the core region, wherein the second bit line is electrically connected to the core circuit through the contact plug.

4. The semiconductor device of claim 1, wherein the bit line pad is offset from the bit line connector in the second direction.

5. The semiconductor device of claim 1, wherein the bit line structure comprises bit line structures, which are spaced apart from each other in the second direction, and the semiconductor device further comprises slit separation patterns, each of which is between a respective pair of bit line connectors of adjacent ones of the bit line structures.

6. The semiconductor device of claim 5, wherein each of the slit separation patterns extends from the cell block region onto the peripheral region in the first direction.

7. The semiconductor device of claim 5, further comprising pad separation patterns, each of which is between a respective pair of bit line pads of the adjacent ones of the bit line structures.

8. The semiconductor device of claim 7, wherein each of the pad separation patterns extends from the core region onto the cell block region in the first direction.

9. The semiconductor device of claim 7, wherein the pad separation patterns are offset from the slit separation patterns in the second direction.

10. The semiconductor device of claim 7, wherein the bit line connectors of the bit line structures have a first pitch in the second direction, the bit line pads of the bit line structures have a second pitch in the second direction, and the first pitch is equal to the second pitch.

11. A semiconductor device comprising:

a substrate including a center cell block region and an edge cell block region, which are sequentially arranged in a first direction;

a first bit line and a second bit line, which extend in the first direction on the edge cell block region and are adjacent to each other in a second direction crossing the first direction; and a bit line connector, which is on the edge cell block region to electrically connect the first bit line and the second bit line, wherein a width of the edge cell block region in the first direction is narrower than a width of the center cell block region in the first direction.

12. The semiconductor device of claim 11, further comprising a bit line pad electrically connected to the first bit line, wherein the second bit line is electrically connected to the bit line pad through the bit line connector and the first bit line.

13. The semiconductor device of claim 12, wherein the bit line pad is offset from the bit line connector in the second direction.

14. The semiconductor device of claim 11, wherein the substrate further comprises:

a core region, which is between the center cell block region and the edge cell block region; and a peripheral region, which is adjacent to the edge cell block region in the first direction.

15. The semiconductor device of claim 14, wherein the center cell block region comprises center cell block regions, which are arranged to form a single column in the first direction, and the core region is between the center cell block regions.

16. The semiconductor device of claim 14, wherein the bit line connector is closer to the peripheral region than to the core region.

17. The semiconductor device of claim 11, further comprising a third bit line and a fourth bit line, which extend in the first direction on the center cell block region and are adjacent to each other in the second direction, wherein the third and fourth bit lines are electrically isolated from each other.

18. The semiconductor device of claim 17, further comprising bit line pads, which are electrically connected to the third and fourth bit lines, respectively.

19. A semiconductor device comprising:

a substrate including a core region, a cell block region, and a peripheral region, which are sequentially arranged in a first direction;

a bit line structure on the cell block region, the bit line structure comprising a first bit line and a second bit line, which extend in the first direction and are adjacent to each other in a second direction crossing the first direction, a bit line connector electrically connecting the first and second bit lines to each other, and a bit line pad electrically connected to the first bit line;

a slit separation pattern adjacent to the bit line connector in the second direction; and a spacer structure extending in the first direction and extending between the first and second bit lines, wherein the spacer structure is spaced apart from the slit separation pattern.

20. The semiconductor device of claim 19, wherein the bit line connector is adjacent to the peripheral region, and the bit line pad is adjacent to the core region.

* * * * *